United States Patent
Yamamoto et al.

(10) Patent No.: US 9,638,840 B2
(45) Date of Patent: May 2, 2017

(54) LIGHT DIFFUSION MEMBER, METHOD FOR PRODUCING SAME, AND DISPLAY DEVICE

(75) Inventors: Emi Yamamoto, Osaka (JP); Tsuyoshi Maeda, Osaka (JP); Toru Kanno, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/116,835

(22) PCT Filed: May 10, 2012

(86) PCT No.: PCT/JP2012/061989
§ 371 (c)(1),
(2), (4) Date: Nov. 11, 2013

(87) PCT Pub. No.: WO2012/157512
PCT Pub. Date: Nov. 22, 2012

(65) Prior Publication Data
US 2014/0111862 A1  Apr. 24, 2014

(30) Foreign Application Priority Data
May 13, 2011 (JP) .................... 2011-108711

(51) Int. Cl.
*G02B 5/02* (2006.01)
*B32B 3/26* (2006.01)
(Continued)

(52) U.S. Cl.
CPC .......... *G02B 5/02* (2013.01); *B29D 11/00798* (2013.01); *B32B 3/266* (2013.01);
(Continued)

(58) Field of Classification Search
CPC ........ G02B 5/003; G02B 5/02; G02B 5/0205; G02B 5/0236; G02B 5/0242;
(Continued)

(56) References Cited

U.S. PATENT DOCUMENTS 5,462,700 A * 10/1995 Beeson et al. ............... 264/1.27
6,002,500 A * 12/1999 Kim ............................. 359/15
(Continued)

FOREIGN PATENT DOCUMENTS

CN  202614963 U  12/2012
JP  56-134031 U  10/1981
(Continued)

OTHER PUBLICATIONS

Official Communication issued in International Patent Application No. PCT/JP2012/061989, mailed on Aug. 14, 2012.
(Continued)

*Primary Examiner* — Derek S Chapel
*Assistant Examiner* — Adam W Booher
(74) *Attorney, Agent, or Firm* — Keating & Bennett, LLP

(57) ABSTRACT

A light diffusion member includes a light transmissive substrate, a plurality of light diffusion sections formed on one surface of the substrate, a light shielding layer formed in a region other than formation regions of the light diffusion sections on the one surface of the substrate, and light scattering bodies. The light diffusion sections have a light emitting end surface on the substrate side and a light incident end surface having an area greater than an area of the light emitting end surface on a side opposite to the substrate side. A height from the light incident end surface to the light emitting end surface of each of the light diffusion sections is greater than a thickness of the light shielding layer. The light scattering bodies are disposed further on a light emitting side than the light diffusion sections.

15 Claims, 34 Drawing Sheets

(51) Int. Cl.

| | | |
|---|---|---|
| *G02B 6/00* | (2006.01) | |
| *G02F 1/1335* | (2006.01) | |
| *F21V 8/00* | (2006.01) | |
| *G03F 7/16* | (2006.01) | |
| *B29D 11/00* | (2006.01) | |
| *B32B 7/12* | (2006.01) | |
| *B32B 27/08* | (2006.01) | |
| *B32B 27/20* | (2006.01) | |
| *B32B 27/28* | (2006.01) | |
| *B32B 27/30* | (2006.01) | |
| *B32B 27/32* | (2006.01) | |
| *B32B 27/36* | (2006.01) | |
| *B32B 27/40* | (2006.01) | |
| *G02F 1/1333* | (2006.01) | |

(52) U.S. Cl.
CPC ............. *B32B 7/12* (2013.01); *B32B 27/08* (2013.01); *B32B 27/20* (2013.01); *B32B 27/281* (2013.01); *B32B 27/286* (2013.01); *B32B 27/30* (2013.01); *B32B 27/308* (2013.01); *B32B 27/32* (2013.01); *B32B 27/325* (2013.01); *B32B 27/365* (2013.01); *B32B 27/40* (2013.01); *G02B 5/0242* (2013.01); *G02B 5/0278* (2013.01); *G02B 6/0051* (2013.01); *G02F 1/133504* (2013.01); *G03F 7/162* (2013.01); *B32B 2264/025* (2013.01); *B32B 2307/202* (2013.01); *B32B 2307/21* (2013.01); *B32B 2307/412* (2013.01); *B32B 2307/712* (2013.01); *B32B 2457/20* (2013.01); *G02F 1/13338* (2013.01); *G02F 1/133502* (2013.01); *G02F 1/133512* (2013.01); *G02F 2201/38* (2013.01)

(58) Field of Classification Search
CPC .. G02B 5/0247; G02B 5/0268; G02B 5/0278; G02B 5/22; G02B 5/223; G02B 6/0051; G02B 1/12; G02F 1/133606; G02F 1/133607; C03C 17/06–17/10; F21V 1/00; F21V 11/00; F21V 11/14; F21S 48/14; F21S 48/145

USPC ....... 359/456, 460, 503, 504, 580, 581, 582, 359/599; 349/62, 64, 112; 362/244, 246, 362/317, 351, 354–356, 558; 427/162, 427/164, 165, 258, 259

See application file for complete search history.

(56) References Cited

U.S. PATENT DOCUMENTS

| | | | |
|---|---|---|---|
| 6,023,316 A * | 2/2000 | Yano .................... | G02B 5/0226 349/112 |
| 6,822,792 B2 * | 11/2004 | Goto ............................. | 359/456 |
| 2002/0080484 A1 * | 6/2002 | Moshrefzadeh et al. ..... | 359/460 |
| 2003/0142247 A1 * | 7/2003 | Nishiyama et al. ............ | 349/67 |
| 2006/0003239 A1 * | 1/2006 | Cooper ................ | G02B 5/0242 430/20 |
| 2006/0056021 A1 * | 3/2006 | Yeo et al. ..................... | 359/460 |
| 2011/0122493 A1 | 5/2011 | Ogawa et al. | |

FOREIGN PATENT DOCUMENTS

| | | |
|---|---|---|
| JP | 08-220519 A | 8/1996 |
| JP | 2003-504691 A | 2/2003 |
| JP | 2004-516525 A | 6/2004 |
| JP | 2004-361685 A | 12/2004 |
| JP | 4129991 B2 | 8/2008 |
| JP | 2010-079292 A | 4/2010 |
| JP | 2010-145469 A | 7/2010 |
| JP | 2011-034031 A | 2/2011 |
| WO | 96/07115 A1 | 3/1996 |
| WO | 01/04701 A1 | 1/2001 |
| WO | 2010/110369 A1 | 9/2010 |

OTHER PUBLICATIONS

Official Communication issued in corresponding Japanese Patent Application No. 2016-003226, mailed on Sep. 13, 2016.

* cited by examiner

40

40G

40H

40I

40J

141H

141I

141J

141K

141L

141M

141N

141P

LIGHT DIFFUSION MEMBER, METHOD FOR PRODUCING SAME, AND DISPLAY DEVICE

TECHNICAL FIELD

The present invention relates to a light diffusion member, a method for producing the same, and a display device.

This application claims priority based on Japanese Patent Application No. 2011-108711 filed on May 13, 2011 in Japan, the disclosure of which is incorporated herein by reference.

BACKGROUND ART

Liquid crystal display devices have been widely used as displays of portable electronic devices such as mobile phones, television sets, personal computers, or the like. However, it has been known that the liquid crystal display devices are generally excellent in viewability from the front, whereas the viewing angle thereof is narrow, so various attempts for widening the viewing angle have been made. As one of these attempts, a configuration is considered in which a member (hereinafter, referred to as a light diffusion member) which diffuses light emitted from a display body such as a liquid crystal panel is provided on a viewing side of the display body.

For example, PTL 1 discloses an optical sheet including a base film layer, an optical functional sheet layer disposed on the base film layer, and a diffusion material containing layer disposed on the optical functional sheet layer. In the optical sheet, the optical functional sheet layer has prism portions of a substantially trapezoidal shape formed in parallel along an upper surface of the base film layer and a light absorbing portion is disposed in a substantially wedge-shaped portion between the prism portions.

CITATION LIST

Patent Literature

PTL 1: Japanese Unexamined Patent Application Publication No. 2010-145469

SUMMARY OF INVENTION

Technical Problem

In manufacturing the optical sheet described in PTL 1, when embedding a binder resin in the wedge-shaped portions, the binder resin is left in the prism portions, that is, on a path through which light passes, and the transmittance of light is reduced in some cases. Further, since grooves are formed in parallel in a one-dimensional direction, light is diffused only in one-axial direction. Furthermore, since a light diffusion layer has a regular configuration, moire caused by interference of light occurs when displaying an image, and thus display quality is lowered.

An aspect of the present invention has been made to solve the above described problems, and an object of the present invention is to provide a light diffusion member and a method for producing the same in which a desired light diffusion property can be achieved without manufacturing processes being complicated. Further, another object of the present invention is to provide a display device which has the light diffusion member described above and is excellent in display quality.

Solution to Problem

In order to achieve the above mentioned object, a light diffusion member according to an aspect of the present invention includes a light transmissive substrate, a plurality of light diffusion sections formed on one surface of the substrate, a light shielding layer formed in a region other than formation regions of the light diffusion sections on the one surface of the substrate, and light scattering bodies, in which each of the light diffusion sections has a light emitting end surface on the substrate side and a light incident end surface having an area greater than an area of the light emitting end surface on a side opposite to the substrate side, a height from the light incident end surface to the light emitting end surface of each of the light diffusion sections is greater than the thickness of the light shielding layer, and the light scattering bodies are disposed further on a light emitting side than the light diffusion sections.

In the light diffusion member according to an aspect of the present invention, the light scattering bodies may be included in at least a portion of the substrate.

In the light diffusion member according to an aspect of the present invention, at least a portion of the substrate may be configured such that light, which is incident from a surface opposite to the light diffusion section in at least the portion of the substrate and of which traveling direction is changed by being reflected or refracted by the light scattering bodies, is scattered forwardly.

The light diffusion member according to an aspect of the present invention may further include an anti-glare processing layer on the surface opposite to the one surface of the substrate, and the anti-glare processing layer may be configured to include the light scattering bodies.

The light diffusion member according to an aspect of the present invention may further include a layer which is formed further on the light emitting side than the substrate, and the light scattering bodies may be included in the layer which is formed further on the light emitting side than the substrate.

In the light diffusion member according to an aspect of the present invention, the layer which is formed further on the light emitting side than the substrate may be configured such that light, which is incident from a surface opposite to the light diffusion sections in the layer which is formed further on the light emitting side than the substrate and of which traveling direction is changed by being reflected or refracted by the light scattering bodies, is scattered forwardly.

The light diffusion member according to an aspect of the present invention may further include an anti-glare processing layer on the surface opposite to the one surface of the substrate, and the anti-glare processing layer may be configured to include the light scattering bodies.

In the light diffusion member according to an aspect of the present invention, the plurality of light diffusion sections may be scatteringly disposed, as viewed from the normal direction of the one surface of the substrate, and the light shielding layer may be formed continuously in a region other than the formation regions of the light diffusion sections.

In the light diffusion member according to an aspect of the present invention, the plurality of light diffusion sections may be disposed randomly as viewed from the normal direction of the one surface of the substrate.

In the light diffusion member according to an aspect of the present invention, the plurality of light diffusion sections may have the same shape to each other, as viewed from the normal direction of the one surface of the substrate.

In the light diffusion member according to an aspect of the present invention, the plurality of light diffusion sections may have at least one of sizes and shapes of a plurality of different types, as viewed from the normal direction of the one surface of the substrate.

In the light diffusion member according to an aspect of the present invention, air may be present in a gap between the plurality of light diffusion sections.

In the light diffusion member according to an aspect of the present invention, among the plurality of light diffusion sections, an inclination angle of a side surface of at least one light diffusion section may be different from an inclination angle of the side surfaces of the other light diffusion sections.

In the light diffusion member according to an aspect of the present invention, among the plurality of light diffusion sections, an inclination angle of a side surface of at least one light diffusion section may be different depending on a location.

In the light diffusion member according to an aspect of the present invention, a planar shape of the light diffusion sections as viewed from the normal direction of the one surface of the substrate may be circular, elliptical, or polygonal.

A light diffusion member according to another aspect of the present invention includes a light transmissive substrate, a plurality of light shielding layers which are scatteringly formed on one surface of the substrate, and a light diffusion section formed in a region other than formation regions of the light shielding layers on the one surface of the substrate, in which the light diffusion section has a light emitting end surface on the substrate side and a light incident end surface having an area greater than an area of the light emitting end surface on a side opposite to the substrate side, a height from the light incident end surface to the light emitting end surface of the light diffusion section is greater than the thickness of the light shielding layers, and light scattering bodies are disposed further on a light emitting side than the light diffusion section.

In the light diffusion member according to another aspect of the present invention, the light scattering bodies may be included in at least a portion of the substrate, or at least one of the layers which are formed further on the light emitting side than the substrate.

In the light diffusion member according to another aspect of the present invention, the plurality of light shielding layers may be scatteringly disposed, as viewed from the normal direction of the one surface of the substrate, and the light diffusion section may be formed continuously in a region other than the formation regions of the light shielding layers.

In the light diffusion member according to another aspect of the present invention, the plurality of light shielding layers may be disposed randomly as viewed from the normal direction of the one surface of the substrate.

In the light diffusion member according to another aspect of the present invention, the plurality of light shielding layers may have the same shape to each other, as viewed from the normal direction of the one surface of the substrate.

In the light diffusion member according to another aspect of the present invention, the plurality of light shielding layer may have at least one of sizes and shapes of a plurality of different types, as viewed from the normal direction of the one surface of the substrate.

In the light diffusion member according to another aspect of the present invention, hollow portions partitioned by the formation region of the light diffusion section may be formed in the formation regions of the light shielding layers, and air may be present in the hollow portions.

In the light diffusion member according to another aspect of the present invention, planar shapes of the light shielding layers as viewed from the normal direction of the one surface of the substrate may be circular, elliptical, or polygonal.

In the light diffusion member according to another aspect of the present invention, at least one of an anti-reflection layer, an antistatic layer, an anti-glare processing layer, and an antifouling processing layer may be provided on the surface opposite to the one surface of the substrate.

A method for producing a light diffusion member according to still another aspect of the invention includes forming a light shielding layer having opening portions on one surface of a light transmissive substrate in at least a portion of which light scattering bodies are formed; forming a transmissive negative type photosensitive resin layer on the one surface of the substrate so as to cover the light shielding layer; exposing the negative type photosensitive resin layer through the opening portions of the light shielding layer, from a surface opposite to the one surface of the substrate on which the light shielding layer and the negative type photosensitive resin layer are formed; and forming on the one surface of the substrate, a plurality of light diffusion sections having a light emitting end surface on the substrate side and a light incident end surface having an area greater than an area of the light emitting end surface on a side opposite to the substrate side, by developing the negative type photosensitive resin layer in which the exposing is finished.

In the method for producing a light diffusing member according to still another aspect of the invention, any one of black resins, black inks, single metal bodies, or multilayer films including single metal bodies and metal oxides may be used as a material of the light shielding layer.

A display device according to still another aspect of the invention includes a display body; and a viewing angle widening member which is provided on a viewing side of the display body and makes an angular distribution of light incident from the display member wider than before being incident, and emits the light, in which the viewing angle widening member is composed of the light diffusion member of the present invention.

In the display device according to still another aspect of the invention, the display body may have a plurality of pixels forming a display image, and among the plurality of light diffusion sections of the light diffusion member, a maximum pitch between adjacent light diffusion sections may be smaller than a pitch between the pixels of the display body.

In the display device according to still another aspect of the invention, the display body may have a plurality of pixels forming a display image, and among the plurality of light shielding layers of the light diffusion member, a maximum pitch between adjacent light shielding layers may be smaller than a pitch between the pixels of the display body.

The display device according to still another aspect of the invention may include an information input device provided on the viewing side of the viewing angle widening member.

In the display device according to still another aspect of the invention, the display body may have a light source and a light modulation element which modulates light from the light source, and the light source may emit light having directivity.

In the display device according to still another aspect of the invention, the display body may be a liquid crystal display element.

Advantageous Effects of Invention

According to the present invention, it is possible to provide a light diffusion member and a method for producing the same in which a desired light diffusion property can be achieved without complicating manufacturing processes. Further, according to the present invention, it is possible to provide a display device which has the light diffusion member described above and is excellent in display quality.

DESCRIPTION OF EMBODIMENTS

First Embodiment

Hereinafter, a first embodiment of the present invention will be described using FIG. 1 to FIG. 5.

In the present embodiment, an example of a liquid crystal display device including a transmissive liquid crystal panel as a display device is described.

Note that in the all following drawings, some components are shown in different scale dimensions for easier viewing of the respective components.

Figure 1A:
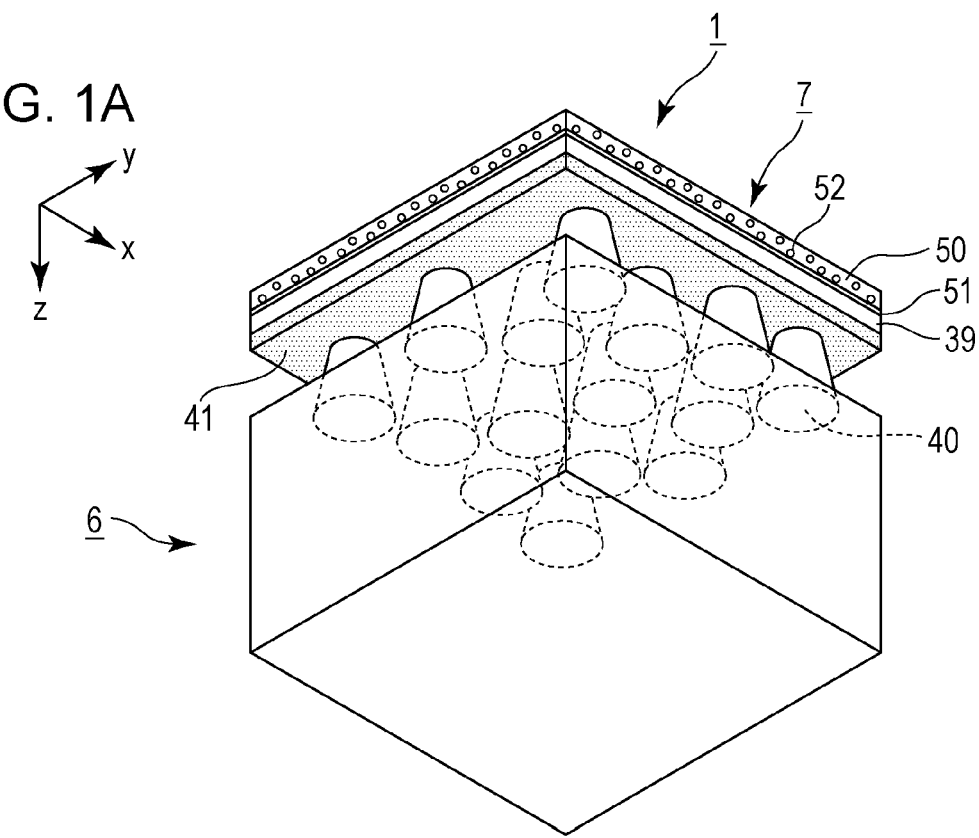
FIG. 1A is a perspective view showing a liquid crystal display device of a first embodiment of the present invention.
Figure 1B:
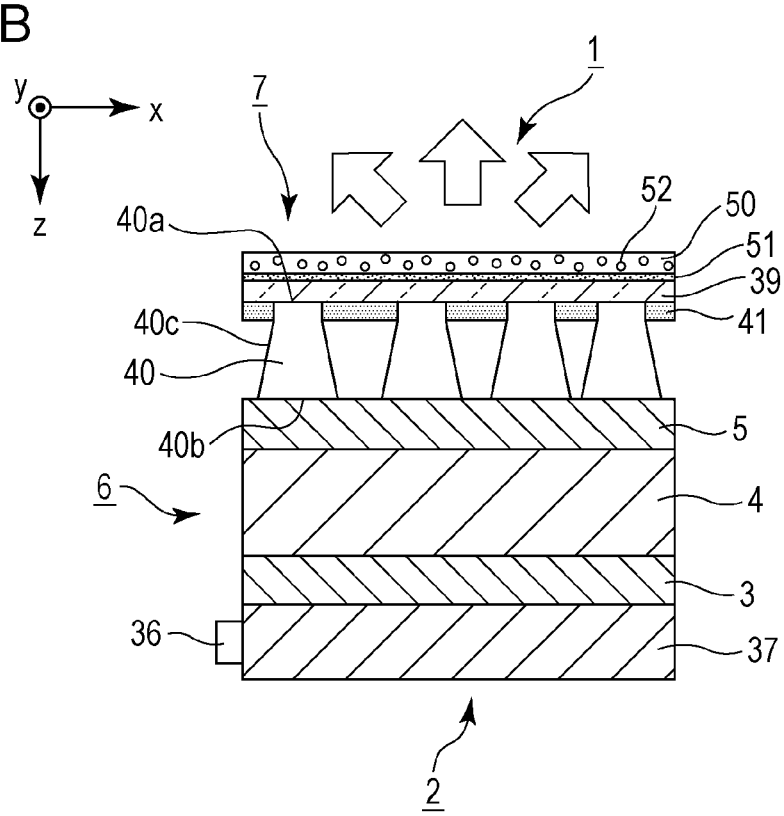
FIG. 1B is a cross-sectional view showing the liquid crystal display device of the first embodiment of the present invention.

FIG. 1A is a perspective view from the obliquely downward direction (back surface side) of a liquid crystal display device 1 of the present embodiment. FIG. 1B is a cross-sectional view of the liquid crystal display device of the present embodiment.

As shown in FIGS. 1A and 1B, the liquid crystal display device 1 (display device) of the present embodiment includes a liquid crystal display body 6 (display body) including a backlight 2 (light source), a first polarizing plate 3, a liquid crystal panel 4 (light modulation element), and a second polarizing plate 5 and a viewing angle widening film 7 (a viewing angle widening member, or a light diffusion member). Although FIG. 1B schematically shows the liquid crystal panel 4 in a single plate shape, the detailed structure thereof will be described later. Observers will view the display from the top of the liquid crystal display device 1 in FIG. 1B in which the viewing angle widening film 7 is disposed. Therefore, in the following description, the side having the viewing angle widening film 7 disposed thereon is referred to as a viewing side, and the side having the backlight 2 disposed thereon is referred to as a back surface side.

In the liquid crystal display device 1 of the present embodiment, the light emitted from the backlight 2 is modulated in the liquid crystal panel 4, and the modulated light is displayed as predetermined images, characters, or the like. Further, if the light emitted from the liquid crystal panel 4 is transmitted through the viewing angle widening film 7, the light is emitted from the viewing angle widening film 7 in a state where the angular distribution of the light becomes wider than before being incident on the viewing angle widening film 7. Thus, the observer can view the display with a wide viewing angle.

Hereinafter, the specific configuration of the liquid crystal panel 4 will be described.

Here, although a transmissive liquid crystal panel of an active matrix type is described as an example, the liquid crystal panel applicable to the present embodiment is not limited to the transmissive liquid crystal panel of the active matrix type. The liquid crystal panel applicable to the present embodiment may be, for example, a transflective (transmission and reflection combined type) liquid crystal panel, or a reflective liquid crystal panel and further may be a liquid crystal panel of a simple matrix type in which each pixel does not have a Thin Film Transistor (hereinafter, abbreviated as TFT) for switching.

Figure 2:
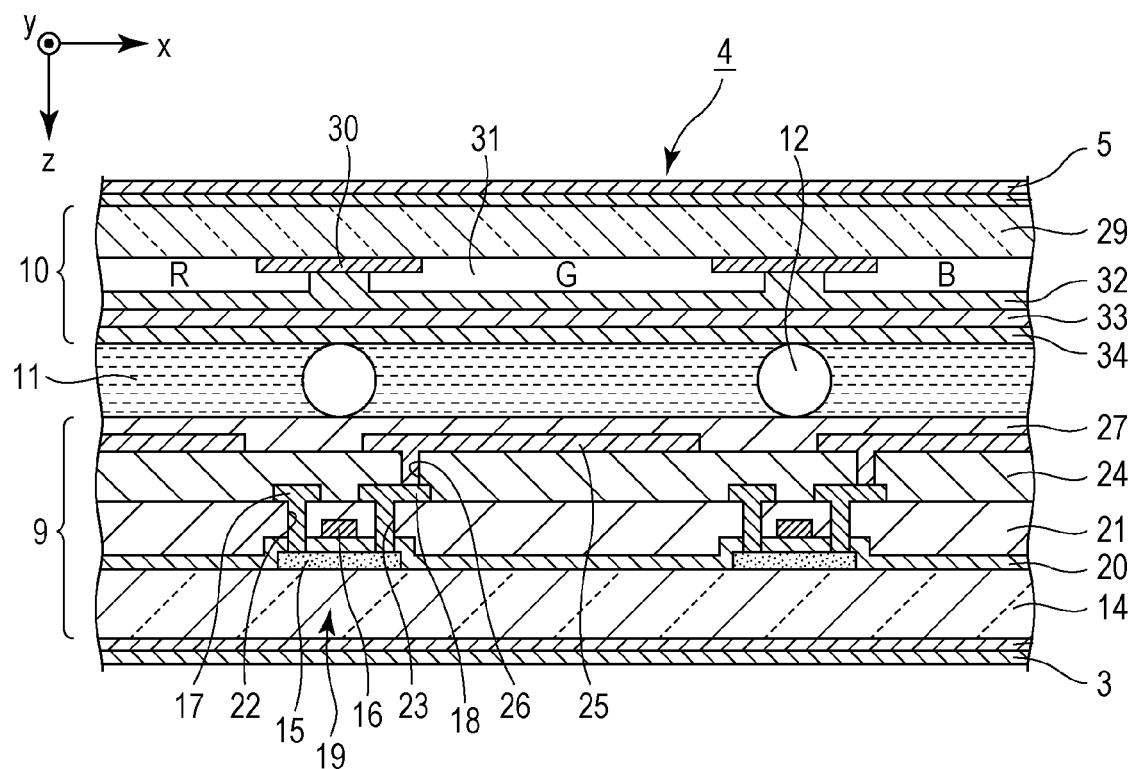
FIG. 2 is a cross-sectional view showing a liquid crystal panel in the liquid crystal display device of the first embodiment of the present invention.

FIG. 2 is a longitudinal cross-sectional view of the liquid crystal panel 4.

As shown in FIG. 2, the liquid crystal panel 4 includes a TFT substrate 9, a color filter substrate 10, and a liquid crystal layer 11. The TFT substrate 9 is provided in the liquid crystal panel 4 as a switching element substrate. The color filter substrate 10 is disposed to oppose the TFT substrate 9. The liquid crystal layer 11 is interposed between the TFT substrate 9 and the color filter substrate 10. The liquid crystal layer 11 is enclosed in a space surrounded by the TFT substrate 9, the color filter substrate 10, and a frame-like seal member (not shown) bonding the TFT substrate 9 and color filter substrate 10 at a predetermined interval therebetween.

The liquid crystal panel 4 of the present embodiment is intended for displaying, for example, in a Vertical Alignment (VA) mode, and vertically aligned liquid crystals having a negative dielectric anisotropy are used in the liquid crystal layer 11.

Between the TFT substrate 9 and the color filter substrate 10, spherical spacers 12 for maintaining a constant distance between the substrates are disposed. Further, the display mode is not limited to the above VA mode, but a Twisted Nematic (TN) mode, a Super Twisted Nematic (STN) mode, an In-Plane Switching (IPS) mode, or the like may be used.

On the TFT substrate 9, a plurality of pixels (not shown) each of which is a minimum unit region of display are disposed in a matrix shape. On the TFT substrate 9, a plurality of source bus lines (not shown) are formed so as to extend parallel to each other and a plurality of gate bus lines (not shown) are formed to extend parallel to each other and to be perpendicular to the plurality of source bus lines. Therefore, the plurality of source bus lines and the plurality of gate bus lines are formed in a lattice shape on the TFT substrate 9, and a rectangular region partitioned by the adjacent source bus lines and the adjacent gate bus lines forms a single pixel. The source bus lines are connected to the source electrodes of TFTs described later, and the gate bus lines are connected to the gate electrodes of the TFTs.

TFTs 19 each of which includes a semiconductor layer 15, a gate electrode 16, a source electrode 17, a drain electrode 18, and the like are formed on the surface on the liquid crystal layer 11 side of the transparent substrate 14 constituting the TFT substrate 9.

For example, a glass substrate may be used as the transparent substrate 14. A semiconductor layer 15 made of semiconductor materials such as, for example, a Continuous Grain Silicon (CGS), a Low-temperature Poly-Silicon (LPS), and an Amorphous Silicon (α-Si) is formed on the transparent substrate 14.

Further, a gate insulating film 20 is formed on the transparent substrate 14 so as to cover the semiconductor layer 15. As the material of the gate insulating film 20, for example, a silicon oxide film, a silicon nitride film, a laminated film thereof, or the like may be used. The gate electrodes 16 are formed on the gate insulating film 20 so as to oppose the semiconductor layer 15. As the material of the gate electrodes 16, for example, a laminated film of tungsten (W)/nitride tantalum (TaN), molybdenum (Mo), titanium (Ti), aluminum (Al) or the like is used.

A first interlayer insulating film 21 is formed on the gate insulating film 20 so as to cover the gate electrode 16. As the material of the first interlayer insulating film 21, for example, a silicon oxide film, a silicon nitride film, a laminated film thereof, or the like may be used.

The source electrodes 17 and the drain electrodes 18 are formed on the first interlayer insulating film 21. Each of the source electrodes 17 is connected to the source region of the semiconductor layer 15 through a contact hole 22 that penetrates the first interlayer insulating film 21 and the gate insulating film 20. Similarly, each of the drain electrodes 18 is connected to the drain region of the semiconductor layer 15 through a contact hole 23 that penetrates the first interlayer insulating film 21 and the gate insulating film 20. As the materials of the source electrode 17 and the drain electrode 18, conductive materials similar to that of the gate electrode 16 described above may be used. A second interlayer insulating film 24 is formed on the first interlayer insulating film 21 so as to cover the source electrode 17 and the drain electrode 18. As the material of the second interlayer insulating film 24, materials similar to that of the first interlayer insulating film 21 described above or an organic insulating material may be used.

Pixel electrodes 25 are formed on the second interlayer insulating film 24. Each of the pixel electrodes 25 is connected to the drain electrode 18 through a contact hole 26 that penetrates the second interlayer insulating film 24. Accordingly, each of the pixel electrodes 25 is connected to the drain region of the semiconductor layer 15 by using the drain electrode 18 as a relay electrode. As the material of the pixel electrode 25, transparent conductive materials such as Indium Tin Oxide (ITO), Indium Zinc Oxide (IZO), and the like may be used. By this configuration, scanning signals are supplied through the gate bus lines, and when the TFT 19 is turned on, image signals which are supplied to the source electrode 17 through the source bus lines are supplied to the pixel electrodes 25 through the semiconductor layer 15 and the drain electrodes 18. Further, an alignment film 27 is formed on the entire surface of the second interlayer insulating film 24 so as to cover the pixel electrodes 25. The alignment film 27 has an anchoring force which vertically aligns liquid crystal molecules constituting the liquid crystal layer 11. Further, the form of the TFT may be a bottom gate type TFT shown in FIG. 2 or may be a top gate type TFT.

On the other hand, a black matrix 30, a color filter 31, a planarization layer 32, an opposing electrode 33, and an alignment film 34 are sequentially formed on the surface of the liquid crystal layer 11 side of the transparent substrate 29 constituting the color filter substrate 10. The black matrix 30 has a function to shield the transmission of light in a region between pixels. For example, the black matrix 30 is made of a metal such as chromium (Cr) or a multilayer film of Cr/Cr oxide, or a photo resist in which carbon particles are dispersed in a photosensitive resin.

The dyes of the respective colors of Red (R), Green (G), and Blue (B) are included in the color filter 31. A color filter 31 of any one of R, G, and B is disposed so as to oppose one of the pixel electrodes 25 on the TFT substrate 9. Further, the color filter 31 may have a multicolor configuration of three colors R, G, and B or more.

The planarization layer 32 is made of an insulating film to cover the black matrix 30 and the color filter 31. The planarization layer 32 has a function to flatten to alleviate steps that are formed by the black matrix 30 and the color filter 31. An opposing electrode 33 is formed on the planarization layer 32. As the material of the opposing electrode 33, a transparent conductive material similar to the pixel electrode 25 is used. In addition, the alignment film 34 having a vertical anchoring force is formed on the entire surface of the opposing electrode 33.

Returning to FIG. 1B, the backlight 2 includes a light source 36 such as a light emitting diode or a cold-cathode tube, and a light guide plate 37 emitting the light toward the liquid crystal panel 4 by using internal reflection of the light emitted from the light source 36. The backlight 2 may be an edge light type in which a light source is disposed on the edge surface of a light guiding body and a direct type in which a light source is disposed immediately below the light guide body. As the backlight 2 used in the present embodiment, it is desirable to use a backlight having directivity by controlling the emission direction of light, so-called a directional backlight. It is possible to reduce blurs and to improve the use efficiency of light by using the directional backlight which causes the collimated or substantially collimated light to enter the light diffusion section of the viewing angle widening film 7 described later. The directional backlight described above can be realized by optimizing the shape and arrangement of the reflection pattern formed in the light guide plate 37. Alternatively, the directivity may be realized by disposing a louver on the backlight. In addition, the first polarizing plate 3 functioning as a polarizer is provided between the backlight 2 and the liquid crystal panel 4. In addition, the second polarizing plate 5 functioning as a polarizer is provided between the liquid crystal panel 4 and the viewing angle widening film 7.

Hereinafter, the viewing angle widening film 7 will be described in detail.

Figure 3A:
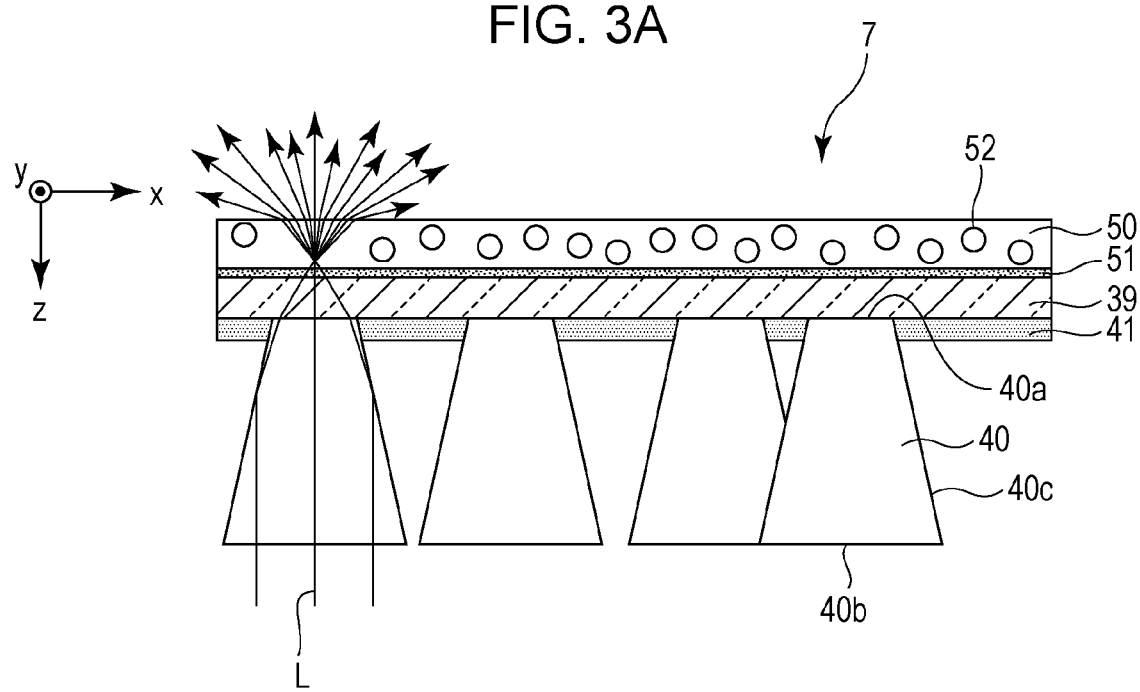
FIG. 3A is a schematic diagram for explaining the operation of a viewing angle widening film of the first embodiment of the present invention.

FIG. 3A is a cross-sectional view of the viewing angle widening film 7.

As shown in FIGS. 1A, 1B and 3A, the viewing angle widening film 7 includes a substrate 39, a plurality of light diffusion sections 40 formed on one surface (the surface on the side opposite to the viewing side) of the substrate 39, a light shielding layer 41 formed on the one surface of the substrate 39, and a diffusion film 50 fixed by an adhesive layer 51 on the other surface (the surface on the viewing side) of the substrate 39. As shown in FIG. 1B, the viewing angle widening film 7 is disposed on the second polarizing plate 5 in an attitude in which the side having the light diffusion sections 40 provided therein faces the second polarizing plate 5 and the substrate 39 side faces the viewing side.

Typically, resins such as thermoplastic polymers or thermosetting resins, and photopolymerizable resins are used as the substrate 39. It is possible to use a substrate made of suitable transparent resins consisting of acrylic-based polymers, olefin-based polymers, vinyl-based polymers, cellulose-based polymers, amide-based polymers, fluorine-based polymers, urethane-based polymers, silicone-based polymers, imide-based polymers, or the like. For example, substrates made of transparent resins of, for example, tri-acetyl cellulose (TAC) films, polyethylene terephthalate (PET) films, cyclo olefin polymer (COP) films, polycarbonate (PC) films, polyethylene naphthalate (PEN) films, polyether sulfone (PES) films, polyimide (PI) films or the like are preferably used. In the manufacturing process described below, the substrate 39 is intended as a base to which the material of the light shielding layer 41 and the light diffusion section 40 are applied later, and it is necessary to provide a heat resistance and a mechanical strength in the heat treatment process of the manufacturing process. Therefore, substrates made of glasses or the like in addition to the substrates made of resins may be used as the substrate 39. However, it is preferable that the thickness of the substrate 39 be thin to the extent that does not impair the mechanical strength and the heat resistance. The reason is because the thicker the thickness of the substrate 39, the more the possibility that blur may occur in the display. Further, the total light transmittance of the substrate 39 is preferably 90% or more on the provision of JIS K7361-1. If the total light transmittance is 90% or more, the sufficient transparency is achieved. In the present embodiment, for example, a PET film of a thickness of 100 μm is used.

The light diffusion section 40 is made of organic materials having optical transparency and photosensitivity such as acrylic resins, epoxy resins or silicone resins. It is possible to use a mixture made of transparent resins obtained by mixing polymerization initiators, coupling agents, monomers, and organic solvents to the resins. Further, the polymerization initiators may include various additional constituent materials such as stabilizers, inhibitors, plasticizers, optical brighteners, mold release agents, chain transfer agents, and other photopolymerizable monomers. Other materials described in Japanese Patent No. 4129991 may be used. Further, the total light transmittance of the light diffusion section 40 is preferably 90% or more on the provision of JIS K7361-1. If the total light transmittance is 90% or more, the sufficient transparency is achieved.

As shown in FIG. 1A, a horizontal cross-section obtained when the light diffusion section 40 is cut along a plane (xy plane) parallel to the one surface of the substrate 39 is circular. The diameter of the light diffusion section 40 is, for example, approximately 20 μm. All of the plurality of light diffusion sections 40 have the same diameter. In the light diffusion section 40, the area of the horizontal cross-section on the substrate 39 side as the light emitting end surface 40a is small, and as being away from the substrate 39, the area of a horizontal cross-section becomes gradually large. In other words, the light diffusion section 40 has the shape of a truncated cone shape, so-called inverse tapered shape, when viewed from the substrate 39 side.

The light diffusion section 40 is a portion contributing to the transmission of light in the viewing angle widening film 7. In other words, while the light incident on the light diffusion section 40 from the light incident end surface 40b is totally reflected on the side surface 40c of a tapered shape of the light diffusion section 40, the light is guided in a state of being confined substantially in the inside of the light diffusion section 40, and emitted.

As shown in FIG. 1A, a plurality of light diffusion sections 40 are scattered and formed on the substrate 39. The plurality of light diffusion sections 40 are scattered and disposed on the substrate 39, thereby allowing the light shielding layer 41 to be continuously formed on the substrate 39.

Further, the plurality of light diffusion sections 40 are randomly (non-periodically) disposed as viewed from the normal direction of the main surface of the substrate 39. Therefore, although the pitch of the adjacent light diffusion sections 40 is not constant, an average pitch obtained by averaging the pitch of the adjacent light diffusion sections 40 is set to, for example, 25 μm.

As shown in FIGS. 1A, 1B and 3A, the light shielding layer 41 is formed in a region other than the formation region of a plurality of light diffusion sections 40, among the surfaces on the side where the light diffusion sections 40 of the substrate 39 are formed. The light shielding layer 41 is made of, as an example, organic materials having light absorbing property and photo sensitivity such as black resists. As the light shielding layer 41, other than the above materials, materials having photosensitivity may be used which include single metal bodies of chromium (Cr) and Cr/Cr oxide, metal oxides, or metallic films such as multi-layer films of the single metal bodies and the metal oxides, pigments and dyes used in black inks, black resins, black inks obtained by mixing multicolor inks, and the like.

The layer thickness of the light shielding layer 41 is set to be smaller than the height from the light incident end surface 40b to the light emitting end surface 40a of the light diffusion section 40. In a case of the present embodiment, the layer thickness of the light shielding layer 41 is about 150 nm, for example, and the height from the light incident end surface 40b to the light emitting end surface 40a of the light diffusion section 40 is about 75 μm, for example. Therefore, for the gaps among a plurality of light diffusion sections 40, the light shielding layer 41 is present in portions in contact with the one surface of the substrate 39 and air is present in the other portions.

Further, it is desirable that the refractive index of the substrate 39 be substantially equal to the refractive index of the light diffusion section 40. For example, this is because there is a possibility that if the refractive index of the substrate 39 is significantly different from the refractive index of the light diffusion section 40, when the light incident from the light incident end surface 40b is about to emit from the light diffusion section 40, phenomena occur in which the refraction and reflection of unwanted light is generated at the interface between the light diffusion section 40 and the substrate 39, so the desired light diffusion angle is not obtained and the amount of the emitted light is reduced.

As shown in FIG. 1B, since the viewing angle widening film 7 is disposed such that the substrate 39 faces the viewing side, among two opposing surfaces of the light diffusion section 40 of a truncated cone shape, a small-area surface is a light emitting end surface 40a, and a large-area surface is a light incident end surface 40b. Further, the inclination angle (the angle between the light emitting end surface 40a and the side surface 40c) of the side surface 40c of the light diffusion section 40 is about 80 degree as an example. However, if the inclination angle of the side surface 40c of the light diffusion section 40 is an angle with which an incident light can be sufficiently diffused when the light emitted from the viewing angle widening film 7, the inclination angle is not particularly limited.

In a case of the present embodiment, since air is interposed between adjacent light diffusion sections 40, if the light diffusion section 40 is formed of, for example, acrylic resin, the side surface 40c of the light diffusion section 40 becomes an interface between the acrylic resin and air. Even if the periphery of the light diffusion section 40 is filled with a low refractive index material, the refractive index difference between the inside and the outside of the light diffusion section 40 at the interface is maximized when air is present as compared to a case when any low refractive index material exists outside. Therefore, by the law of Snell, in the configuration of the present embodiment, the critical angle is the smallest and the incident angle range in which light is totally reflected on the side surface 40c of the light diffusion section 40 is widest. As a result, loss of light is further suppressed, and it is possible to obtain a high brightness.

However, the light incident at an angle, which deviates significantly from 90 degree with respect to the light incident end surface 40b of the light diffusion section 40, is incident at an angle below the critical angle with respect to the side surface 40c of the light diffusion section 40 and transmitted through the side surface 40c of the light diffusion section 40 without being totally reflected. Nevertheless, since the light shielding layer 41 is formed in regions other than the formation regions of the light diffusion sections 40, the light transmitted through the side surface 40c of the light diffusion section 40 is absorbed by the light shielding layer 41. Therefore, the blur of the display does not occur and the contrast is not lowered. However, if the light transmitted through the side surface 40c of the light diffusion section 40 is increased, the loss of the light amount occurs and the image with high brightness may not be obtained. Therefore, in the liquid crystal display device 1 of the present embodiment, it is preferable to use a backlight which emits light, so-called backlight having directivity, at an angle at which light is not incident on the side surface 40c of the light diffusion section 40 at the critical angle or less.

Figure 30A:
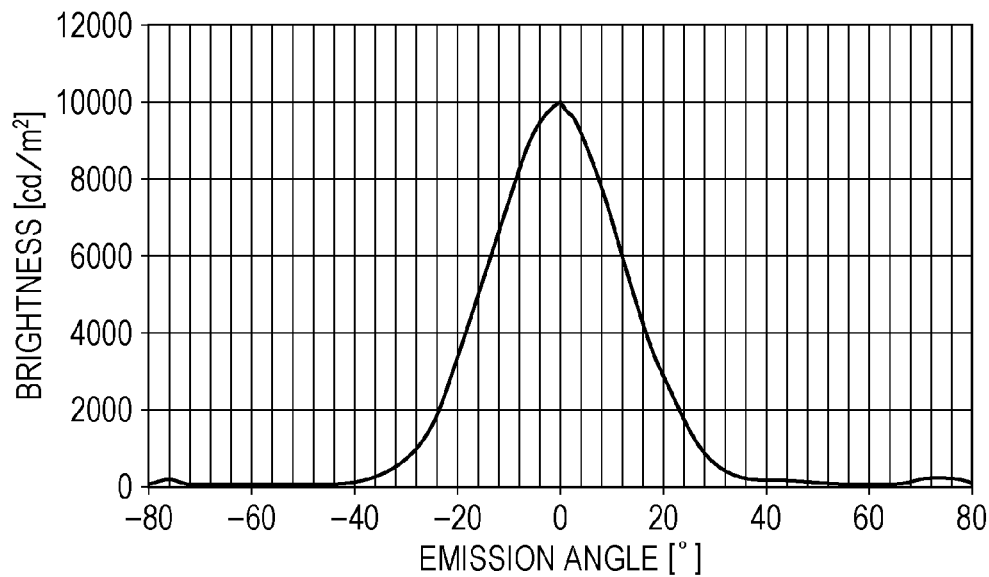
FIG. 30A is a diagram showing a brightness angular characteristic of a directional backlight.

FIG. 30A is a view showing brightness angle characteristics of the directional backlight. In FIG. 30A, a horizontal axis represents the emission angle (degree) and a vertical axis represents the brightness (cd/m$^2$) with regard to the light emitted from the directional backlight. It is understood that in the directional backlight used herein, almost all emitted light is within the emission angle ±30 degree. The combination of the directional backlight and the viewing angle widening film realizes a configuration in which the blur is reduced and light use efficiency is high.

Figure 30B:
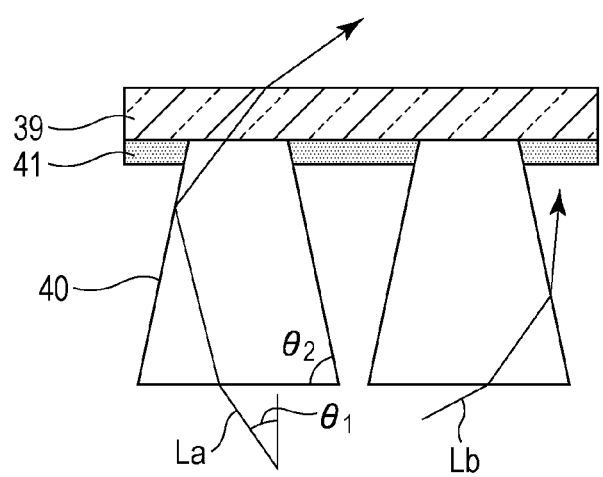
FIG. 30B is a schematic diagram showing a state where light from the backlight passes through a viewing angle widening film.

FIG. 30B is a schematic diagram showing a state where light from the backlight passes through the viewing angle widening film. As shown in FIG. 30B, $\theta_1$ is defined as an emission angle from the backlight, $\theta_2$ is defined as a taper angle of the light transmission section 40. The light La incident on the light transmission section 40 is caused to be totally reflected at the tapered portion and emitted from the surface of the substrate 39 to the viewing side, but there is a case where the light Lb having a large incidence angle is transmitted without being totally reflected at the tapered portion and loss of incident light occurs.

Figure 30C:
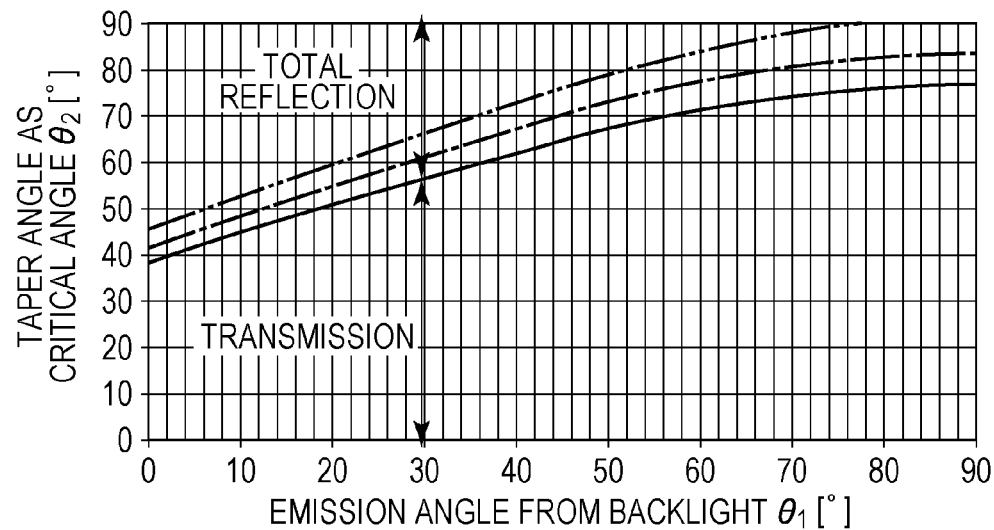
FIG. 30C shows a relationship between an emission angle from the backlight and a taper angle as a critical angle.

FIG. 30C shows a relationship between an emission angle from the backlight and a taper angle as a critical angle.

For example, in a case where the light transmission section 40 of the transparent resin refractive index n=1.6 has a taper angle of less than 57 degree, the light of the emission angle of 30 degree from the backlight is transmitted in a tapered shape without being totally reflected, so light loss occurs. In order to totally reflect the light within the light emission angle of ±30 degree in a tapered shape without loss, it is desirable that the taper angle of the light diffusion section 40 be 57 degree or more to less than 90 degree.

As shown in FIG. 1B, a diffusion film 50 is fixed to the other surface (the surface on the viewing side) of the substrate 39 by the adhesive layer 51. For example, the diffusion film 50 is made by light scattering bodies 52 such as a large number of acrylic beads being dispersed in the inside of the binder resin such as acrylic resins. The thickness of the diffusion film 50 is about 20 µm as an example. The sphere diameter of the spherical light scattering bodies 52 is about 0.5 µm to 20 µm. The thickness of the adhesive layer 51 is about 25 µm as an example. Further, the diffusion film 50 is an isotropic diffusion material. The diffusion film 50 diffuses isotropically the light diffused by the light diffusion section 40 and broadens the light further to the wide angle.

Further, the light scattering bodies 52 is not limited thereto, but may be made of suitable transparent materials such as resin pieces consisting of acrylic polymers, olefin polymers, vinyl polymers, cellulosic polymers, amide-based polymers, fluorine-based polymers, urethane polymers, silicone polymers, and imide polymers, and glass beads. Further, it is possible to use scattering bodies or reflecting bodies without light absorption other than the transparent materials. Alternatively, the light scattering bodies 52 may be gas bubbles diffused into the light diffusion section 40. For example, the shape of the light scattering bodies 52 each may be formed in various shapes such as spherical shapes, elliptical spherical shapes, flat shapes, polygonal cubes. The light scattering bodies 52 may be formed such that the size thereof is uniform or non-uniform.

In the present embodiment, the diffusion film 50 also serves as an anti-glare processing layer (anti-glare layer). Although the anti-glare processing layer may be formed by applying for example, a sandblasting treatment or an embossing treatment on the substrate 39, an anti-glare treatment is performed by forming a layer including a plurality of light scattering bodies 52 in the substrate 39 in the present embodiment. According to this configuration, since the diffusion film 50 functions as an anti-glare processing layer, it is not necessary to newly provide an anti-glare processing layer. Therefore, it is possible to simplify the device and for the device to have thin thickness.

Further, the diffusion film 50 is disposed on the outside of the adhesive layer 51 in the present embodiment, but is not limited thereto. For example, the adhesive layer 51 itself may have a light diffusion property. For example, it is possible to realize by dispersing a large number of light scattering bodies in the adhesive layer 51. As the adhesive layer 51, it is possible to use suitable adhesive materials depending on an adhesion target, such as adhesives of a pair of rubber-based and acrylic-based, a pair of silicone-based and vinyl-alkyl-ether-based, a pair of polyvinyl-alcohol-based and polyvinyl-pyrrolidone-based, a pair of polyacrylamide-based and cellulose-based, and the like. In particular, adhesive materials excellent in transparency, weather resistance, or the like are preferably used. Note that it is preferable to protect the adhesive layer 51 by being temporarily attached with a separator or the like until it is practically used.

In the case of the present embodiment, as shown in FIG. 3A, the diffusion film 50 is disposed on the outermost surface of the viewing angle widening film 7. Thus, after the light L incident perpendicularly to the light incident end surface 40b of the light diffusion section 40 is diffused by the light diffusion section 40, and further diffused by the diffusion film 50. Therefore, light of various angles is emitted from the diffusion film 50.

Figure 3B:
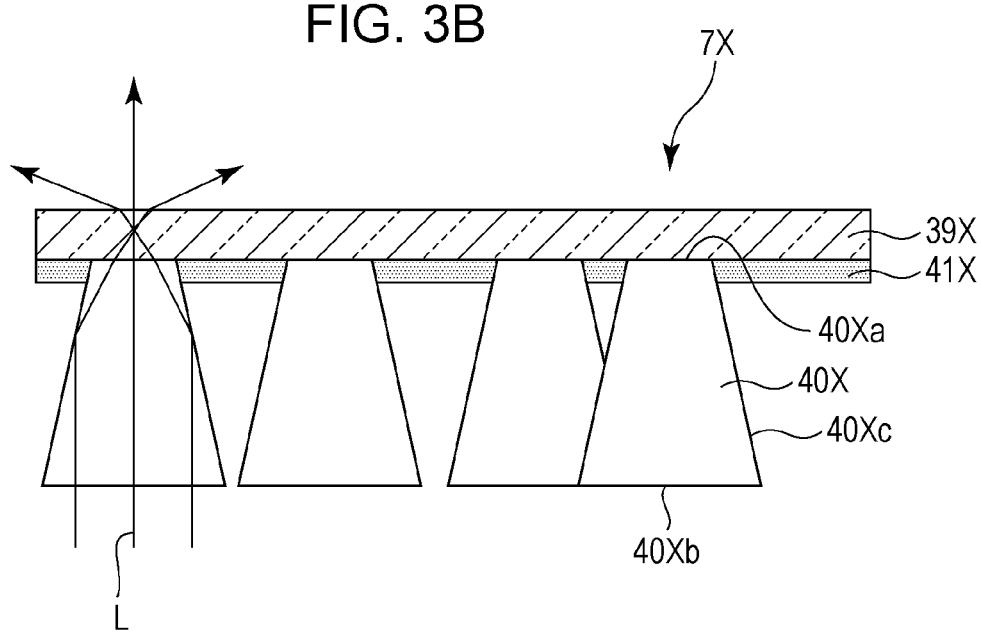
FIG. 3B is a schematic diagram for explaining the operation of the viewing angle widening film of the first embodiment of the present invention.

In another embodiment, a substrate 39X is provided with a light shielding layer 41X and a viewing angle widening film 7X which includes a light emitting end surface 40Xa and a light incident end surface 40Xb, as shown in FIG. 3B. Here, the viewing angle widening film 7X does not include the diffusion film and the light L incident perpendicularly to the light incident end surface 40Xb of the light diffusion section 40X is emitted while being concentrated on a specific diffusion angle. As a result, it is not possible to diffuse the light uniformly over a wide angle range, and bright display can be obtained only in a specific viewing angle.

Thus, in the case of the present embodiment, since the diffusion film 50 is disposed on the outermost surface of the viewing angle widening film 7, it is possible for the diffusion angle of the light not to be concentrated in a single diffusion angle. As a result, it is possible to make the light diffusion properties of the viewing angle widening film 7 more gradual, and thus bright display is obtained in a wide viewing angle.

Further, in the present embodiment, the diffusion film 50 in the viewing angle widening film 7 is configured such that light is incident from a surface 50f on the side opposite to the light diffusion section 40 of the diffusion film 50, is reflected on the interface between the substrate such as a binder resin and the light scattering bodies 52, or refracted by the light scattering bodies 52, and thus the light of which the traveling direction is changed is scattered forwardly. Such total reflection condition can be satisfied by appropriately changing for example, the size of the particles of the light scattering bodies 52 included in the diffusion film 50.

Figure 4:
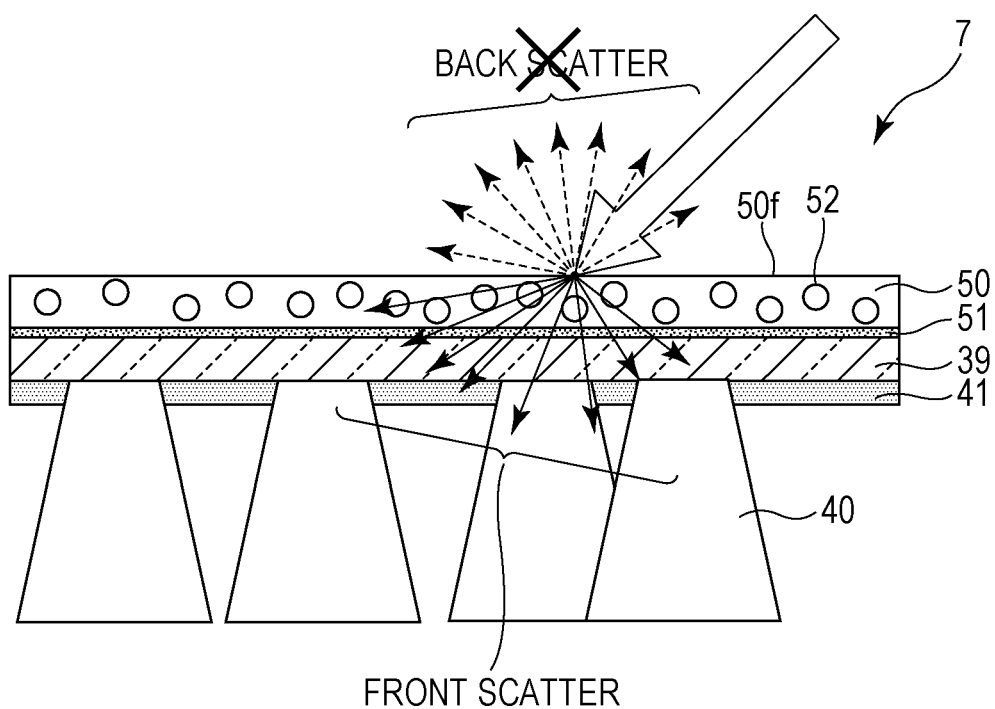
FIG. 4 is a cross-sectional view showing the viewing angle widening film in the liquid crystal display device of the first embodiment of the present invention.

FIG. 4 is a cross-sectional view of a viewing angle widening film of the present embodiment.

As shown in FIG. 4, in the case of the present embodiment, the diffusion film 50 in the viewing angle widening film 7 is configured such that the light which is incident from the surface 50f to the inside and of which the traveling direction is changed by the light scattering bodies 52 is subjected to Mie scattering, on the surface 50f of the diffusion film 50 and thus a so-called back scatter does not occur. Accordingly, it is possible to suppress the decrease in display quality and contrast.

Next, a method for manufacturing a liquid crystal display device 1 configured as described above will be described with reference to FIGS. 5A to 5F.

In the following description, the manufacturing process of the viewing angle widening film 7 will be mainly described.

If the outline of the manufacturing process of the liquid crystal display body 6 is first described, at first, a TFT substrate 9 and a color filter substrate 10 are respectively produced. Then, a surface of the TFT substrate 9 having a TFT 19 formed thereon and a surface of the color filter substrate 10 having a color filter 31 formed thereon are disposed so as to oppose each other, and the TFT substrate 9 and the color filter substrate 10 are bonded by the seal member. Thereafter, the liquid crystal is injected in the space surrounded by the TFT substrate 9, the color filter substrate 10, and the seal member. A first polarizing plate 3 and a second polarizing plate 5 are respectively bonded to the both sides of the liquid crystal panel 4 formed in this manner by an optical adhesive, or the like. Through the above process, the liquid crystal display body 6 is completed.

Further, since the method for manufacturing the TFT substrate 9 and the color filter substrate 10 are known in this field, the description thereof will be omitted.

Figure 5A:
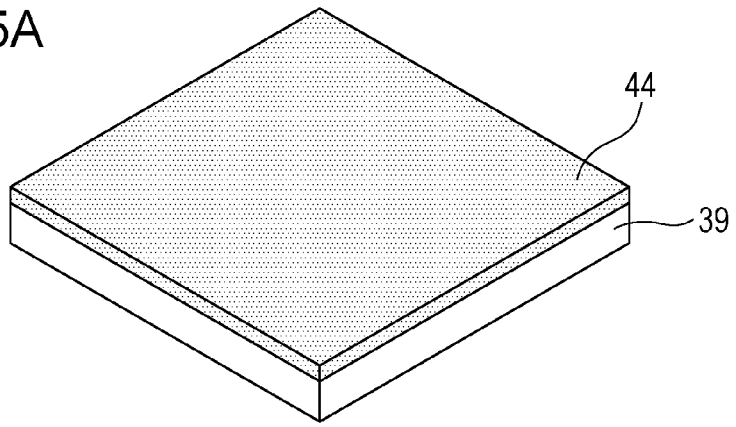
FIG. 5A is a perspective view showing a manufacturing process of the viewing angle widening film of the liquid crystal display device of the first embodiment of the present invention.

First, as shown in FIG. 5A, a substrate 39 of polyethylene terephthalate of a thickness of 100 μm in a 10 cm square is prepared, and black negative resists containing carbon as a light shielding layer material is applied on one surface of the substrate 39 by using the spin coating method to form a coating film 44 having a film thickness of 150 nm.

Next, the substrate 39 having the above coating film 44 formed is placed on a hot plate and the coating film is pre-baked at a temperature of 90° C. As a result, the solvent in the black negative resist is volatilized.

Figure 5B:
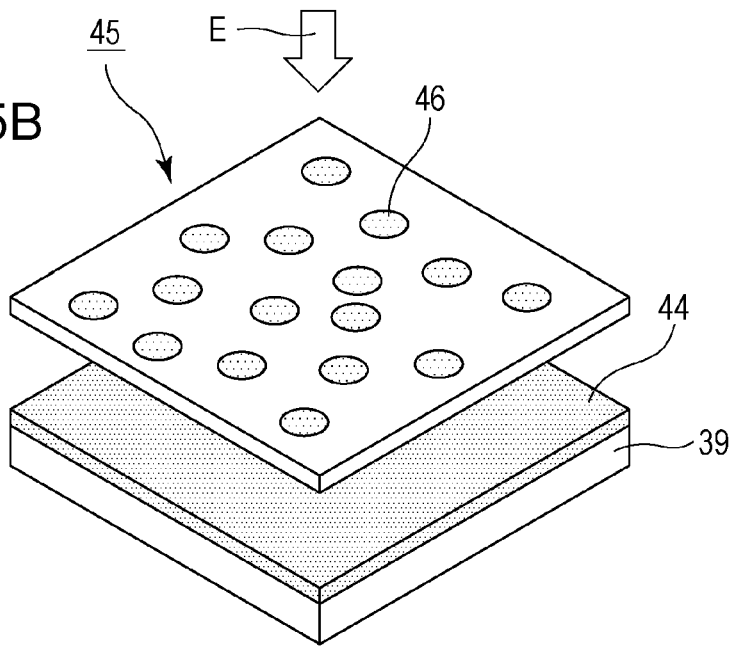
FIG. 5B is a perspective view showing the manufacturing process of the viewing angle widening film of the liquid crystal display device of the first embodiment of the present invention.

Next, using an exposure apparatus, as shown in FIG. 5B, exposure is performed by the coating film 44 being irradiated with the light E through the photo mask 45 having a plurality of shielding patterns 46 provided therein. At this time, an exposure apparatus using a mixed ray of an i ray of a wavelength of 365 nm, an h ray of a wavelength of 404 nm, and a g ray of a wavelength of 436 nm is used. The exposure amount is 100 mJ/cm². In the case of the present embodiment, since the exposure of a transparent negative resist is performed by using the light shielding layer 41 as a mask in the next procedure so as to form the light diffusion section 40, the position of the shielding pattern 46 of the photo mask 45 corresponds to the formation position of the light diffusion section 40. The plurality of shielding patterns 46 all have a circular pattern with a diameter of 20 μm, randomly disposed.

Therefore, the distance (pitch) between the adjacent shielding patterns 46 is not constant, but the average distance obtained by averaging the distance among the plurality of shielding patterns 46 is 25 μm.

It is desirable that the average distance among the shielding patterns 46 be smaller than the distance (pitch) among the pixels of the liquid crystal panel 4. Thus, at least one light diffusion section 40 is formed in the pixel, so it is possible to achieve a wide viewing angle when combined with, for example, a liquid crystal panel having a small pixel pitch used in a mobile device, or the like.

Figure 5C:
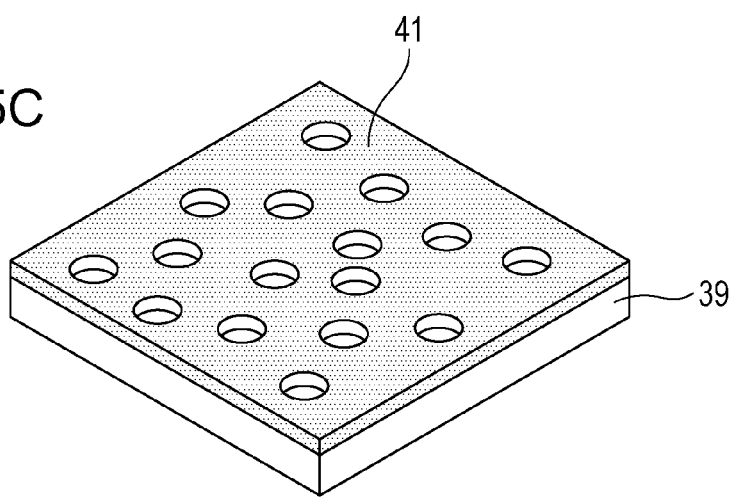
FIG. 5C is a perspective view showing the manufacturing process of the viewing angle widening film of the liquid crystal display device of the first embodiment of the present invention.

After exposure is performed using the above photo mask 45, a coating film 44 made of black negative resists is developed using a designated developing solution and dried at 100° C., and thus as shown in FIG. 5C, a light shielding layer 41 having a plurality of circular opening portions are formed on one surface of the substrate 39. The circular opening portions correspond to the formation regions of the light diffusion sections 40 in the next process.

Further, although the light shielding layer 41 is formed by a photolithography method using the black negative resist in the present embodiment, instead of this configuration, if a photo mask is used in which the shielding pattern 46 and the light transmission section of the present embodiment are reversed, it is possible to use a positive resist. Alternatively, a light shielding layer 41 subjected to patterning using a vapor deposition method, a printing method, an inkjet method, or the like may be directly formed.

Figure 5D:
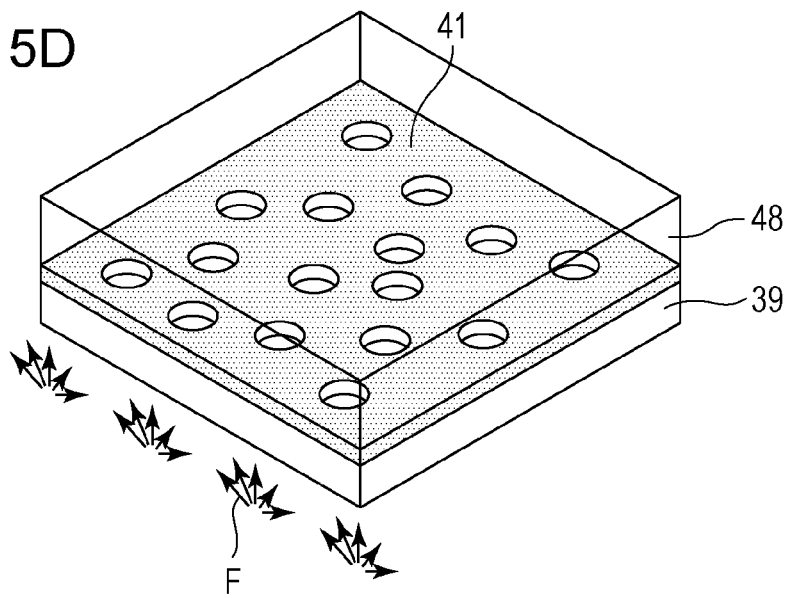
FIG. 5D is a perspective view showing the manufacturing process of the viewing angle widening film of the liquid crystal display device of the first embodiment of the present invention.

Next, as shown in FIG. 5D, a transparent negative resist made of acrylic resins as a light diffusion section material is applied on the upper surface of the light shielding layer 41 by using a spin coating method to form a coating film 48 of a film thickness of 25 μm. Next, the substrate 39 having the above coating film 48 formed is placed on a hot plate and the coating film 48 is pre-baked at a temperature of 95° C. Thus, the solvent in the transparent negative resist is volatilized.

Next, exposure is performed by the coating film 48 being irradiated with the diffusion light F by using the light shielding layer 41 as a mask, from the substrate 39 side. At this time, an exposure apparatus using a mixed ray of an i ray of a wavelength of 365 nm, an h ray of a wavelength of 404 nm, and a g ray of a wavelength of 436 nm is used. The exposure amount is 600 mJ/cm². In the exposure process, parallel light or diffusion light is used. Further, as means for irradiating the substrate 39 with the parallel light emitted from the exposure apparatus as the diffusion light F, a diffusing plate of about 50 haze may be disposed on the light path of the light emitted from the exposure apparatus. By performing the exposure using the diffusion light F, the coating film 48 is exposed radially from the opening portion between the light shielding layers 41 to form a side surface of an inverse tapered shape of the light diffusion section 40.

Thereafter, the substrate 39 having the above coating film 48 formed is placed on a hot plate and the post-exposure bake (PEB) of the coating film 48 is performed at a temperature of 95° C.

Figure 5E:
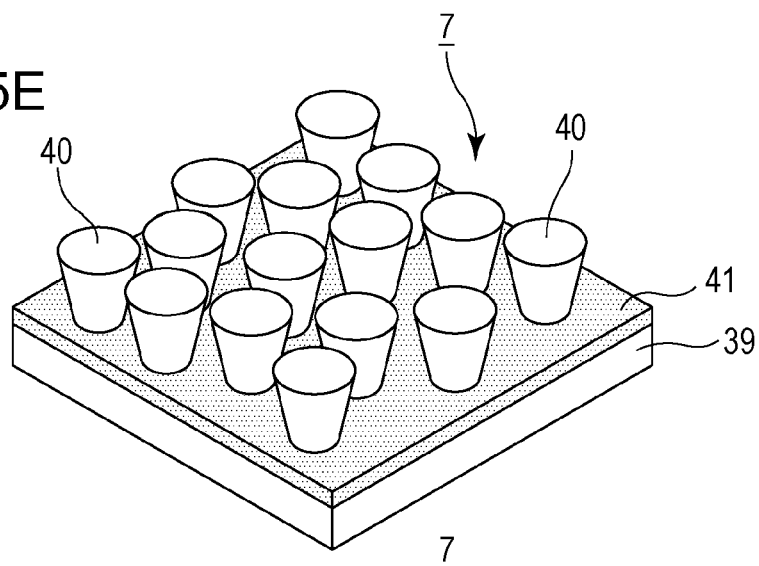
FIG. 5E is a perspective view showing the manufacturing process of the viewing angle widening film of the liquid crystal display device of the first embodiment of the present invention.

Next, the coating film 48 made of a transparent negative resist is developed using a designated developing solution and post-baked at 100° C. to form a plurality of light diffusion sections 40 on one surface of the substrate 39 as shown in FIG. 5E.

Figure 5F:
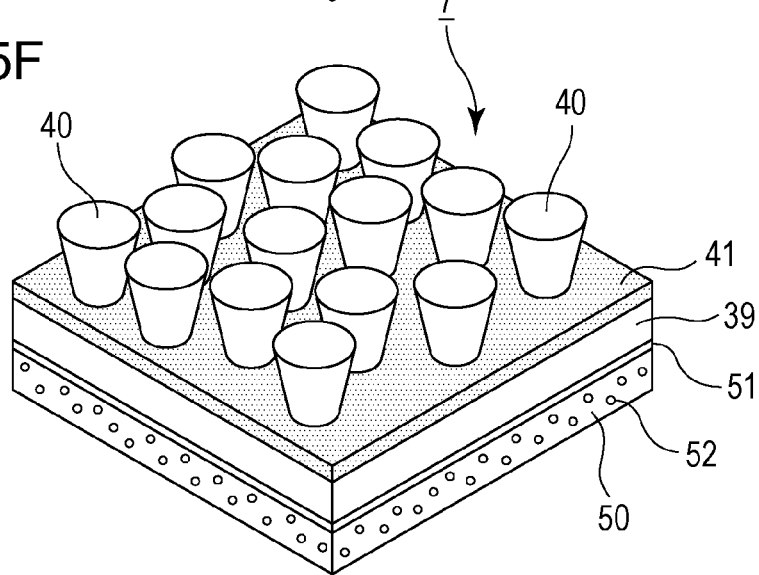
FIG. 5F is a perspective view showing the manufacturing process of the viewing angle widening film of the liquid crystal display device of the first embodiment of the present invention.

Next, as shown in FIG. 5F, a diffusion film 50 made by dispersing a large number of light scattering bodies 52 such as acrylic beads inside a binder resin such as acrylic resins is disposed on the other surface of the substrate 39 through the adhesive layer 51.

Through the above process, the viewing angle widening film 7 of the present embodiment is completed. The total light transmittance of the viewing angle widening film 7 is preferably 90% or more. If the total light transmittance is 90% or more, the sufficient transparency is achieved, and the sufficient optical performance required for viewing angle widening film is exhibited. The total light transmittance is due to the provision of JIS K7361-1.

Further, although a liquid resist is applied in forming the light shielding layer 41 and the light diffusion section 40 in the above example, instead of this configuration, a film-like resist may be affixed to one surface of the substrate 39.

Finally, as shown in FIG. 2, in a state where the substrate 39 faces the viewing side and the light diffusion section 40 is opposed to the second polarizing plate 5, the viewing angle widening film 7 that has been completed is affixed to the liquid crystal display body 6 using an optical adhesive, or the like.

Through the above process, the liquid crystal display device 1 of the present embodiment is completed.

According to the present embodiment, as shown in FIG. 3A, the light L incident on the viewing angle widening film 7 is emitted from the viewing angle widening film 7 in a state where the angular distribution of the light L has become wider than before being incident on the viewing angle widening film 7. Therefore, the observer can view a good quality of display even if the observer tilts the line of sight from a front direction (normal direction) of the liquid crystal display body 6. Particularly, since the planar shape of the light diffusion section 40 is circular in the case of the present embodiment, the angular distribution spreads to all orientations centered on the normal direction of the screen of the liquid crystal display body 6. Therefore, the observer can view a good quality of display in all orientations.

On the other hand, the light L incident obliquely to the viewing angle widening film 7 is the light obliquely transmitted through the liquid crystal panel 4, and the light different from the desired retardation, a so-called the light serving as a factor to reduce the contrast of the display. Since such light is cut by the light shielding layer 41, the viewing angle widening film 7 of the present embodiment can enhance the contrast of the display. Further, since external light incident on the viewing angle widening film 7 from the viewing side is also cut by the light shielding layer 41, it is possible to suppress the scattering of the external light and to enhance the viewability of the display in the bright places.

Generally, it has been known that when patterns with regularity such as stripes and lattices are superimposed with each other, if the period of the pattern is shifted slightly, the interference fringe shape (moire) is viewed. For example, if a viewing angle widening film in which a plurality of light diffusion sections are arranged in a matrix shape and a liquid crystal panel in which a plurality of pixels are arranged in a matrix shape are superimposed, there is a concern that moire is generated between a periodic pattern by the light diffusion section of the viewing angle widening film and a periodic pattern by the pixels of the liquid crystal panel and the display quality is lowered. In contrast, according to the liquid crystal display device 1 of the present embodiment, since plurality of light diffusion sections 40 are arranged randomly on a plane, moire is not generated by the interference between regular arrangements of the pixels of the liquid crystal panel 4, and thus it is possible to maintain the display quality.

Further, in the process of forming the light diffusion section 40, if it is assumed that the exposure is performed using the photo mask from the coating film 48 side made of the transparent negative resist, it is difficult to align the substrate 39 having the light shielding layer 41 of a minute size formed and the photo mask, and it is inevitable that deviation occurs. As a result, a gap is created between the light diffusion section 40 and the light shielding layer 41, and thus there is a possibility that the contrast is reduced by the leakage of the light through the gap. In contrast, since light is irradiated from the rear surface side of the substrate 39 by using the light shielding layer 41 as a mask in the case of the present embodiment, the light diffusion sections 40 are formed in a state of being self-aligned to the positions of the opening portions of the light shielding layer 41. As a result, the light diffusion section 40 and the light shielding layer 41 becomes a state of being in close contact, there is no gap therebetween, and thus the contrast can be reliably maintained.

In addition, at least a portion of the light diffusion sections 40 may be connected. Thus, each light diffusion section 40 is unlikely to collapse, and the shape stability of the viewing angle widening film 7 is improved. Further, since the proportion of the light absorbed in the light shielding layer 41 to the light incident on the viewing angle widening film 7 is reduced, the use efficiency of the light is improved.

First Modification Example of the First Embodiment

Figure 6A:
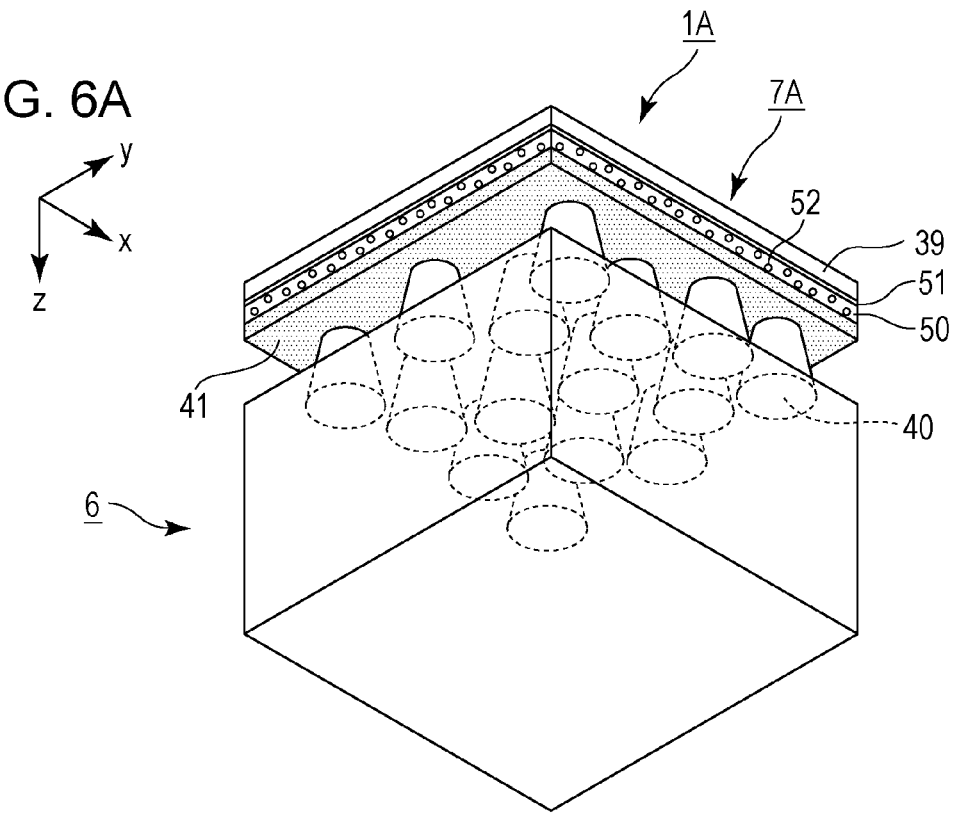
FIG. 6A is a perspective view showing a first modification example of the liquid crystal display device of the first embodiment of the present invention.
Figure 6B:
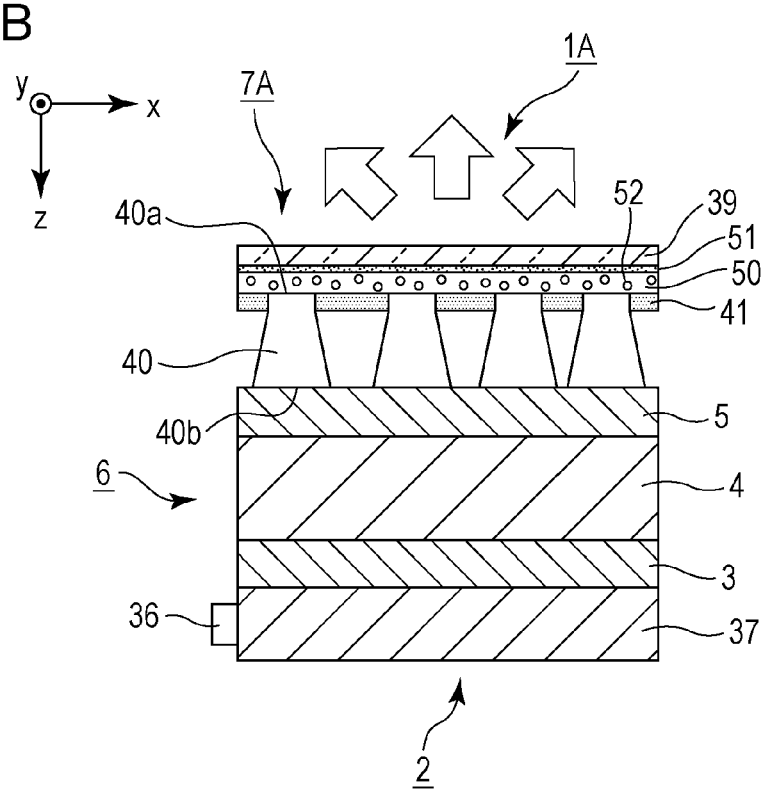
FIG. 6B is a cross-sectional view showing the first modification example of the liquid crystal display device of the first embodiment of the present invention.

FIGS. 6A and 6B are schematic diagrams showing a first modification example of a liquid crystal display device of the embodiment. FIG. 6A is a perspective view of a liquid crystal display device 1A of the present modification example. FIG. 6B is a cross-sectional view of the liquid crystal display device 1A of the present modification example.

Although the diffusion film 50 is disposed in the other surface (the surface on the viewing side) of the substrate 39 in the present embodiment, the diffusion film 50 may be disposed on one surface (the surface opposing the viewing side) of the substrate 39, as the viewing angle widening film 7A shown in FIGS. 6A and 6B. In other words, the diffusion film 50 may be disposed further on the light emitting side than the light diffusion section 40. The present modification example has a configuration in which the diffusion film 50 is fixed to the one surface of the substrate 39 through the adhesive layer 51, and the light diffusion section 40 and the light shielding layer 41 are formed on the one surface (the surface opposing to the viewing side) of the diffusion film 50.

Even in the configuration, it is possible to achieve the same effect as that of the first embodiment in which no moire occurs and thus the display quality can be maintained.

Second Embodiment

Hereinafter, a second embodiment of the present invention will be described using FIGS. 7A to 8F.

The basic configuration of a liquid crystal display device of the present embodiment is the same as that of the first embodiment, but the second embodiment is different from the first embodiment in that light scattering bodies are included in a substrate. Therefore, in the present embodiment, the description of the basic configuration of the liquid crystal display device is omitted, and only the viewing angle widening film will be described.

Figure 7A:
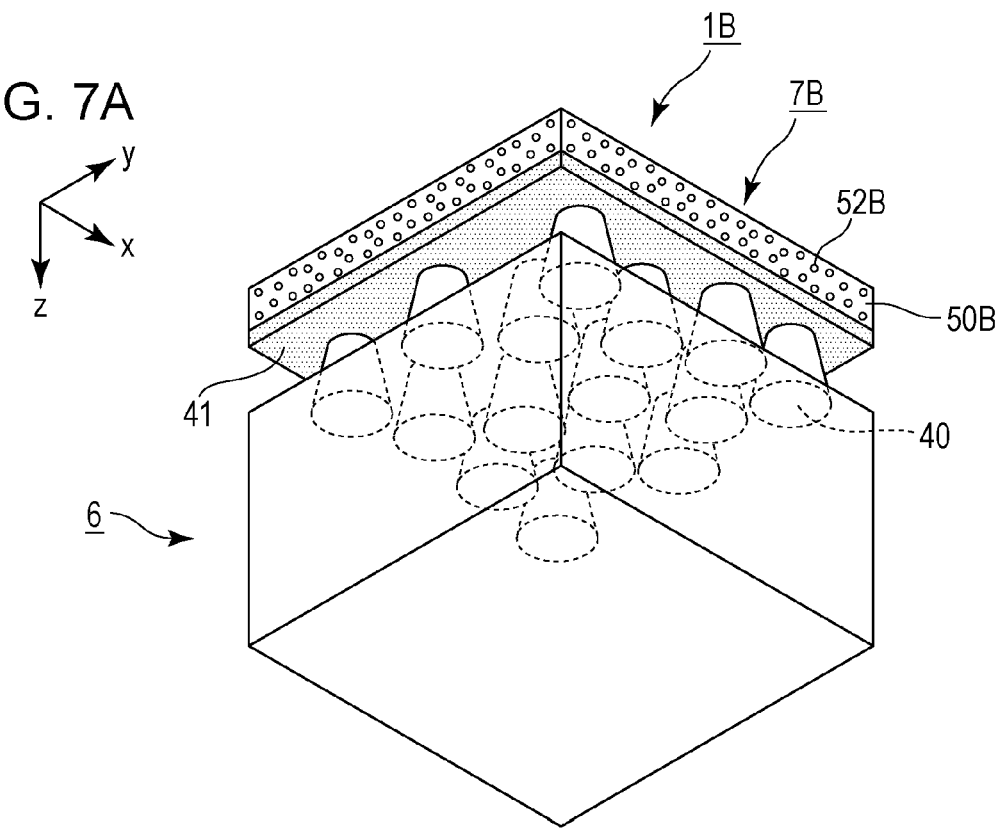
FIG. 7A is a perspective view showing a liquid crystal display device of a second embodiment of the present invention.
Figure 7B:
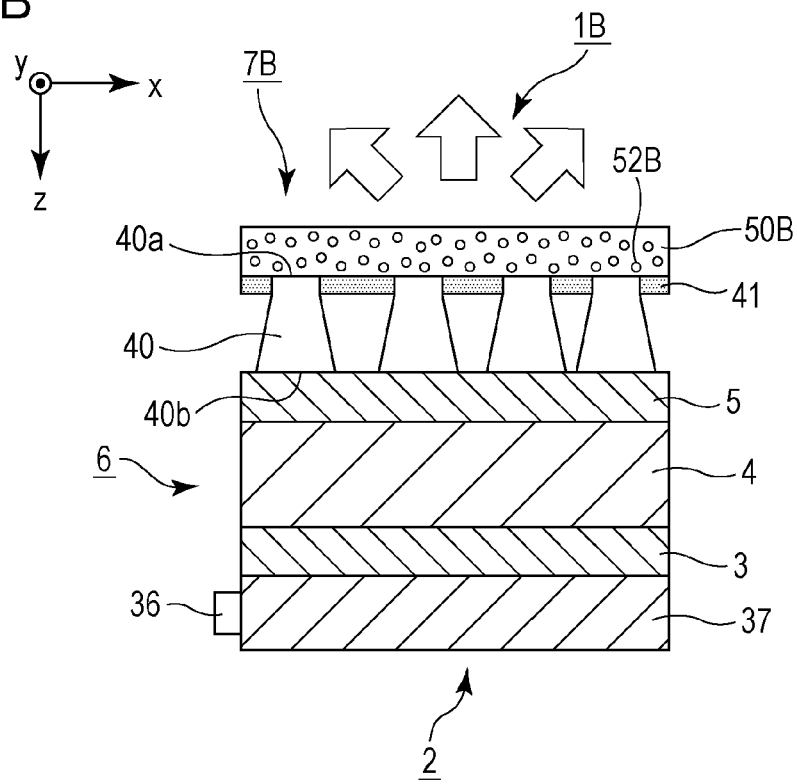
FIG. 7B is a cross-sectional view showing the liquid crystal display device of the second embodiment of the present invention.

FIGS. 7A and 7B are schematic diagrams showing a liquid crystal display device of the present embodiment. FIG. 7A is a perspective view of a liquid crystal display device 1B of the present embodiment. FIG. 7B is a cross-sectional view of the liquid crystal display device 1B of the present embodiment.

FIGS. 8A to 8F are cross-sectional views showing a manufacturing process of the viewing angle widening film.

In FIGS. 7A to 8F, the same reference numerals are given to the common components with those in the drawings used in the first embodiment, and thus detailed description thereof will be omitted.

In the first embodiment, the diffusion film 50 is disposed on the other surface (the surface on the viewing side) of the substrate 39. In contrast, in a viewing angle widening film 7B of the present embodiment, as shown in FIGS. 7A and 8B, the diffusion film is not disposed in the substrate, but the substrate itself functions as a diffusion film. In other words, a large number of light scattering bodies 52B are dispersed in the inside of the substrate 50B.

Figure 8A:
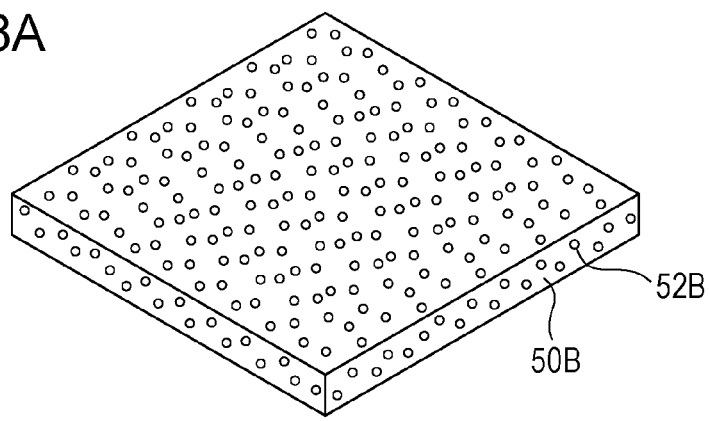
FIG. 8A is a perspective view showing a manufacturing process of a viewing angle widening film of the liquid crystal display device of the second embodiment of the present invention.
Figure 8B:
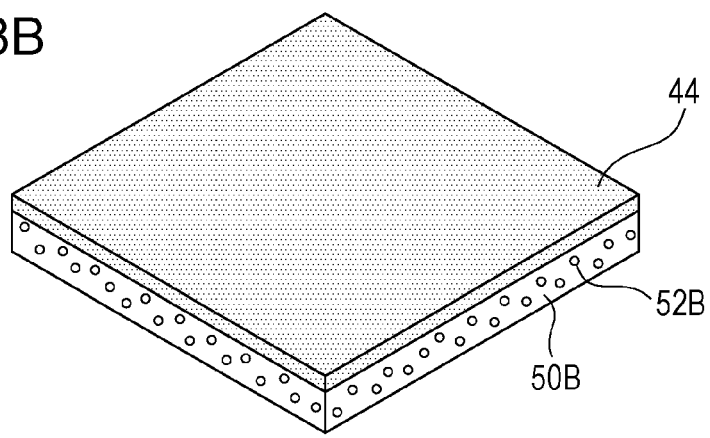
FIG. 8B is a perspective view showing the manufacturing process of the viewing angle widening film of the liquid crystal display device of the second embodiment of the present invention.

In the manufacturing process of the viewing angle widening film 7B of the present embodiment, first, as shown in FIG. 8A, a substrate 50B in which a large number of light scattering bodies 52B are dispersed is prepared.

Next, as shown in FIG. 8B, black negative resists containing carbon as a light shielding layer material is applied on one surface of the substrate 50B by using a spin coating method to form a coating film 44. Next, the substrate 39 having the above coating film 44 formed is placed on a hot plate and the coating film is pre-baked.

Figure 8C:
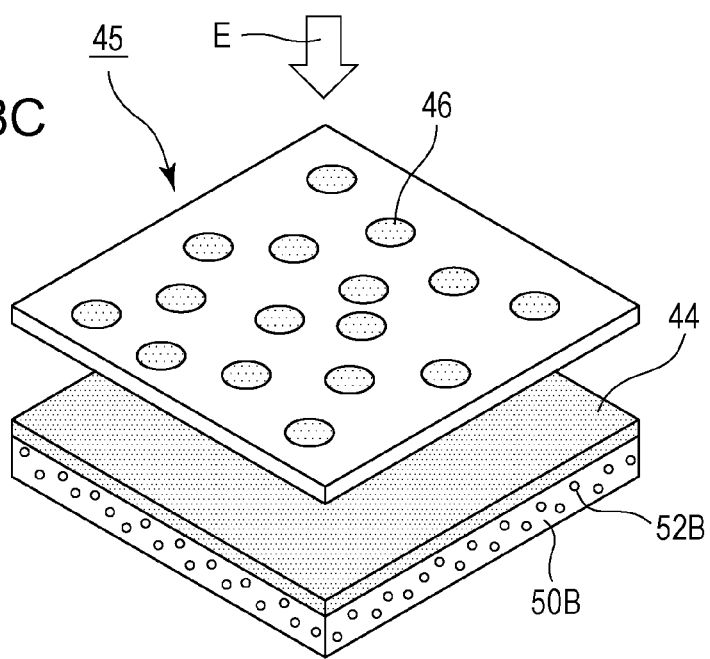
FIG. 8C is a perspective view showing the manufacturing process of the viewing angle widening film of the liquid crystal display device of the second embodiment of the present invention.

Next, using an exposure apparatus, as shown in FIG. 8C, exposure is performed by the coating film 44 being irradiated with the light E through the photo mask 45 having a plurality of shielding patterns 46 provided therein.

Figure 8D:
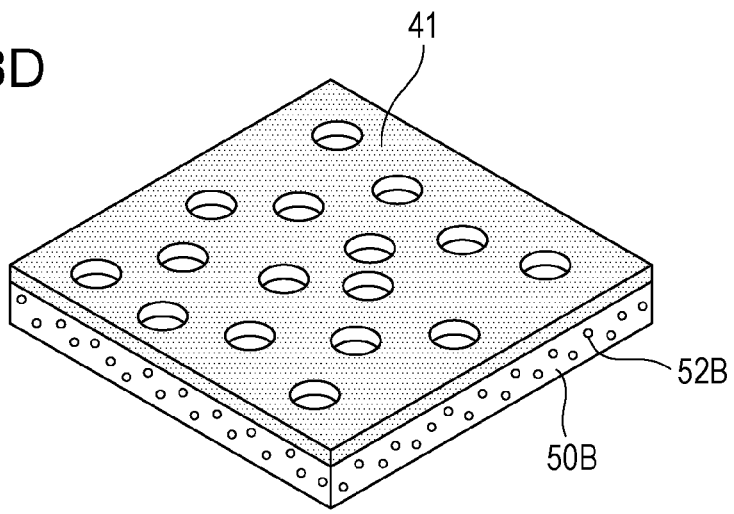
FIG. 8D is a perspective view showing the manufacturing process of the viewing angle widening film of the liquid crystal display device of the second embodiment of the present invention.

After the exposure is performed using the above photo mask 45, a coating film 44 made of black negative resists is developed using a designated developing solution and dried, as shown in FIG. 8D, and thus a light shielding layer 41 having a plurality of circular opening portions is formed on the one surface of the substrate 50B. The circular opening portion corresponds to the formation regions of the light diffusion sections 40 in the next process.

Figure 8E:
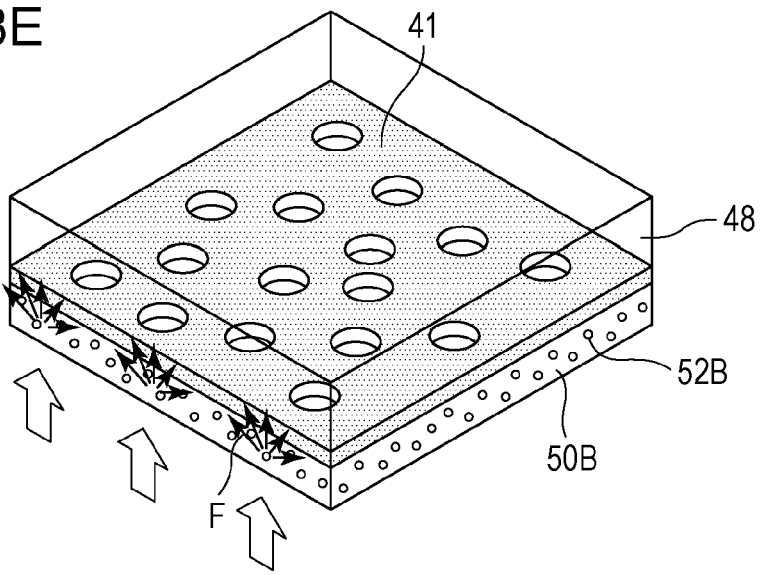
FIG. 8E is a perspective view showing the manufacturing process of the viewing angle widening film of the liquid crystal display device of the second embodiment of the present invention.

Next, as shown in FIG. 8E, a transparent negative resist made of acrylic resins as a light diffusion section material is applied on the upper surface of the light shielding layer 41 by using a spin coating method to form a coating film 48.

Next, the substrate 50B having the above coating film 48 formed is placed on a hot plate and the coating film 48 is pre-baked.

Next, exposure is performed by the coating film 48 being irradiated with the diffusion light F using the light shielding layer 41 as a mask from the substrate 50B side. At this time, an exposure apparatus using a mixed ray of an i ray of a wavelength of 365 nm, an h ray of a wavelength of 404 nm, and a g ray of a wavelength of 436 nm is used. The exposure amount is 600 mJ/cm$^2$. In the exposure process, parallel light or diffusion light is used. Further, in the present embodiment, light scattering bodies 52B are dispersed in the inside of the substrate 50B, so the light emitted from the exposure apparatus becomes diffusion light after being transmitted through the substrate 50B and reaches the coating film 48. Therefore, by setting the substrate 50B to a predetermined haze value, as means for irradiating the substrate 50B with the diffusion light F, it is not necessary to dispose a diffusing plate on the light path of the light emitted from the exposure apparatus. By performing the exposure using the diffusion light F, the coating film 48 is exposed radially from the opening portion between the light shielding layers 41 to form a side surface of an inverse tapered shape of the light diffusion section 40.

Thereafter, the substrate 50B having the above coating film 48 formed is placed on a hot plate, and the post-exposure bake (PEB) of the coating film 48 is performed.

Figure 8F:
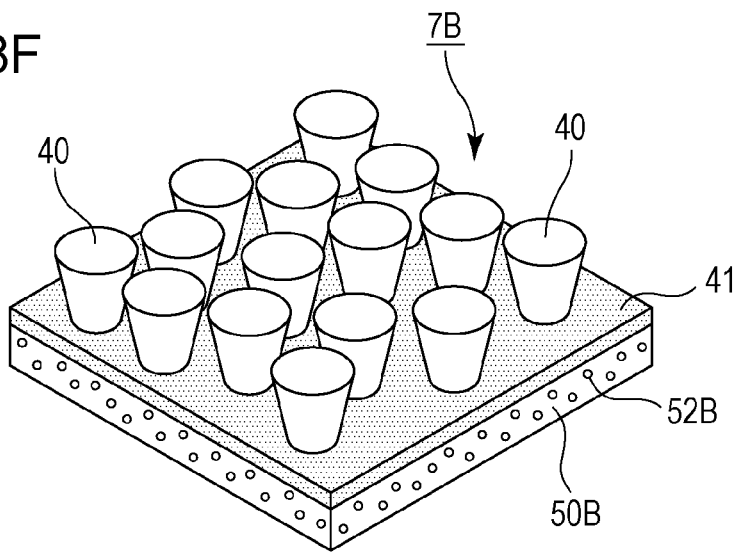
FIG. 8F is a perspective view showing the manufacturing process of the viewing angle widening film of the liquid crystal display device of the second embodiment of the present invention.

Next, the coating film 48 made of a transparent negative resist is developed using a designated developing solution and post-baked, as shown in FIG. 8F, and thus a plurality of light diffusion sections 40 are formed on the one surface of the substrate 50B.

Through the above process, the viewing angle widening film 7B of the present embodiment is completed.

Finally, as shown in FIG. 7B, in a state where the substrate 50B faces the viewing side and a light diffusion section 40 is opposed to the second polarizing plate 5, the viewing angle widening film 7B that has been completed is affixed to the liquid crystal display body 6 using an optical adhesive, or the like.

Through the above process, the liquid crystal display device 1B of the present embodiment is completed.

According to the liquid crystal display device 1B of the present embodiment, since the substrate 50B itself functions as the diffusion film, it is not necessary to provide newly the adhesive layer and the diffusion film. Accordingly, it is possible to simplify the device and for the device to have thin thickness. Further, in the manufacturing process of the viewing angle widening film 7B, since the substrate 50B functions as a diffusing plate, it is not necessary to dispose a diffusing plate on the light path of the light emitted from the exposure apparatus in forming the light diffusion section 40. Therefore, it is possible to simplify the manufacturing process.

Third Embodiment

Hereinafter, a third embodiment of the present invention will be described using FIGS. 9A to 11B.

The basic configuration of a liquid crystal display device of the present embodiment is the same as that of the first embodiment, but the configuration of a light diffusion section of a viewing angle widening film is different from that of first embodiment. Therefore, in the present embodiment, the description of the basic configuration of the liquid crystal display device is omitted, and only the viewing angle widening film will be described.

Figure 9A:
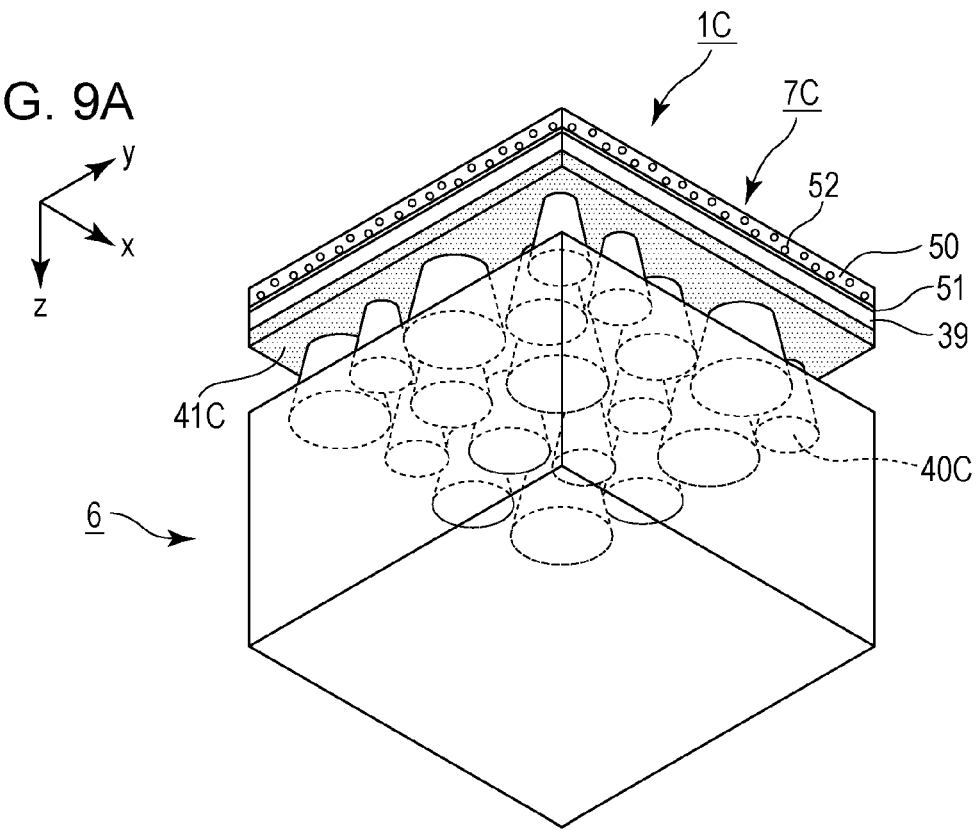
FIG. 9A is a perspective view showing a liquid crystal display device according to a third embodiment of the present invention.
Figure 9B:
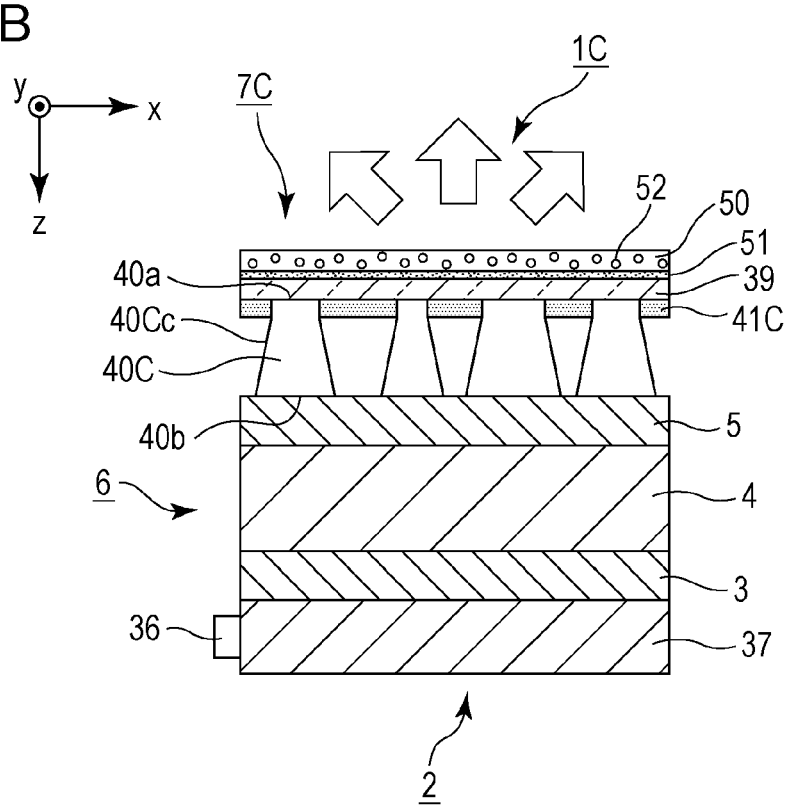
FIG. 9B is a cross-sectional view showing the liquid crystal display device according to the third embodiment of the present invention.

FIGS. 9A and 9B are schematic diagrams showing a liquid crystal display device of the present embodiment. FIG. 9A is a perspective view of a liquid crystal display device 1C of the present embodiment. FIG. 9B is a cross-sectional view of the liquid crystal display device 1C of the present embodiment.

FIGS. 10A to 11B are diagrams for explaining the operation of the viewing angle widening film.

Further, in FIGS. 9A to 11B, the same reference numerals are given to the common components with those in the drawings used in the first embodiment, and thus detailed description thereof will be omitted.

In the first embodiment, a plurality of light diffusion sections 40 all have the same dimension. In contrast, in a viewing angle widening film 7C of the present embodiment, as shown in FIG. 9A, a plurality of light diffusion sections 40C have different dimensions (diameters). For example, the diameter of the plurality of light diffusion sections 40C is distributed in a range of 15 to 25 µm. In other words, the plurality of light diffusion sections 40C have a plurality of types of dimensions. Further, the plurality of light diffusion sections 40C are arranged randomly in a plane, similar to the first embodiment. Other configurations are the same as those of the first embodiment.

Figure 10A:
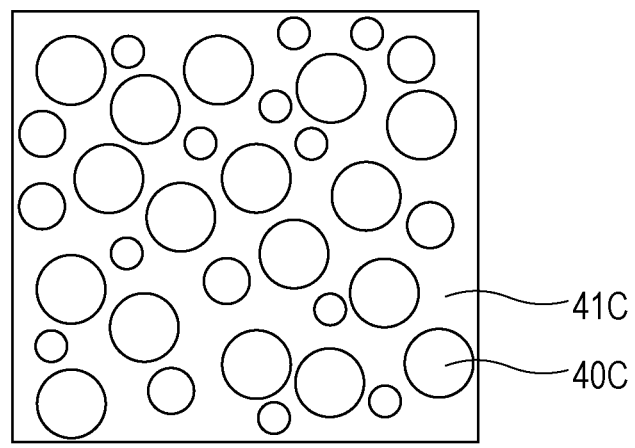
FIG. 10A is a schematic diagram for explaining the operation of a viewing angle widening film of the third embodiment of the present invention.
Figure 10B:
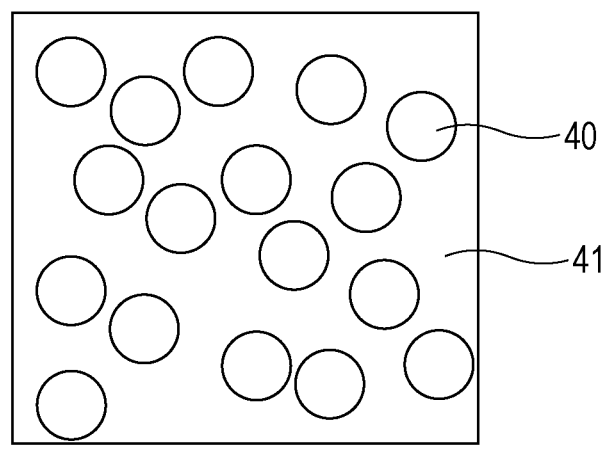
FIG. 10B is a schematic diagram for explaining the operation of the viewing angle widening film of the third embodiment of the present invention.
Figure 11A:
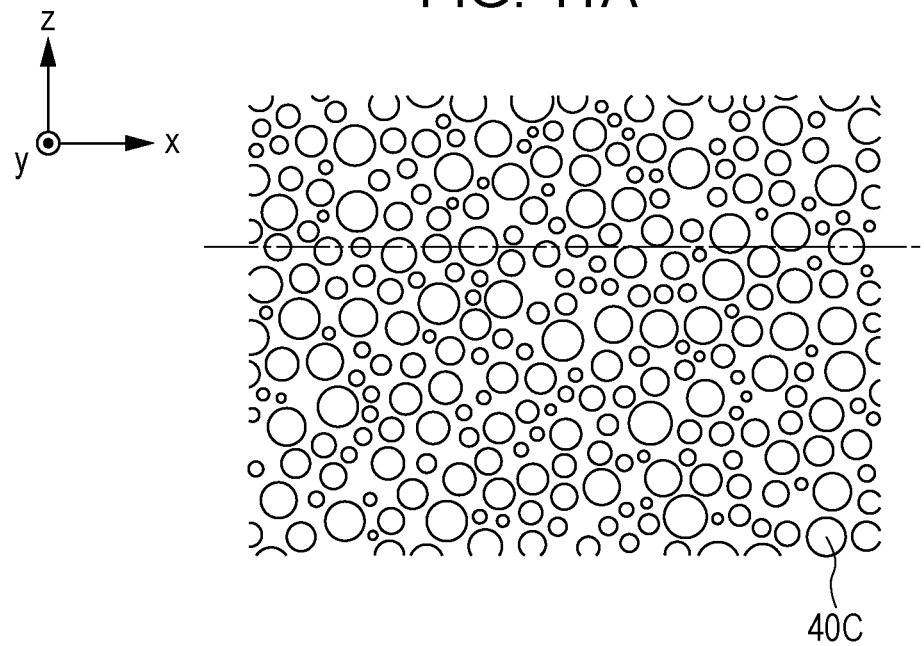
FIG. 11A is a schematic diagram for explaining the operation of the viewing angle widening film of the third embodiment of the present invention.

In the case of the present embodiment, as shown in FIGS. 10A and 11A, a cross-sectional shape in the x-y plane of the light diffusion section 40C is a circle similar to the light diffusion section 40 (see FIGS. 10B and 11B) of the first embodiment. Therefore, in the x-z plane, the action of the viewing angle widening film 7C to expand the angular distribution of light is similar to the first embodiment. However, while in the first embodiment, the plurality of light diffusion sections 40 all have the same dimension, as shown in FIGS. 10A and 11A, in the present embodiment, the plurality of light diffusion sections 40C have different dimensions. As shown in FIG. 10B, if the light diffusion section 40 has a constant shape, even if the pitch of the light diffusion section is narrowed in order to increase the proportion of the light transmitted portions (light diffusion section), a wide shielding portion (light shielding layer) remains. As a result, the proportion of light shielded by the light shielding layer is increased.

Figure 11B:
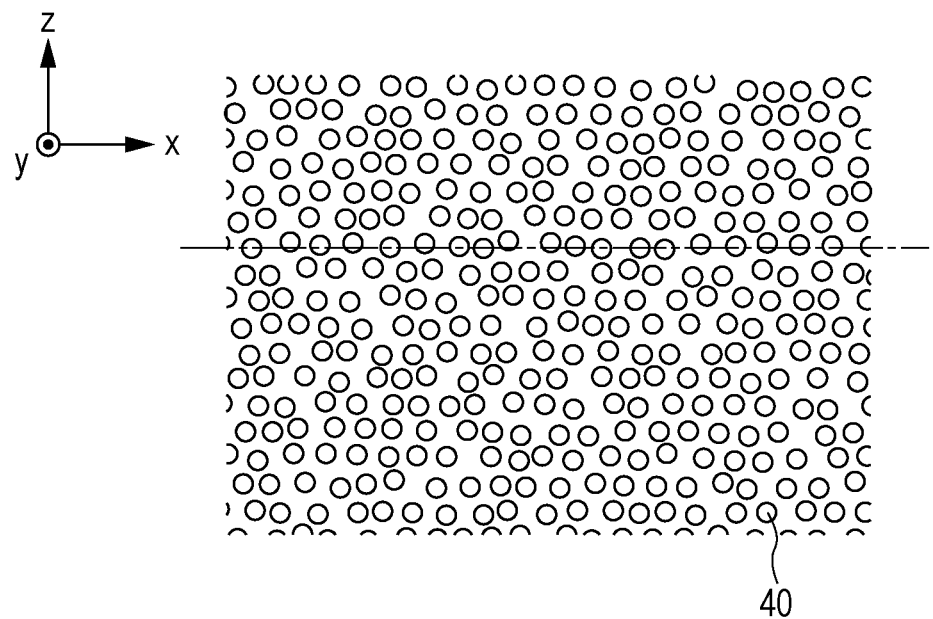
FIG. 11B is a schematic diagram for explaining the operation of the viewing angle widening film of the third embodiment of the present invention.

Further, as shown in FIG. 11B, if the light diffusion sections 40 of the constant shape are randomly arranged, a portion is created in which the plurality of light diffusion sections 40 are arranged side by side in a line. In contrast, as shown in FIG. 11A, if light diffusion sections 40C having shape of different sizes are randomly arranged, a proportion of the plurality of light diffusion sections 40C being arranged side by side in a line is reduced. In other words, by making the plurality of light diffusion sections to have a plurality of types of dimensions or by randomly changing the plurality of light diffusion sections, for example, by filling spaces among circular light diffusion sections having a great diameter with circular light diffusion sections having a small diameter, it is possible to increase the arrangement density of the light diffusion sections. As a result, it is possible to reduce a proportion of light being shielded by the light shielding layer, and to improve the use efficiency of light.

According to the liquid crystal display device 1C of the present embodiment, since the sizes of the light diffusion sections 40C are different as well as that the plurality of light diffusion sections 40C are arranged randomly, it is possible to more reliably suppress moire fringes caused by the diffraction phenomena of light.

Fourth Embodiment

Hereinafter, a fourth embodiment of the present invention will be described using FIGS. 12 to 14B.

The basic configuration of a liquid crystal display device of the present embodiment is the same as that of the first embodiment, the shape of a light diffusion section of a viewing angle widening film is different from that of first embodiment. Therefore, in the present embodiment, the description of the basic configuration of the liquid crystal display device is omitted, and only the viewing angle widening film will be described.

Figure 12:
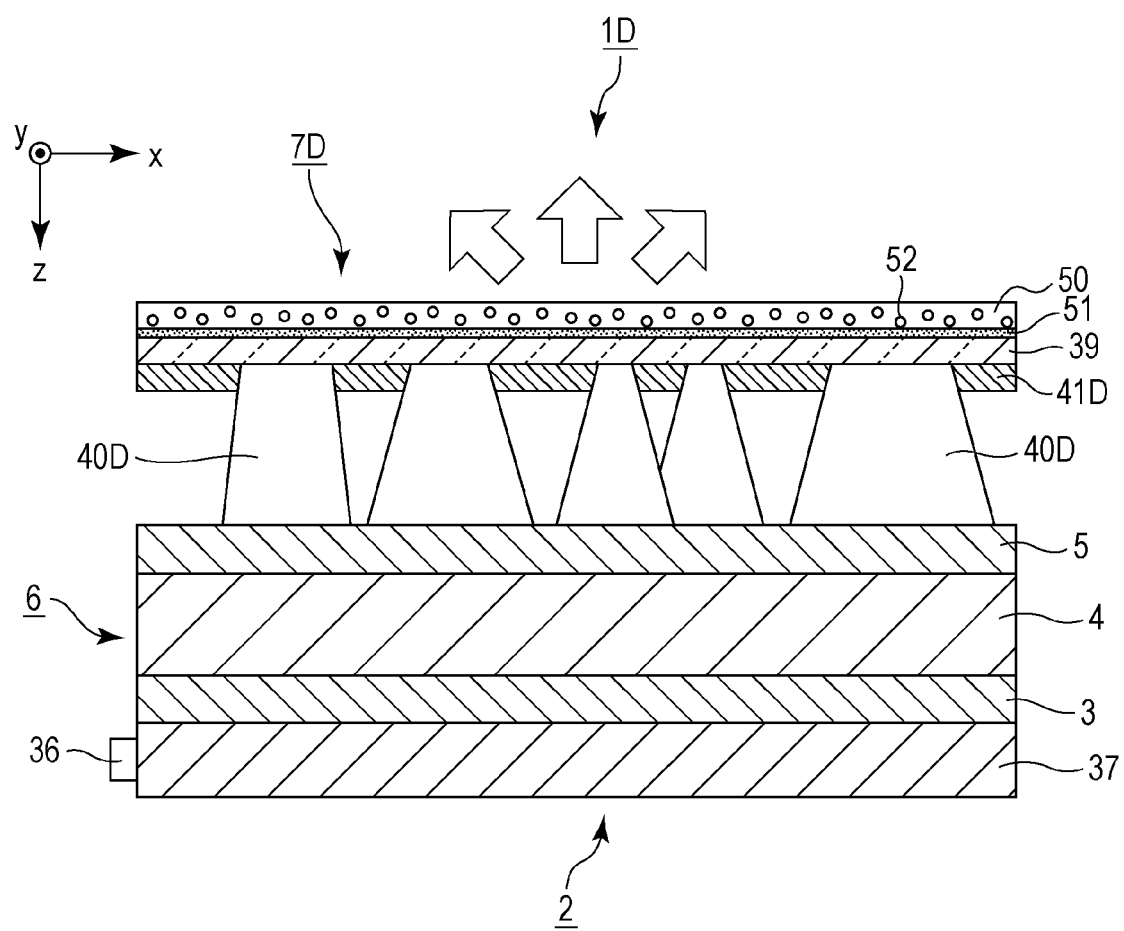
FIG. 12 is a cross-sectional view showing a liquid crystal display device according to a fourth embodiment of the present invention.

FIG. 12 is a cross-sectional view showing a liquid crystal display device of the present embodiment.

Figure 13A:
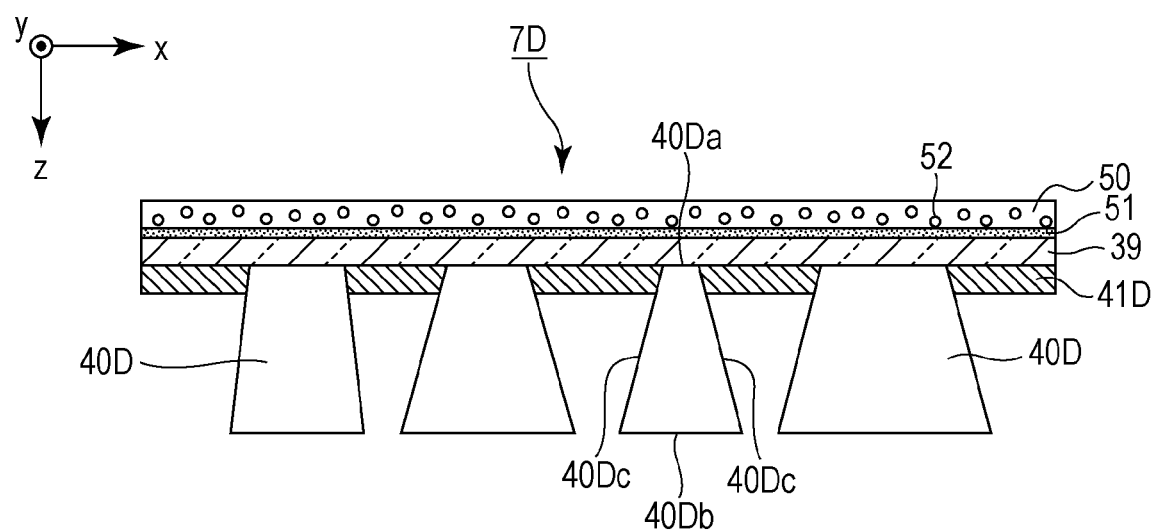
FIG. 13A is a cross-sectional view showing a viewing angle widening film in the liquid crystal display device according to the fourth embodiment of the present invention.
Figure 13B:
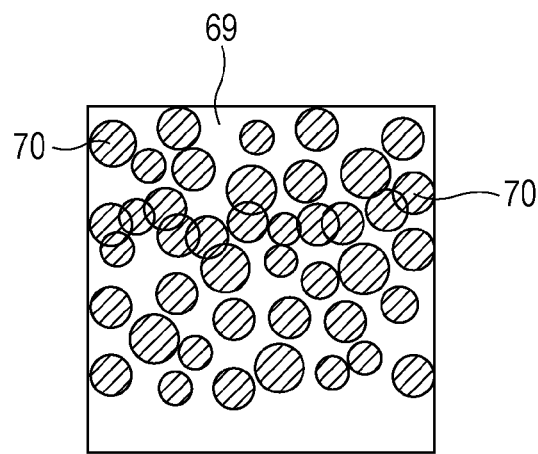
FIG. 13B is a plan view showing a photo mask used in manufacturing the viewing angle widening film of the fourth embodiment of the present invention.

FIG. 13A is a cross-sectional view of a viewing angle widening film 7D of the present embodiment. FIG. 13B is a plan view showing a photo mask used in manufacturing the viewing angle widening film.

Figure 14A:
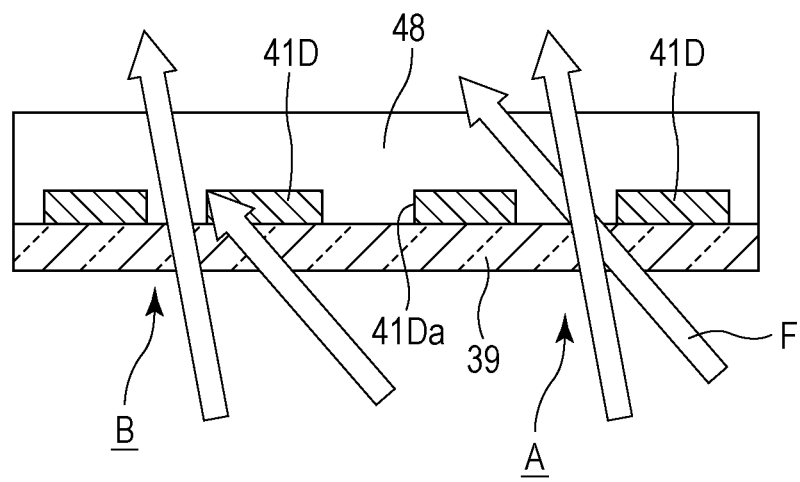
FIG. 14A is a cross-sectional view showing the operation of an exposure process of the viewing angle widening film of the fourth embodiment of the present invention.
Figure 14B:
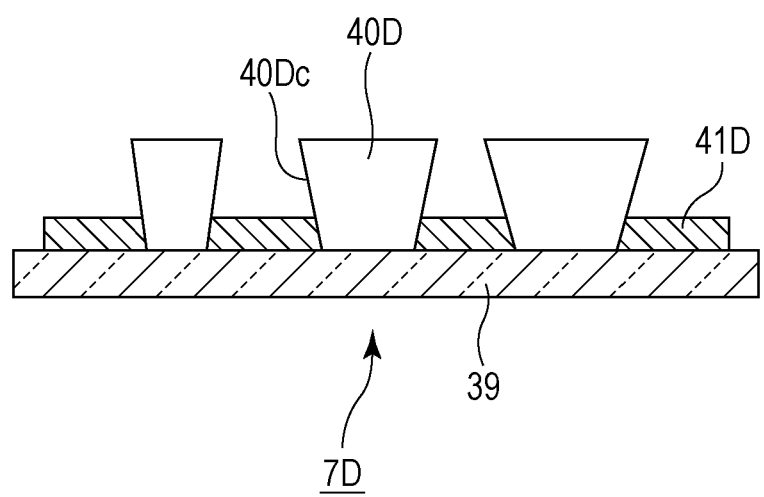
FIG. 14B is a cross-sectional view showing the operation of the exposure process of the viewing angle widening film of the fourth embodiment of the present invention.

FIGS. 14A and 14B are diagrams showing the method for manufacturing the viewing angle widening film of the present embodiment.

Further, in FIGS. 12 to 14B, the same reference numerals are given to the common components with those in the drawings used in the first embodiment, and thus detailed description thereof will be omitted.

In the first embodiment, the plurality of light diffusion sections all have the same shape. In contrast, in the viewing angle widening film 7D of the present embodiment, as shown in FIGS. 12 and 13A, in a plurality of light diffusion sections 40D, the dimensions (dimensions of the opening portions of the light shielding layer 41D) of the light emitting end surface 40Da are different, and the inclination angles of the side surfaces 40Dc are different. In other words, when all of the plurality of light diffusion sections 40D are viewed, the light emitting end surfaces 40Da of the plurality of light diffusion sections 40D have a plurality of types of dimensions, and the side surfaces 40Dc of the plurality of light diffusion sections 40D have a plurality of types of inclination angles. Further, in the plurality of light diffusion section 40D, the inclination angles of the side surfaces 40Dc are different and the dimensions of the light incident end surfaces 40Db are also different. Other configurations are the same as the first embodiment.

As shown in FIG. 13B, in the photo mask 69 used in manufacturing the light shielding layer 41, the dimensions of a plurality of shielding patterns 70 are different, the diameters are distributed in a range of 5 µm to 25 µm. If the light shielding layer 41D is formed by using the photo mask 69, the light shielding layer 41D having a plurality of opening portion of different dimensions is achieved. Thereafter, as shown in FIG. 14A, if the exposure of the coating film 48 made of a transparent negative resist is performed from the substrate 39 side by using the light shielding layer 41D as a mask, among diffusion lights F, the light incident at a large incident angle relative to the substrate 39 is less likely to be shielded by the light shielding layer 41D at locations in which the dimension of the opening portions 41Da of the light shielding layer 41D is large, as locations indicated by reference numeral A in FIG. 14A. Therefore, since the light incident at a large incident angle relative to the substrate 39 at the locations contributes to the exposure of the coating film 48, as shown in FIG. 14B, the inclination angles of the side surfaces 40Dc of the light diffusion sections 40D are steep.

On the other hand, the light incident at a large incident angle is likely to be shielded by the light shielding layer 41D at locations in which the dimensions of the opening portions 41Da of the light shielding layer 41D is small, as locations indicated by reference numeral B in FIG. 14A. Therefore, since the light incident at a large incident angle with respect to the substrate 39 at the locations does not contribute to the exposure of the coating film 48, as shown in FIG. 14B, the inclination angles of the side surfaces 40Dc of the light diffusion sections 40D are gentle.

Thus, it is possible not only to vary the dimensions of the light emitting end surfaces 40Da of the light diffusion sections 40D but also to vary the inclination angles of the side surfaces 40Dc by varying the dimensions of the opening portions 41Da of the light shielding layers 41D. Of course, as the first embodiment, the diffusion angle of the diffusion light may be changed depending on locations.

According to the liquid crystal display device 1D of the present embodiment, since the inclination angles of the side surfaces 40Dc of the plurality of light diffusion sections 40D are different from each other, it is possible to extend the range of the total reflection angle of the light by performing an interpolation between the plurality of light diffusion sections 40D having different inclination angles of the side surfaces 40Dc. As a result, since the brightness is gradually changed depending on the viewing angle when observing the liquid crystal display device 1D by changing the angle, it is possible to improve the viewing angle characteristics.

Further, in the present embodiment, since the side surfaces 40Dc of the light diffusion sections 40D have a plurality of types of inclination angles, it is preferable that the brightness changed gradually. However, the effect of improving the viewing angle characteristics can be achieved by causing the inclination angle of at least a portion of the light diffusion section to be different from the other light diffusion sections and setting only two types of inclination angles.

Fifth Embodiment

Hereinafter, a fifth embodiment of the present invention will be described using FIGS. 15 and 16.

The basic configuration of a liquid crystal display device of the present embodiment is the same as that of the first embodiment, and the shape of a light diffusion section of a viewing angle widening film is different from that of first embodiment. Therefore, in the present embodiment, the description of the basic configuration of the liquid crystal display device is omitted, and only the viewing angle widening film will be described.

Figure 15:
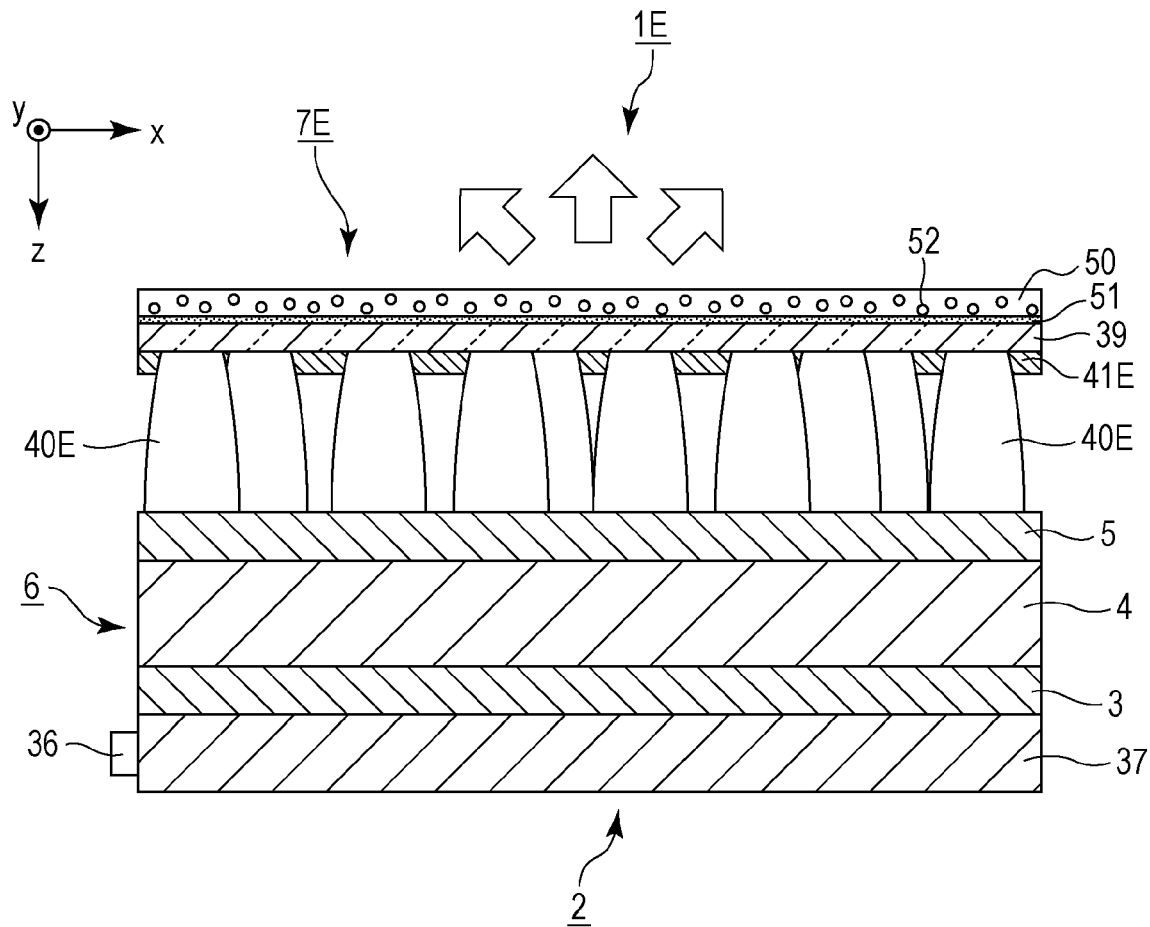
FIG. 15 is a cross-sectional view showing a liquid crystal display device of a fifth embodiment of the present invention.

FIG. 15 is a cross-sectional view showing a liquid crystal display device of the present embodiment.

Figure 16:
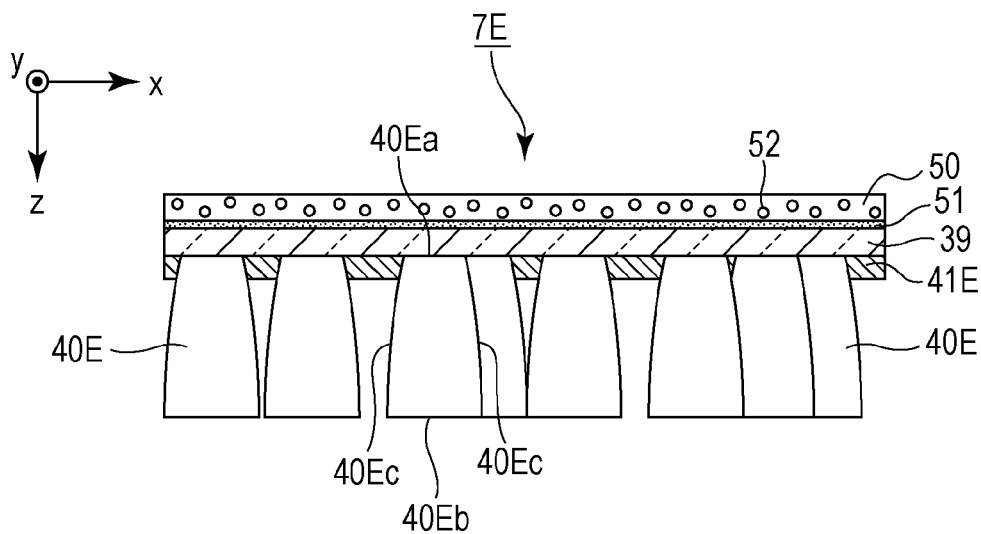
FIG. 16 is a cross-sectional view showing a viewing angle widening film in the liquid crystal display device of the fifth embodiment of the present invention.

FIG. 16 is a cross-sectional view of a viewing angle widening film of the present embodiment.

Further, in FIGS. 15 and 16, the same reference numerals are given to the common components with those in the drawings used in the first embodiment, and thus detailed description thereof will be omitted.

In the above first embodiment, when focusing on one light diffusion section, the side surface of the light diffusion section has a constant inclination angle. In contrast, in the viewing angle widening film 7E of the present embodiment, as shown in FIGS. 15 and 16, the side surface 40Ec of each light diffusion section 40E is curved gradually in a convex shape from the light emitting end surface 40Ea toward the light incident end surface 40Eb and the inclination is different depending on the location. Other configurations are the same as those of the first embodiment.

In the liquid crystal display device 1E of the present embodiment, it is possible to achieve the same effect as that of the first embodiment in which no moire occurs and thus the display quality can be maintained.

Further, if the inclination angle of the side surface of the light diffusion section is constant, when changing the viewing angle along the vertical direction or the horizontal direction of the screen, there is a case where display unevenness is observed depending on the viewing angle. As the display unevenness measures, in the fourth embodiment, the side surfaces in the entire plurality of light diffusion sections have a plurality of types of inclination angles. In contrast, in the viewing angle widening film 7E of the present embodiment, since the inclination angle of the side surface 40Ec is different depending on a location even in each light diffusion section 40E, the reflection angle distribution of light is wider as compared to a case where the inclination angle of the side surface is constant. Thus, since the brightness is gradually changed depending on the viewing angle, it is possible to improve the viewing angle characteristics.

Sixth Embodiment

Hereinafter, a sixth embodiment of the present invention will be described using FIGS. 17 to 19J.

The basic configuration of a liquid crystal display device of the present embodiment is the same as that of the first embodiment, and the shape of a light diffusion section of a viewing angle widening film is different from that of first embodiment. Therefore, in the present embodiment, the description of the basic configuration of the liquid crystal display device is omitted, and only the viewing angle widening film will be described.

Figure 17:
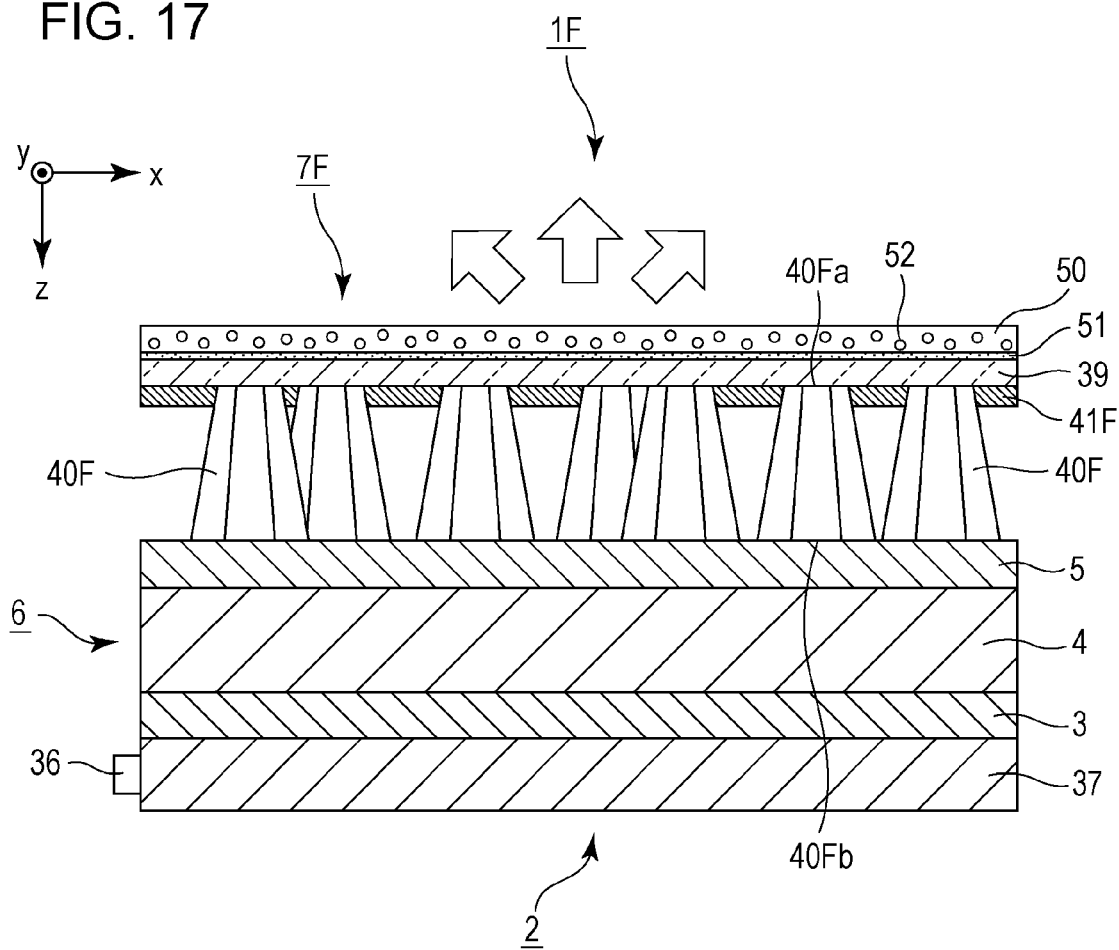
FIG. 17 is a cross-sectional view showing a liquid crystal display device of a sixth embodiment of the present invention.

FIG. 17 is a cross-sectional view showing a liquid crystal display device of the present embodiment.

Figure 18:
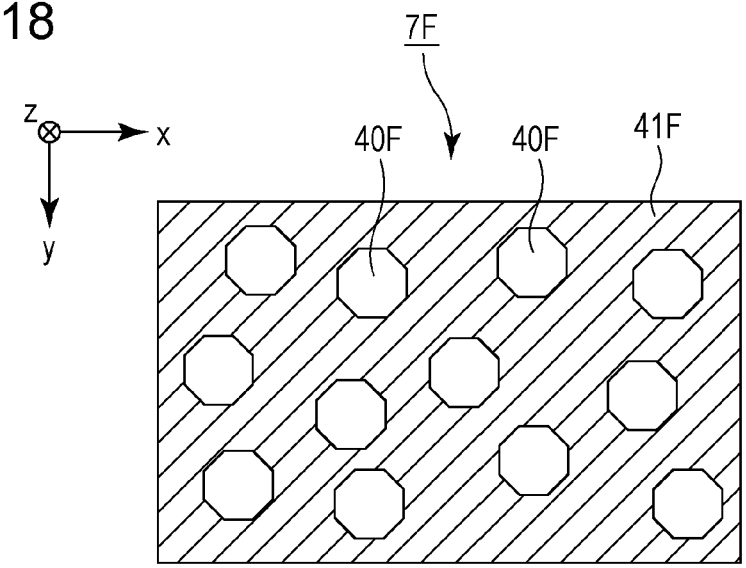
FIG. 18 is a plan view showing a viewing angle widening film in the liquid crystal display device of the sixth embodiment of the present invention.

FIG. 18 is a plan view showing a viewing angle widening film of the present embodiment.

Further, in FIGS. 17 and 18, the same reference numerals are given to the common components with those in the drawings used in the first embodiment, and thus detailed description thereof will be omitted.

In the first embodiment, each light diffusion section of the light diffusion sections has an approximately truncated cone shape, and both the planar shapes of the light incident end surface and the light emitting end surface are circle. In contrast, in the viewing angle widening film 7F of the present embodiment, as shown in FIGS. 17 and 18, each light diffusion section 40F has an octagonal truncated pyramid shape, and the planar shapes of the light incident end surface 40Fb and the light emitting end surface 40Fa are octagonal. Among eight sides of the octagon which is the planar shape of each light diffusion section 40F, the sides of four sets each of which is composed of two mutually parallel sides are arranged so as to oppose each of the direction parallel to the x-axis, the direction parallel to the y-axis, the direction forming an angle of 45 degree relative to the x-axis (the angle as viewed in the counter-clockwise relative to the positive direction of the x-axis), and the direction forming an angle of 135 degree relative to the x-axis. Other configurations are the same as those of first embodiment. In manufacturing the viewing angle widening film 7F configured as described above, the photo mask having an octagonal shielding pattern may be used in the formation process of a light shielding layer 41F.

Even in the liquid crystal display device 1F of the present embodiment, it is possible to achieve the same effect as that of the first embodiment in which no moire occurs and thus the display quality can be maintained.

Further, according to the first embodiment, since the planar shape of the light diffusion section is circular, the light is diffused to all orientations centered on the normal direction of the liquid crystal display body 6, and the viewing angle expansion effect is exhibited in all directions. In contrast, according to the present embodiment, since the planar shape of the light diffusion section 40F is octagonal and the four sides described above respectively face the direction parallel to the x-axis, the direction parallel to the y-axis, the direction forming an angle of 45 degree relative to the x-axis, and the direction forming an angle of 135 degree relative to the x-axis, the light is diffused with focused on the above four orientations. Therefore, the viewing angle widening effect is exhibited in the horizontal direction, the vertical direction and the oblique direction of the screen in which viewing angle characteristics are particularly important in the liquid crystal display device. Further, the planar shape of the light diffusion section 40F is not limited to be octagonal, and it is possible to adopt other polygons. In this case, since the light is diffused with concentration on a specific direction depending on the arrangement of the polygonal shape and sides, it is possible to provide a liquid crystal display device exhibiting a viewing angle expansion effect excellent in a specific observation orientation.

Figure 19A:
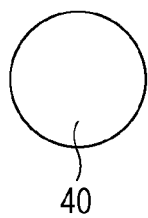
FIG. 19A is a plan view showing another example of a light diffusion section of the viewing angle widening film of the sixth embodiment of the present invention.
Figure 19B:
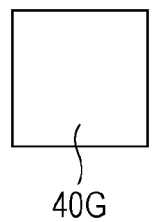
FIG. 19B is a plan view showing another example of the light diffusion section of the viewing angle widening film of the sixth embodiment of the present invention.
Figure 19C:
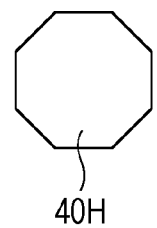
FIG. 19C is a plan view showing another example of the light diffusion section of the viewing angle widening film of the sixth embodiment of the present invention.
Figure 19D:
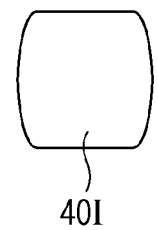
FIG. 19D is a plan view showing another example of the light diffusion section of the viewing angle widening film of the sixth embodiment of the present invention.
Figure 19E:
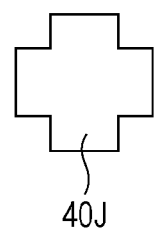
FIG. 19E is a plan view showing another example of the light diffusion section of the viewing angle widening film of the sixth embodiment of the present invention.
Figure 19F:
FIG. 19F is a plan view showing another example of the light diffusion section of the viewing angle widening film of the sixth embodiment of the present invention.
Figure 19G:
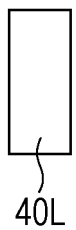
FIG. 19G is a plan view showing another example of the light diffusion section of the viewing angle widening film of the sixth embodiment of the present invention.
Figure 19H:
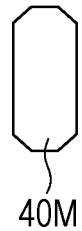
FIG. 19H is a plan view showing another example of the light diffusion section of the viewing angle widening film of the sixth embodiment of the present invention.
Figure 19I:
FIG. 19I is a plan view showing another example of the light diffusion section of the viewing angle widening film of the sixth embodiment of the present invention.
Figure 19J:
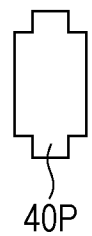
FIG. 19J is a plan view showing another example of the light diffusion section of the viewing angle widening film of the sixth embodiment of the present invention.

Further, although an example of the light diffusion section 40 of which the planar shape is circular is shown in the first embodiment as shown in FIG. 19A, for example, as shown in FIG. 19B, the light diffusion section 40G of which the planar shape is a square may be used. Alternatively, as shown in FIG. 19C, the light diffusion section 40H of which the planar shape is a regular octagon may be used. Alternatively, as shown in FIG. 19D, the light diffusion section 40I of the shape in which two opposing sides of the square are curved outwards may be used. Alternatively, as shown in FIG. 19E, the light diffusion section 40J of the shape in which two rectangles are crossed in two directions perpendicular to each other may be used. Alternatively, as shown in FIG. 19F, the light diffusion section 40K of the shape of an elongated oval may be used. Alternatively, as shown in FIG. 19G, the light diffusion section 40L of the shape of an elongated rectangle may be used. Alternatively, as shown in FIG. 19H, the light diffusion section 40M of the shape of an elongated octagon may be used. Alternatively, as shown in FIG. 19I, the light diffusion section 40N of the shape in which two opposing sides of the elongated rectangle are curved outwards may be used. Alternatively, as shown in FIG. 19J, the light diffusion section 40P of the shape in which two rectangles of different aspect ratios are crossed in two directions perpendicular to each other may be used. Further, the shapes of FIGS. 19A to 19J may be rotated in a plurality of directions.

For example, in the light diffusion section 40G of the square shape shown in FIG. 19B, light is diffused in the direction perpendicular to each side of the square. Further, in the light diffusion section 40L of the rectangle shape shown in FIG. 19G, the diffusion of light in the direction perpendicular to the long side is stronger than the diffusion of light in the direction perpendicular to the short side. Therefore, it is possible to realize a viewing angle widening film in which the strength of the diffusion of light varies depending on the length of the side in the vertical direction (up-down direction) and the horizontal direction (left-right direction). In this manner, in a case where the anisotropy of the viewing angle is required, different light diffusion characteristics can be obtained by appropriately changing the shape of the light shielding portion.

Seventh Embodiment

Hereinafter, a seventh embodiment of the present invention will be described using FIGS. 20A to 22J.

The basic configuration of a liquid crystal display device of the present embodiment is the same as that of the first embodiment, and the configurations of a light diffusion section and a light shielding layer of a viewing angle widening film is different from those of first embodiment. Therefore, in the present embodiment, the description of the basic configuration of the liquid crystal display device is omitted, and only the viewing angle widening film will be described.

Figure 20A:
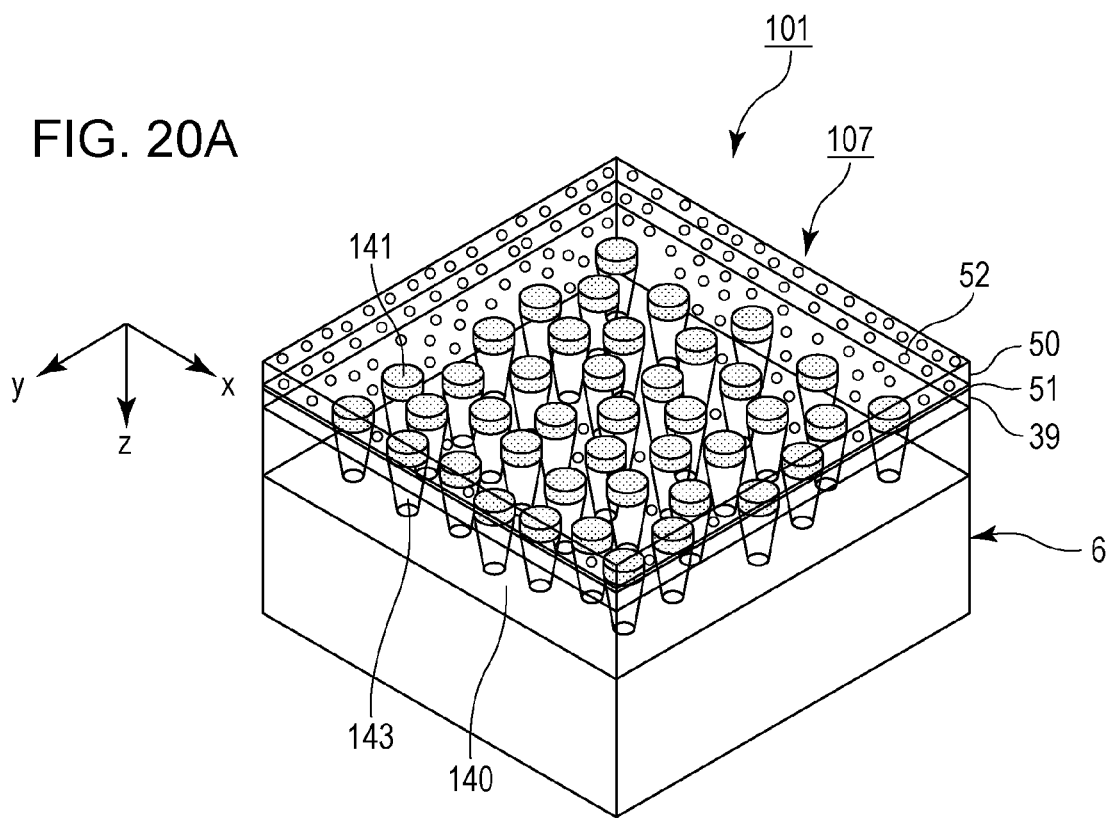
FIG. 20A is a perspective view showing a liquid crystal display device of a seventh embodiment of the present invention.
Figure 20B:
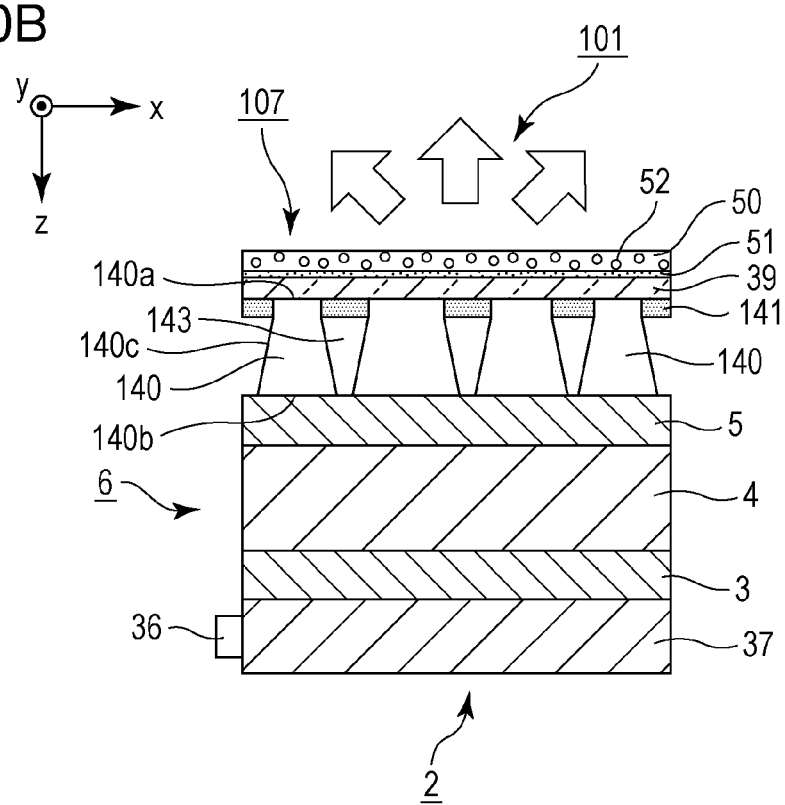
FIG. 20B is a cross-sectional view showing the liquid crystal display device of the seventh embodiment of the present invention.

FIGS. 20A and 20B are schematic diagrams showing a liquid crystal display device of the present embodiment. FIG. 20A is a perspective view of a liquid crystal display device 101 of the present embodiment. FIG. 20B is a cross-sectional view of the liquid crystal display device 101 of the present embodiment.

FIGS. 21A to 21E are cross-sectional views showing a manufacturing process of the viewing angle widening film.

Figure 21A:
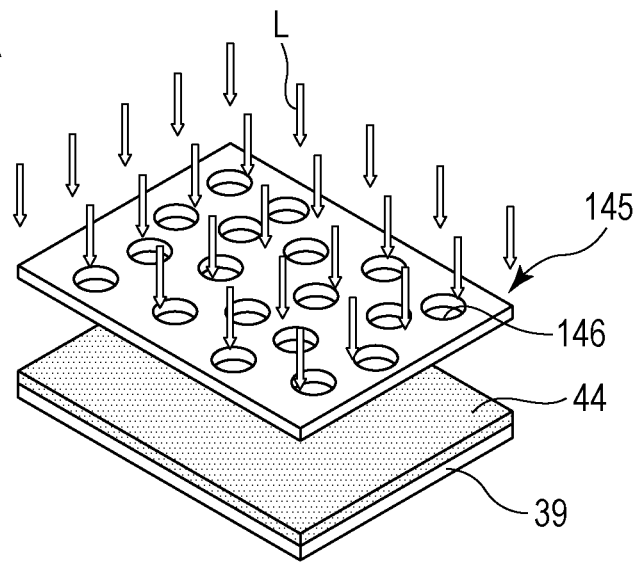
FIG. 21A is a perspective view showing a manufacturing process of a viewing angle widening film of the liquid crystal display device of the seventh embodiment of the present invention.
Figure 21B:
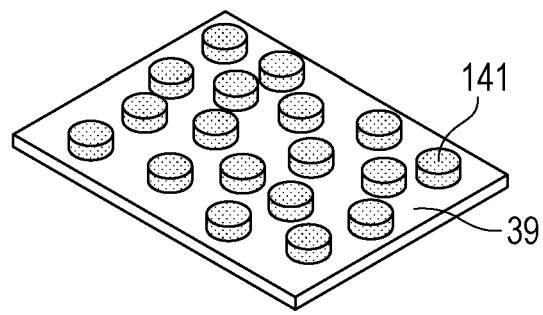
FIG. 21B is a perspective view showing the manufacturing process of the viewing angle widening film of the liquid crystal display device of the seventh embodiment of the present invention.
Figure 21C:
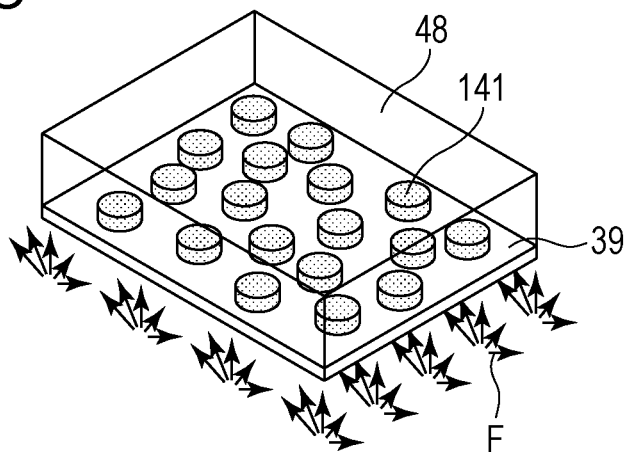
FIG. 21C is a perspective view showing the manufacturing process of the viewing angle widening film of the liquid crystal display device of the seventh embodiment of the present invention.
Figure 21D:
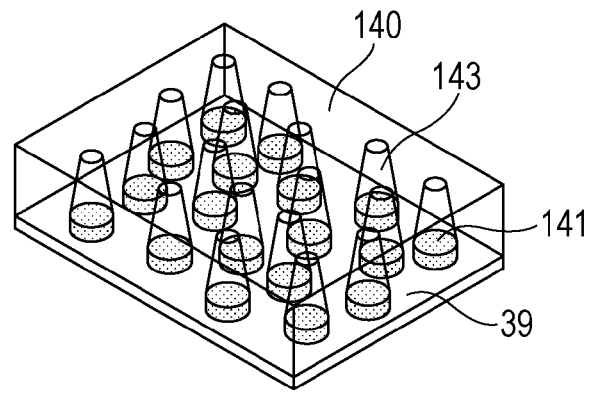
FIG. 21D is a perspective view showing the manufacturing process of the viewing angle widening film of the liquid crystal display device of the seventh embodiment of the present invention.
Figure 21E:
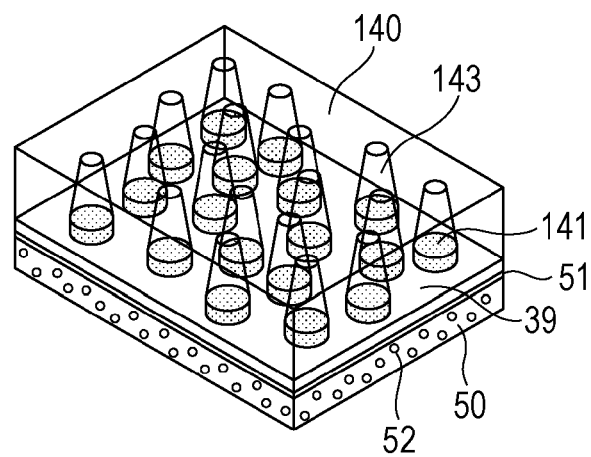
FIG. 21E is a perspective view showing the manufacturing process of the viewing angle widening film of the liquid crystal display device of the seventh embodiment of the present invention.

In FIGS. 20 to 21E, the same reference numerals are given to the common components with those in the drawings used in the first embodiment, and thus detailed description thereof will be omitted.

The viewing angle widening film 7 of the first embodiment includes a plurality of light diffusion sections 40 formed on the one surface of the substrate 39, and a light shielding layer 41 formed in a region other than the formation regions of the light diffusion sections 40 in the one surface of the substrate 39, a plurality of light diffusion sections 40 are scattered and disposed as viewed from the normal direction of one surface of the substrate 39, the light shielding layer 41 has been formed continuously in a region other than the formation regions of the light diffusion sections 40. In contrast, a viewing angle widening film 107 of the present embodiment includes a plurality of light shielding layers 141 formed on the one surface of the substrate 39, and a light diffusion section 140 formed in a region other than the formation regions of the light shielding layers 141 in the one surface of the substrate 39, a plurality of light shielding layers 141 are scattered and disposed as viewed from the normal direction of one surface of the substrate 39, the light diffusion section 140 is continuously formed in a region other than the formation regions of the light shielding layers 141.

A plurality of light shielding layers 141 are scattered and disposed on the substrate 39 so as to be randomly (non-periodically) disposed. In contrast, a plurality of hollow portions 143 formed at the same positions as the plurality of light shielding layers 141 are also randomly arranged on the substrate 39.

In the present embodiment, the planar shape of each light shielding layer 141 is circular when viewed from the normal direction of the substrate 39. The diameter of each light shielding layer 141 is, for example, 10 μm. The plurality of light shielding layers 141 all have the same diameter. The plurality of light shielding layers 141 are scattered and formed on the substrate 39, thereby the light diffusion section 140 of the present embodiment to be continuously formed on the substrate 39.

Hollow portions 143, having a shape of which the cross-sectional area when it is cut along a plane parallel to one surface of the substrate 39 is large on the light shielding layer 141 side and the cross-sectional area gradually reduces (decreased) as being away from the light shielding layer 141, are formed in the formation regions of the light shielding layers 141 in the viewing angle widening film 107. In other words, the hollow portion 143 has a shape of a substantially truncated cone shape of a so-called forward tapered shape when it is viewed from the substrate 39 side. Air is present in the inside of the hollow portion 143. Portions other than the hollow portions 143 of the viewing angle widening film 107, that is, portions in which the light diffusion sections 140 are present continuously, are portions that contribute to the transmission of light. While the light incident on the light diffusion section 140 is totally reflected on the interface between the light diffusion section 140 and the hollow portion 143, is guided to the inside of the light diffusion section 140 with being almost confined, and emitted to the outside through the substrate 39.

In the case of the present embodiment, since air is present in the hollow portion 143, assuming that the light diffusion section 140 is made of, for example, a transparent resin, the side surface 140c of the light diffusion section 140 becomes an interface between the transparent resin and air. Here, the refractive index difference at the interface between the outside and the inside of the light diffusion section 140 is larger when the hollow portion 143 is filled with air as compared to a case where the surroundings of the light diffusion section 140 is filled with other common low refractive index materials. Therefore, by Snell's law, an incident angle range in which light is totally reflected on the side surface 140c of the light diffusion section 140 is wide. As a result, loss of light is further suppressed and it is possible to obtain a high brightness.

Further, instead of air, an inert gas such as nitrogen may also be filled in the hollow portions 143. Alternatively, the interior of the hollow portions 143 may be a vacuum.

Next, a method for manufacturing the liquid crystal display device 101 configured as described above will be described using FIGS. 21A to 21E.

Hereinafter, the description will be given focusing on the manufacturing process of the viewing angle widening film 107.

First, as shown in FIG. 21A, a substrate 39 of polyethylene terephthalate of a thickness of 100 µm in 10 cm square is prepared, and black negative resists containing carbon as a light shielding layer material is applied on one surface of the substrate 39 by using the spin coating method to form a coating film 44 having a film thickness of 150 nm.

Next, the substrate 39 having the above coating film 44 formed is placed on a hot plate and the coating film is pre-baked at a temperature of 90° C. Thus, the solvent in the black negative resist is volatilized.

Next, using an exposure apparatus, exposure is performed by the coating film 44 being irradiated with the light E through the photo mask 145 having a plurality of opening patterns 146 in a circular planar shape provided therein. At this time, an exposure apparatus using a mixed ray of an i ray of a wavelength of 365 nm, an h ray of a wavelength of 404 nm, and a g ray of a wavelength of 436 nm is used. The exposure amount is 100 mJ/cm$^2$.

As shown in FIG. 21A, the photo mask 145 used in forming the light shielding layers 141 has a plurality of circular opening patterns 146 which are randomly arranged. In designing the photo mask 145, first, the opening patterns 146 are arranged regularly at a constant pitch, and subsequently, the reference position data such as, for example, the center point of each opening pattern 146 is made to fluctuated and the positions of the opening patterns 146 are made to vary using a random function, thereby allowing the photo mask 145 having a plurality of opening patterns 146 randomly arranged for manufacturing.

It is desirable that the average distance of the opening patterns 146 be smaller than the distance (pitch) of the pixels of the liquid crystal panel 4. Thus, at least one light shielding layer 141 is formed in the pixel, so it is possible to achieve a wide viewing angle when combined with, for example, a liquid crystal panel having a small pixel pitch used in a mobile device.

After exposure is performed using the above photo mask 145, a coating film 44 made of black negative resists is developed using a designated developing solution and dried at 100° C., and thus as shown in FIG. 21B, a plurality of light shielding layers 141 of a circular planar shape are formed on the one surface of the substrate 39. In the case of the present embodiment, in the next process, the transparent negative resist is exposed by using the light shielding layers 141 made of black negative resists as a mask to form the hollow portions 143. Therefore, the positions of the opening patterns 146 of the photo mask 145 correspond to the formation positions of the hollow portions 143. The light shielding layers 141 of a circular shape correspond to non-formation regions (hollow portions 143) of the light diffusion section 140 in the next process. The plurality of opening patterns 146 are all circular pattern with a diameter of 10 µm.

Further, although the light shielding layers 141 are formed by the photolithography method using the black negative resist in the present embodiment, instead of this configuration, if a photo mask is used in which the opening pattern 146 and the shielding pattern of the present embodiment are reversed, it is possible to use a positive resist having a light absorbing property. Alternatively, light shielding layers 141 subjected to patterning using a vapor deposition method, a printing method, or the like may be directly formed.

Next, as shown in FIG. 21C, a transparent negative resist made of acrylic resins as materials of the light transmission section is applied on the upper surfaces of the light shielding layers 141 by using the spin coating method to form a coating film 48 having a film thickness of 25 µm. Next, the substrate 39 having the above coating film 48 formed is placed on a hot plate and the coating film 48 is pre-baked at a temperature of 95° C. Thus, the solvent in the transparent negative resist is volatilized.

Next, exposure is performed by the coating film 48 being irradiated with the diffusion light F by using the light shielding layers 141 as a mask from the substrate 39 side. At this time, an exposure apparatus using a mixed ray of an i ray of a wavelength of 365 nm, an h ray of a wavelength of 404 nm, and a g ray of a wavelength of 436 nm is used. The exposure amount is 600 mJ/cm$^2$. In the exposure process, parallel light or diffusion light is used. Further, as means for irradiating the substrate 39 with the parallel light emitted from the exposure apparatus as the diffusion light F, a diffusing plate of about 50 haze may be disposed on the light path of the light emitted from the exposure apparatus. By performing the exposure using the diffusion light F, the coating film 48 is exposed radially so as to spread outwardly from the non-formation regions of the light shielding layers 141. Thus, the hollow portions 143 of a forward tapered shape are formed, and side surfaces of an inversely tapered shape are formed in portions facing the hollow portions 143 of the light diffusion section 140.

Thereafter, the substrate 39 having the above coating film 48 formed is placed on a hot plate and the post-exposure bake (PEB) of the coating film 48 is performed at a temperature of 95° C.

Next, the coating film 48 made of a transparent negative resist is developed using a designated developing solution and post-baked at 100° C. to form light diffusion sections 140 having a plurality of hollow portions 143 on one surface of the substrate 39 as shown in FIG. 21D.

Next, as shown in FIG. 21E, a diffusion film 50 made by dispersing a large number of light scattering bodies 52 such as acrylic beads inside a binder resin such as acrylic resins is disposed on the other surface of the substrate 39 through the adhesive layer 51.

Through the above process, the viewing angle widening film 107 of the present embodiment is completed. The total light transmittance of the viewing angle widening film 107 is preferably 90% or more. If the total light transmittance is 90% or more, the sufficient transparency is achieved, and the sufficient optical performance required for viewing angle widening film 107 is exhibited. The total light transmittance is due to the provision of JIS K7361-1.

Further, although a liquid resist is applied in forming the light shielding layers 141 and the light diffusion section 140 in the above example, instead of this configuration, a film-like resist may be affixed to one surface of the substrate 39.

Finally, as shown in FIG. 20B, in a state where the substrate 39 faces the viewing side and the light diffusion section 140 is opposed to the second polarizing plate 5, the viewing angle widening film 107 that has been completed is affixed to the liquid crystal display body 6 using an optical adhesive, or the like.

Through the above process, the liquid crystal display device 101 of the present embodiment is completed.

Even in the liquid crystal display device 101 of the present embodiment, it is possible to achieve the same effects as those of the first embodiment in which the viewing angle widening film capable of exhibiting a desired light diffusion property can be manufactured without complicating manufacturing processes.

Further, according to the configuration, the plurality of light shielding layers 141 are disposed randomly in a plane, so moire caused by interference between the pixels of the liquid crystal panel 4 does not occur and thus the display quality can be maintained.

Further, according to the configuration, the plurality of hollow portions 143 provided in the viewing angle widening film 107 are isolated, and portions serving as the light diffusion sections 140 have a shape that is continuous in the plane. Thus, for example, even if the volume of the light diffusion section 140 is reduced by increasing the density of the hollow portions 143 in order to increase the degree of diffusion of light, the contact area between the light diffusion section 140 and the substrate 39 can be sufficiently ensured, so the adhesive force between the substrate 39 and the light diffusion section 140 is strong. Therefore, defects of the light diffusion section 140 caused by an external force or the like hardly occurs and desired light diffusion function can be performed.

Further, since light F is irradiated from the back surface side of the substrate 39 to the transparent resin layer by using the light shielding layer 140 as a mask, the light diffusion sections 140 are formed in the non-formation region of the light shielding layer 141 in a state of being self-aligned. As a result, it is possible to reliably maintain the light transmittance without the light diffusion section 140 and the light shielding layers 141 being overlapped. Further, since precise alignment operation is not required, it is possible to shorten the time required for manufacturing.

Further, according to the configuration, since the volume of each hollow portion 143 is the same, the volume of the resin to be removed in developing the transparent resin layer is constant. Therefore, in the process of manufacturing each hollow portion 143, the developing speed of each hollow portion 143 is constant, and a desired tapered shape can be formed. As a result, the uniformity of the fine shape of the viewing angle widening film 107 is increased, and the yield is improved.

Figure 22A:
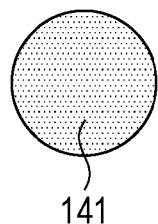
FIG. 22A is a plan view showing another example of a light shielding layer of the viewing angle widening film of the seventh embodiment of the present invention.
Figure 22B:
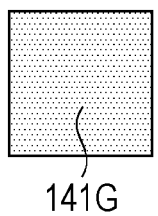
FIG. 22B is a plan view showing another example of the light shielding layer of the viewing angle widening film of the seventh embodiment of the present invention.
Figure 22C:
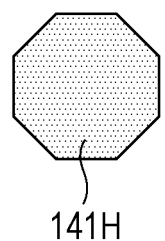
FIG. 22C is a plan view showing another example of the light shielding layer of the viewing angle widening film of the seventh embodiment of the present invention.
Figure 22D:
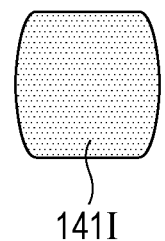
FIG. 22D is a plan view showing another example of the light shielding layer of the viewing angle widening film of the seventh embodiment of the present invention.
Figure 22E:
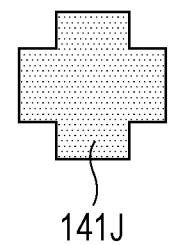
FIG. 22E is a plan view showing another example of the light shielding layer of the viewing angle widening film of the seventh embodiment of the present invention.
Figure 22F:
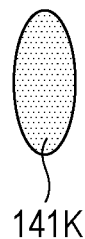
FIG. 22F is a plan view showing another example of the light shielding layer of the viewing angle widening film of the seventh embodiment of the present invention.
Figure 22G:
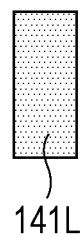
FIG. 22G is a plan view showing another example of the light shielding layer of the viewing angle widening film of the seventh embodiment of the present invention.
Figure 22H:
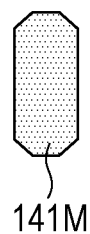
FIG. 22H is a plan view showing another example of the light shielding layer of the viewing angle widening film of the seventh embodiment of the present invention.
Figure 22I:
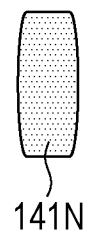
FIG. 22I is a plan view showing another example of the light shielding layer of the viewing angle widening film of the seventh embodiment of the present invention.
Figure 22J:
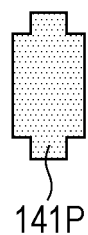
FIG. 22J is a plan view showing another example of the light shielding layer of the viewing angle widening film of the seventh embodiment of the present invention.

Further, although an example of the light shielding layer 141 of which the planar shape is circular is shown in the present embodiment as shown in FIG. 22A, for example, as shown in FIG. 22B, the light shielding layer 141G of which the planar shape is a square may be used. Alternatively, as shown in FIG. 22C, the light shielding layer 141H of which the planar shape is a regular octagon may be used. Alternatively, as shown in FIG. 22D, the light shielding layer 141I of the shape in which two opposing sides of the square are curved outwards may be used. Alternatively, as shown in FIG. 22E, the light shielding layer 141J of the shape in which two rectangles are crossed in two directions perpendicular to each other may be used. Alternatively, as shown in FIG. 22F, the light shielding layer 141K of the shape of an elongated oval may be used. Alternatively, as shown in FIG. 22G, the light shielding layer 141L of the shape of an elongated rectangle may be used. Alternatively, as shown in FIG. 22H, the light shielding layer 141M of the shape of an elongated octagon may be used. Alternatively, as shown in FIG. 22I, the light shielding layer 141N of the shape in which two opposing sides of the elongated rectangle are curved outwards may be used. Alternatively, as shown in FIG. 22J, the light shielding layer 141P of the shape in which two rectangles of different aspect ratios are crossed in two directions perpendicular to each other may be used. Further, the shapes of FIGS. 22A to 22J may be rotated in a plurality of directions.

Since the planar shape of the light shielding layer 141 of the present embodiment is circular as shown in FIG. 22A, the side surface 140c of the light diffusion section 140, that is, the cross-sectional shape of the reflective surface is also circular. Therefore, the light reflected on the side surface 140c of the light diffusion section 140 is diffused toward the orientation of 360 degree, all orientations. In contrast, for example, in the light shielding layer 141G of the square shape shown in FIG. 22B, light is diffused in the direction perpendicular to each side of the square. Further, in the light shielding layer 141L of the rectangle shape shown in FIG. 22G, the diffusion of light in the direction perpendicular to the long side is stronger than the diffusion of light in the direction perpendicular to the short side. Therefore, it is possible to realize a light diffusion sheet in which the strength of the diffusion of light varies depending on the length of the side in the vertical direction (up-down direction) and the horizontal direction (left-right direction). Further, in the light shielding layer 141H of the octagonal shape shown in FIG. 22C, light can be diffused with concentration in the vertical direction, the horizontal direction, and the oblique 45-degree direction in which the viewing angle characteristics are important in the liquid crystal display device. In this manner, in a case where the anisotropy of the viewing angle is required, different light diffusion characteristics can be obtained by appropriately changing the shape of the light shielding portion.

First Modification Example of the Seventh Embodiment

Figure 23A:
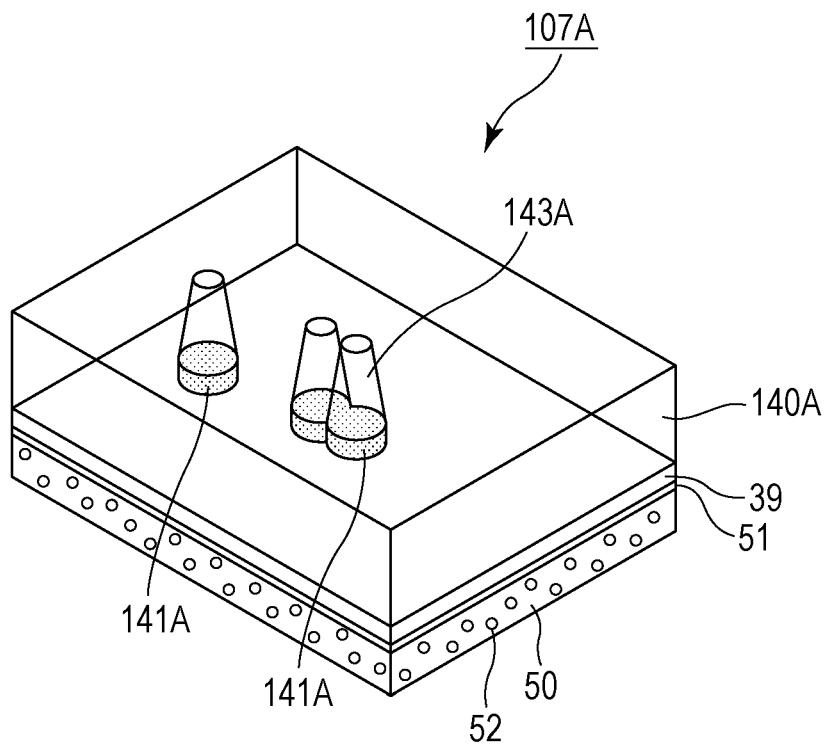
FIG. 23A is a perspective view showing a first modification example of the viewing angle widening film of the seventh embodiment of the present invention.
Figure 23B:
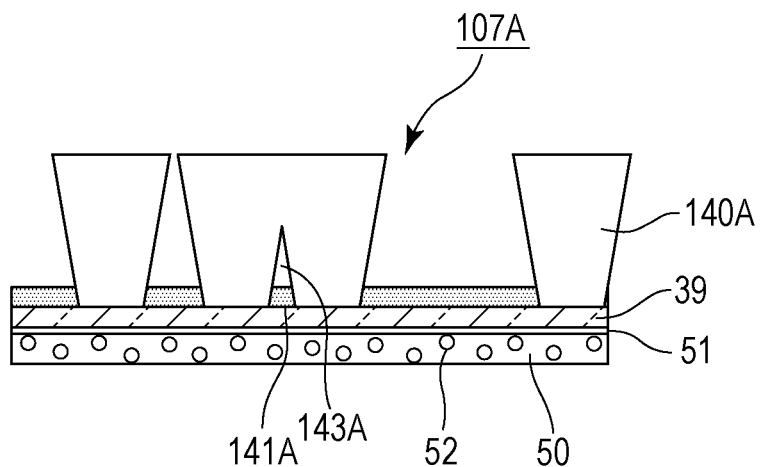
FIG. 23B is a cross-sectional view showing the first modification example of the viewing angle widening film of the seventh embodiment of the present invention.

FIGS. 23A and 23B are schematic diagrams showing a first modification example of the viewing angle widening film of the above embodiment. FIG. 23A is a perspective view of a viewing angle widening film 107A of the present modification example. FIG. 23B is a cross-sectional view of a viewing angle widening film 107A of the present modification example.

Although the plurality of light shielding layers 141 are respectively formed on the one surface of the substrate 39 in the above embodiment, as the viewing angle widening film 107A shown in FIGS. 23A and 23B, at least a portion of the plurality of light shielding layers 141A may be connected. The present modification example has a configuration in which two adjacent light shielding layers 141A are connected, and a portion of the hollow portions 143A formed in the formation region of the connected light shielding layers 141A are also connected. Further, as shown in FIG. 23B, the hollow portions 143A may be shielded by the light diffusion section 140A.

Even in the configuration, since the contact area between the light diffusion section 140A and the substrate 39 can be sufficiently ensured, the adhesive force between the light diffusion section 140A and the substrate 39 is strong. Further, if the light diffusion sections 140A are connected, the proportion of the light absorbed in the light shielding layer 141A to the light incident on the viewing angle widening film 107A is reduced, the use efficiency of light is improved.

Eighth Embodiment

Hereinafter, an eighth embodiment of the present invention will be described using FIGS. 24A to 25E.

The basic configuration of a liquid crystal display device of the present embodiment is the same as that of the seventh embodiment, but is different from the seventh embodiment in that light scattering bodies are included in a substrate. Therefore, in the present embodiment, the description of the basic configuration of the liquid crystal display device is omitted, and only the viewing angle widening film will be described.

Figure 24A:
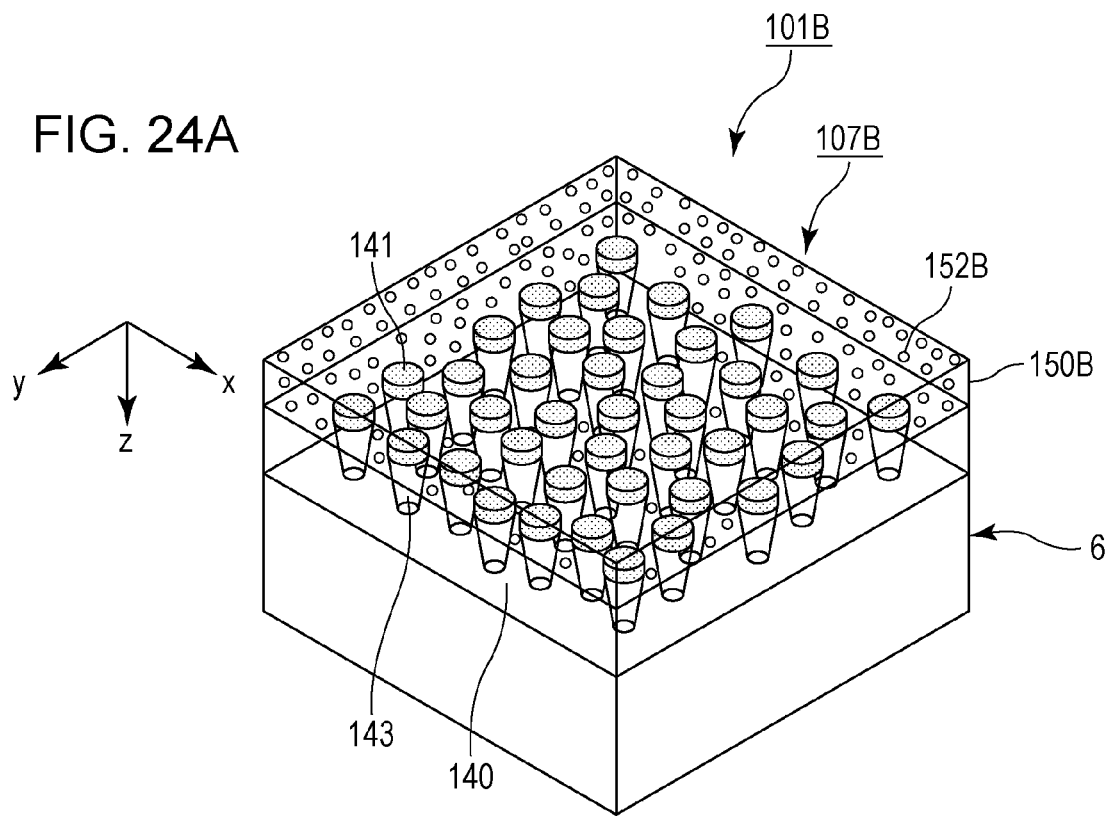
FIG. 24A is a perspective view showing a liquid crystal display device of an eighth embodiment of the present invention.
Figure 24B:
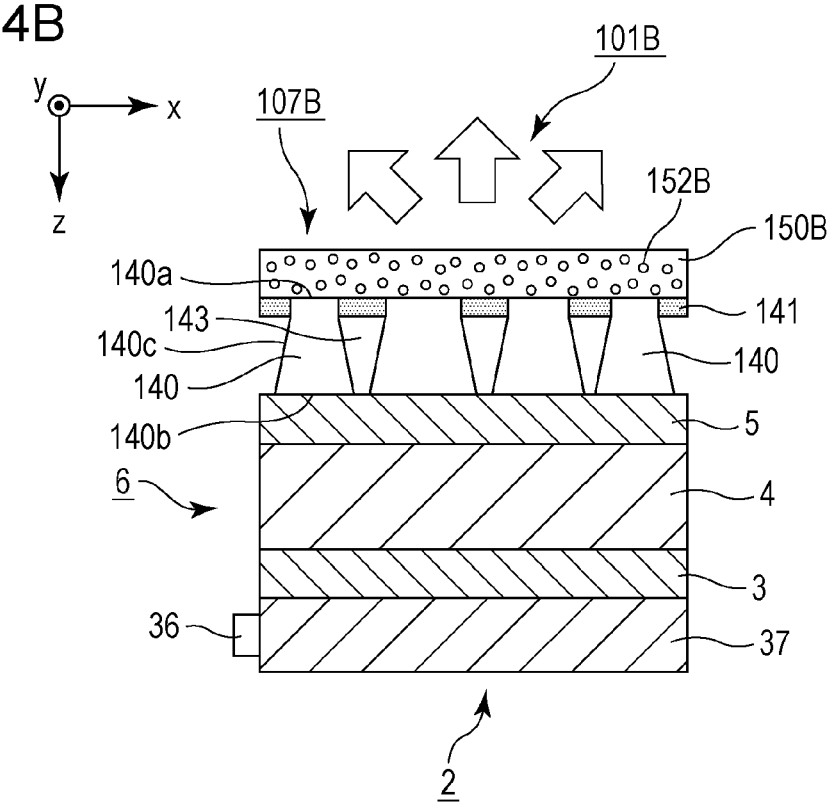
FIG. 24B is a cross-sectional view showing the liquid crystal display device of the eighth embodiment of the present invention.

FIGS. 24A and 24B are schematic diagrams showing a liquid crystal display device of the present embodiment. FIG. 24A is a perspective view of a liquid crystal display device 101B of the present embodiment. FIG. 24B is a cross-sectional view of the liquid crystal display device 101B of the present embodiment.

FIGS. 25A to 25E are cross-sectional views showing the viewing angle widening film according to the manufacturing process sequence.

In FIGS. 24A to 25E, the same reference numerals are given to the common components with those in the drawings used in the seventh embodiment, and thus detailed description thereof will be omitted.

The diffusion film 50 is disposed on the other surface (the surface on the viewing side) of the substrate 39 in the seventh embodiment. In contrast, in the viewing angle widening film 107B of the present embodiment, as shown in FIGS. 24A and 24B, the diffusion film is not disposed in the substrate, and the substrate itself functions as the diffusion film. In other words, a large number of light scattering bodies 152B are dispersed in the inside of the substrate 150B.

Figure 25A:
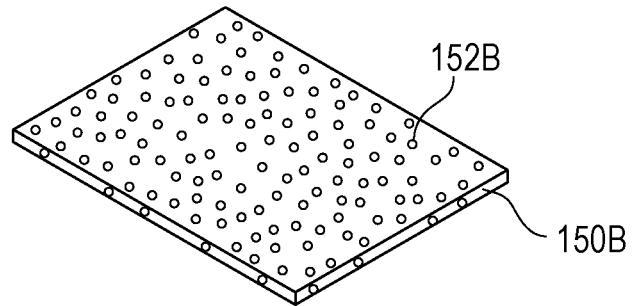
FIG. 25A is a perspective view showing a manufacturing process of a viewing angle widening film of the liquid crystal display device of the eighth embodiment of the present invention.

In the manufacturing process of the viewing angle widening film 107B of the present embodiment, first, as shown in FIG. 25A, a substrate 150B is prepared in the inside of which a large number of light scattering bodies 152B are dispersed.

Figure 25B:
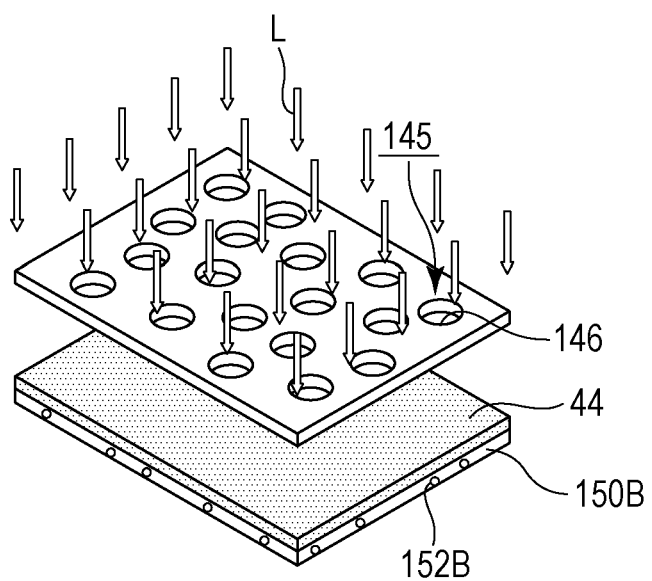
FIG. 25B is a perspective view showing the manufacturing process of the viewing angle widening film of the liquid crystal display device of the eighth embodiment of the present invention.

Next, as shown in FIG. 25B, black negative resists containing carbon as a light shielding layer material is applied on one surface of the substrate 150B by using a spin coating method to form a coating film 44. Next, the substrate 39 having the above coating film 44 formed is placed on a hot plate and the coating film is pre-baked.

Next, using an exposure apparatus, exposure is performed by the coating film 44 being irradiated with the light E through the photo mask 145 having a plurality of opening patterns 146 provided therein.

Figure 25C:
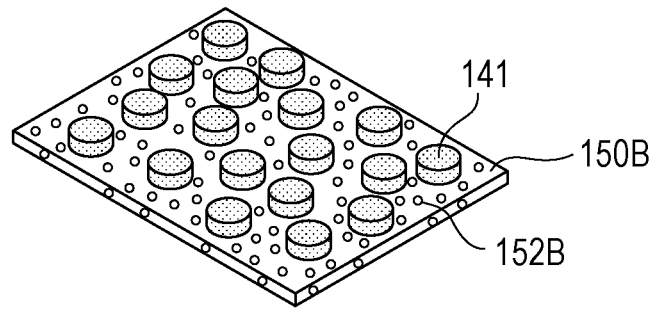
FIG. 25C is a perspective view showing the manufacturing process of the viewing angle widening film of the liquid crystal display device of the eighth embodiment of the present invention.

After the exposure is performed using the above photo mask 145, a coating film 44 made of black negative resists is developed using a designated developing solution and dried, and thus as shown in FIG. 25C, a plurality of light shielding layers 141 having a circular planar shape are formed on the one surface of the substrate 150B.

Figure 25D:
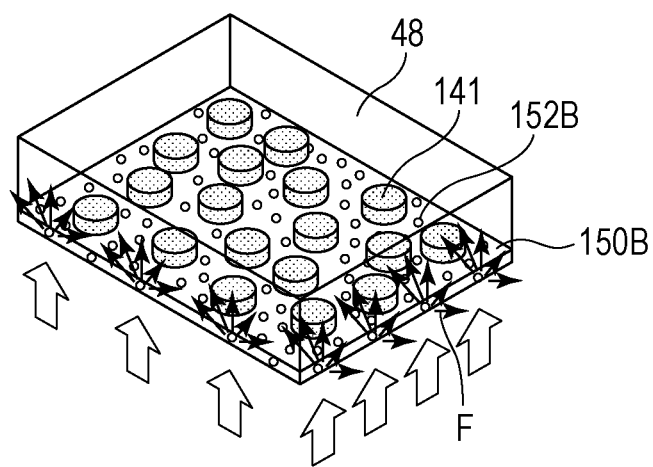
FIG. 25D is a perspective view showing the manufacturing process of the viewing angle widening film of the liquid crystal display device of the eighth embodiment of the present invention.

Next, as shown in FIG. 25D, a transparent negative resist made of acrylic resins as a light diffusion section material is applied on the upper surface of the light shielding layer 141 by using a spin coating method to form a coating film 48. Next, the substrate 150B having the above coating film 48 formed is placed on a hot plate and the coating film 48 is pre-baked.

Next, exposure is performed by the coating film 48 being irradiated with the diffusion light F using the light shielding layer 141 as a mask from the substrate 150B side. At this time, an exposure apparatus using a mixed ray of an i ray of a wavelength of 365 nm, an h ray of a wavelength of 404 nm, and a g ray of a wavelength of 436 nm is used. The exposure amount is 600 mJ/cm$^2$. In the exposure process, parallel light or diffusion light is used. Further, in the present embodiment, light scattering bodies 152B are dispersed in the inside of the substrate 150B, so the light emitted from the exposure apparatus becomes diffusion light after being transmitted through the substrate 150B and reaches the coating film 48. Therefore, by setting the substrate 150B to a predetermined haze value, as means for irradiating the substrate 150B with the diffusion light F, it is not necessary to dispose a diffusing plate on the light path of the light emitted from the exposure apparatus. By performing the exposure using the diffusion light F, the coating film 48 is exposed radially so as to spread outwardly from the non-formation regions of the light shielding layers 141. Thus, the hollow portions 143 of a forward tapered shape are formed and the side surfaces of an inverse tapered shape are formed in portions facing the hollow portions 143 of the light diffusion section 140.

Thereafter, the substrate 150B having the above coating film 48 formed is placed on a hot plate, and the post-exposure bake (PEB) of the coating film 48 is performed.

Figure 25E:
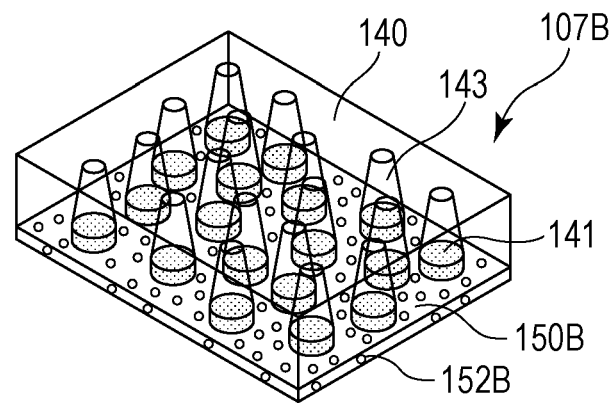
FIG. 25E is a perspective view showing the manufacturing process of the viewing angle widening film of the liquid crystal display device of the eighth embodiment of the present invention.

Next, the coating film 48 made of a transparent negative resist is developed using a designated developing solution and post-baked, and thus as shown in FIG. 25E, the light diffusion sections 140 having a plurality of hollow portions 143 are formed on the one surface of the substrate 150B.

Through the above process, the viewing angle widening film 107B of the present embodiment is completed.

Finally, as shown in FIG. 24B, in a state where the substrate 150B faces the viewing side and a light diffusion section 140 is opposed to the second polarizing plate 5, the viewing angle widening film 107B that has been completed is affixed to the liquid crystal display body 6 using an optical adhesive, or the like.

Through the above process, the liquid crystal display device 101B of the present embodiment is completed.

According to the liquid crystal display device 101B of the present embodiment, since the substrate 150B itself functions as the diffusion film, it is not necessary to provide newly the adhesive layer and the diffusion film. Accordingly, it is possible to simplify the device to be simplified and for the device to have thin thickness. Further, in the manufacturing process of the viewing angle widening film 107B, since the substrate 150B functions also as a diffusing plate, it is not necessary to dispose a diffusing plate on the light path of the light emitted from the exposure apparatus in forming the light diffusion section 140. Therefore, it is possible to simplify the manufacturing process.

Ninth Embodiment

Hereinafter, a ninth embodiment of the present invention will be described using FIGS. 26A and 26B.

The basic configuration of a liquid crystal display device of the present embodiment is the same as that of the seventh embodiment, but the configuration of a viewing angle widening film is different from that of the seventh embodiment. Therefore, in the present embodiment, the description of the basic configuration of the liquid crystal display device is omitted, and only the viewing angle widening film will be described.

Figure 26A:
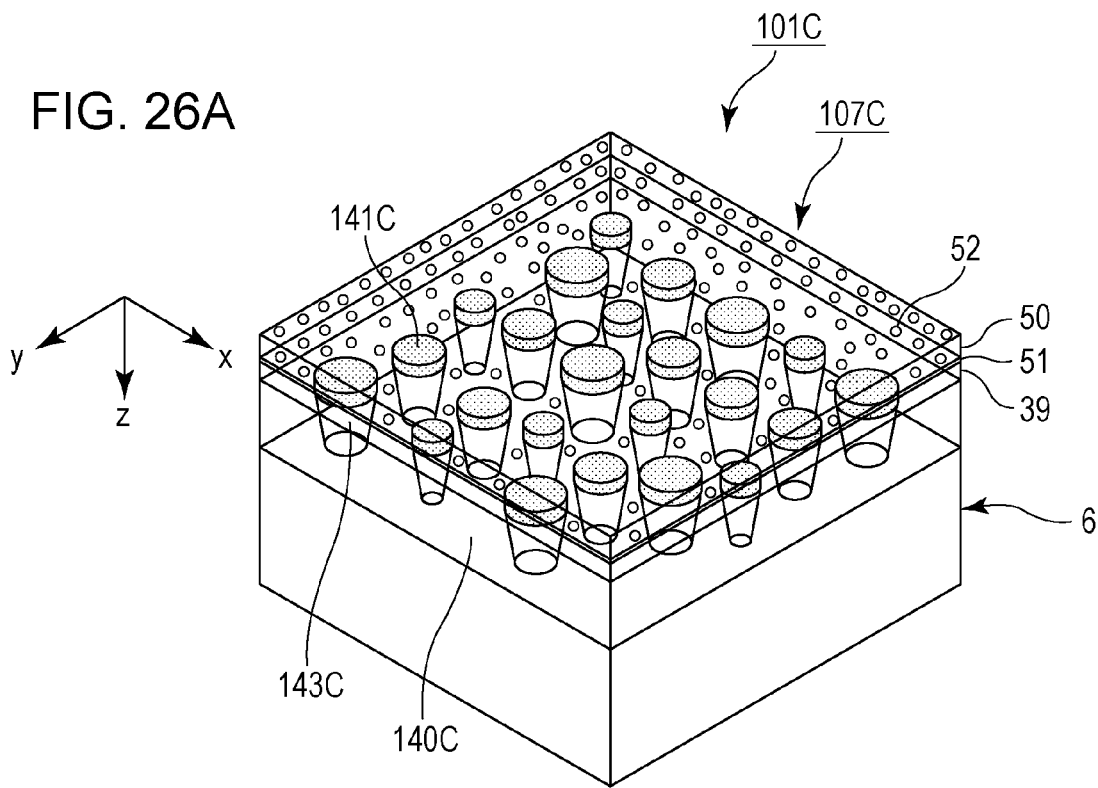
FIG. 26A is a perspective view showing a liquid crystal display device of a ninth embodiment of the present invention.
Figure 26B:
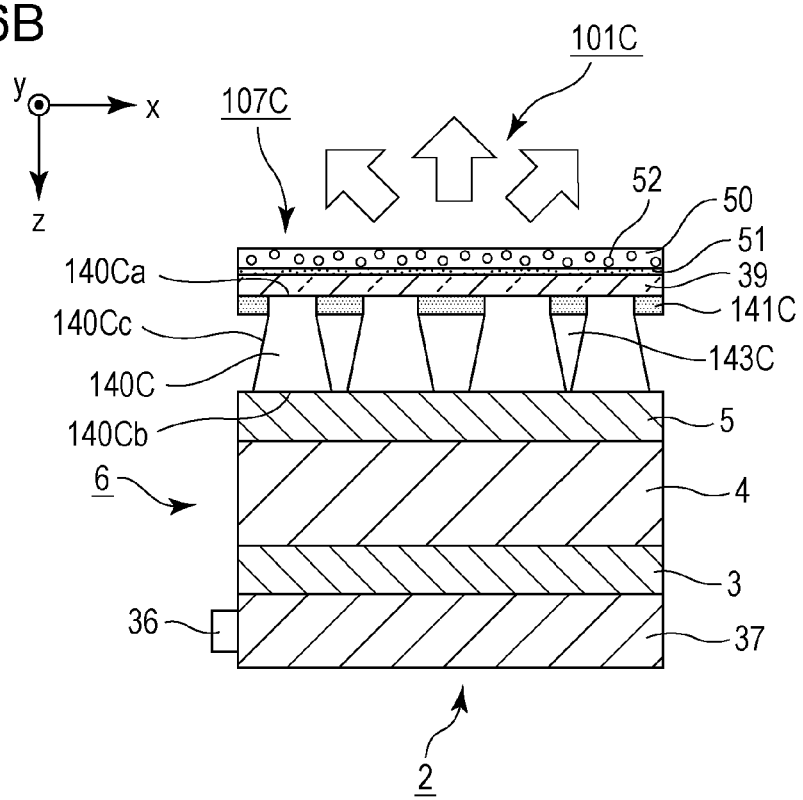
FIG. 26B is a cross-sectional view showing the liquid crystal display device of the ninth embodiment of the present invention.

FIGS. 26A and 26B are schematic diagrams showing a liquid crystal display device of the present embodiment. FIG. 26A is a perspective view of a liquid crystal display device 101C of the present embodiment. FIG. 26B is a cross-sectional view of the liquid crystal display device 101C of the present embodiment.

Further, in FIG. 26, the same reference numerals are given to the common components with those in the drawings used in the seventh embodiment, and thus detailed description thereof will be omitted.

In the seventh embodiment, the plurality of light shielding layers 141 all have the same dimension. In contrast, in the viewing angle widening film 107C of the present embodiment, as shown in FIG. 26A, the dimensions (diameters) of the plurality of light shielding layers 141Cs are different. For example, the dimensions of the plurality of light shielding layers 141C are distributed in a range of 10 µm to 25 µm. In other words, the plurality of light shielding layers 141C have a plurality of types of dimensions. Further, the plurality of light shielding layers 141C are disposed randomly in a plane, similar to the seventh embodiment. Further, among the plurality of hollow portions 143C, the volume of at least one of the hollow portions 143C is different from the volumes of other hollow portions 143C. Other configurations are the same as those of the seventh embodiment.

In the case of the present embodiment, since the sizes of the light shielding layers 141C are different in addition to the random arrangement of the plurality of light shielding layers 141C, it is possible to more reliably suppress moire fringes caused by the diffraction phenomena of light. Further, since the volume of at least one of the hollow portions 143C is different from the volumes of other hollow portions 143C, it is possible to raise light diffusion property.

Tenth Embodiment

Hereinafter, a tenth embodiment of the present invention will be described using FIG. 27.

The basic configuration of a liquid crystal display device of the present embodiment is the same as that of the first embodiment, but the tenth embodiment is different from the first embodiment in that a touch panel is included. Therefore, in the present embodiment, the description of the basic configuration of the liquid crystal display device is omitted, and only the touch panel will be described.

Figure 27:
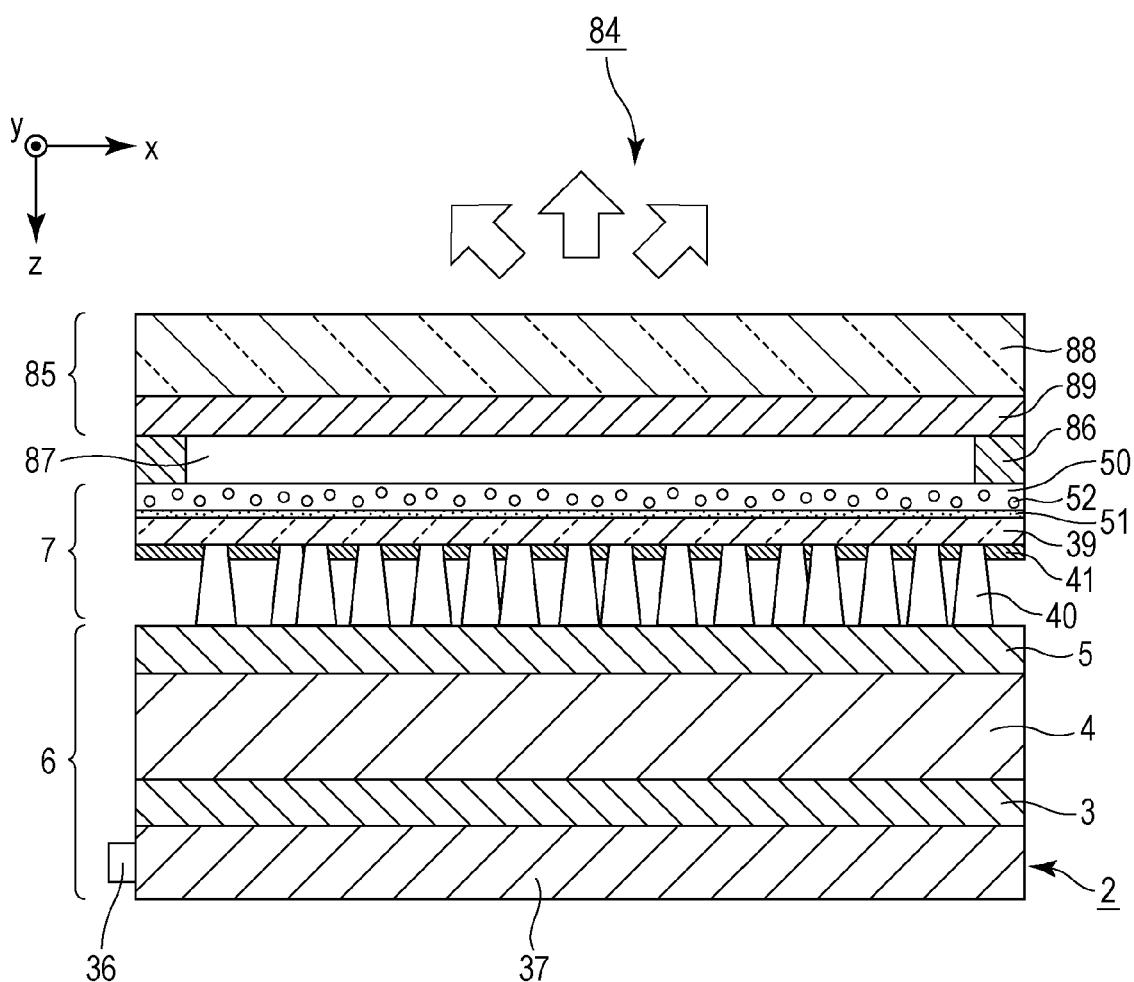
FIG. 27 is a cross-sectional view showing a liquid crystal display device of a tenth embodiment of the present invention.

FIG. 27 is a cross-sectional view showing a liquid crystal display device 84 of the present embodiment.

Further, in FIG. 27, the same reference numerals are given to the common components with those in the drawings used in the first embodiment, and thus detailed description thereof will be omitted.

In the liquid crystal display device 84 of the present embodiment, as shown in FIG. 27, the configurations from the backlight 2 to the light diffusion sheet 7 are the same as those of the first embodiment. Then, a touch panel 85 (information input device) is disposed on the viewing side of the substrate 39 constituting the light diffusion sheet 7. In the following description, the substrate 39 constituting the light diffusion sheet 7 is referred to as "light diffusion sheet substrate".

Touch panel 85 is affixed to the light diffusion sheet substrate 39 by the adhesive material 86 such as a double-sided tape in the periphery portion of the light diffusion sheet substrate 39. A gap corresponding to the thickness of the adhesive material 86 is formed between the touch panel 85 and the light diffusion sheet substrate 39. In other words, an air layer 87 is present between the touch panel 85 and the light diffusion sheet substrate 39.

The touch panel 85 includes a substrate 88 and a position detection electrode 89. In the following description, the substrate 88 constituting the touch panel 85 is referred to as "touch panel substrate". The position detection electrode 89 made of a transparent conductive material such as ITO, or Antimony-doped Tin Oxide tin oxide (ATO) is formed on one surface of the touch panel substrate 88 made of glass or the like. The position detection electrode 89 is formed by sputtering ITO, ATO, or the like, and has a uniform sheet resistance of about several hundreds to 2 kΩ/□.

In the present embodiment, the touch panel 85 of a capacitance type is used. In the touch panel 85 of the capacitance type, for example, a small voltage is applied to the four corners of the position detection electrode 89 when viewed from the top of the touch panel 85. If any position over the position detection electrode 89 is touched with a finger, the position touched by the finger is grounded through the capacitance of the human body. Thus, the voltage at each corner is changed according to the resistance value between each of the four corners and the ground point. A position detection circuit measures the voltage change as the current change and detects the ground point, that is, the position touched by the finger from the measured value.

The touch panel applicable to the present embodiment is not limited to the electrostatic capacitance type touch panel, and any touch panel such as a resistance film type, an ultrasonic type, an optical type is applicable.

According to the liquid crystal display device 84 of the present embodiment, since the liquid crystal display device 84 includes the same light diffusion sheet 7 as that of the first embodiment, it is possible to realize a liquid crystal display device which is excellent in a viewing angle characteristic and has an information input function. For example, it is possible to enter information interactively into an information processing apparatus or the like by the user touching the touch panel 85 with a finger or a pen while viewing an image of a wide viewing angle.

Figure 28:
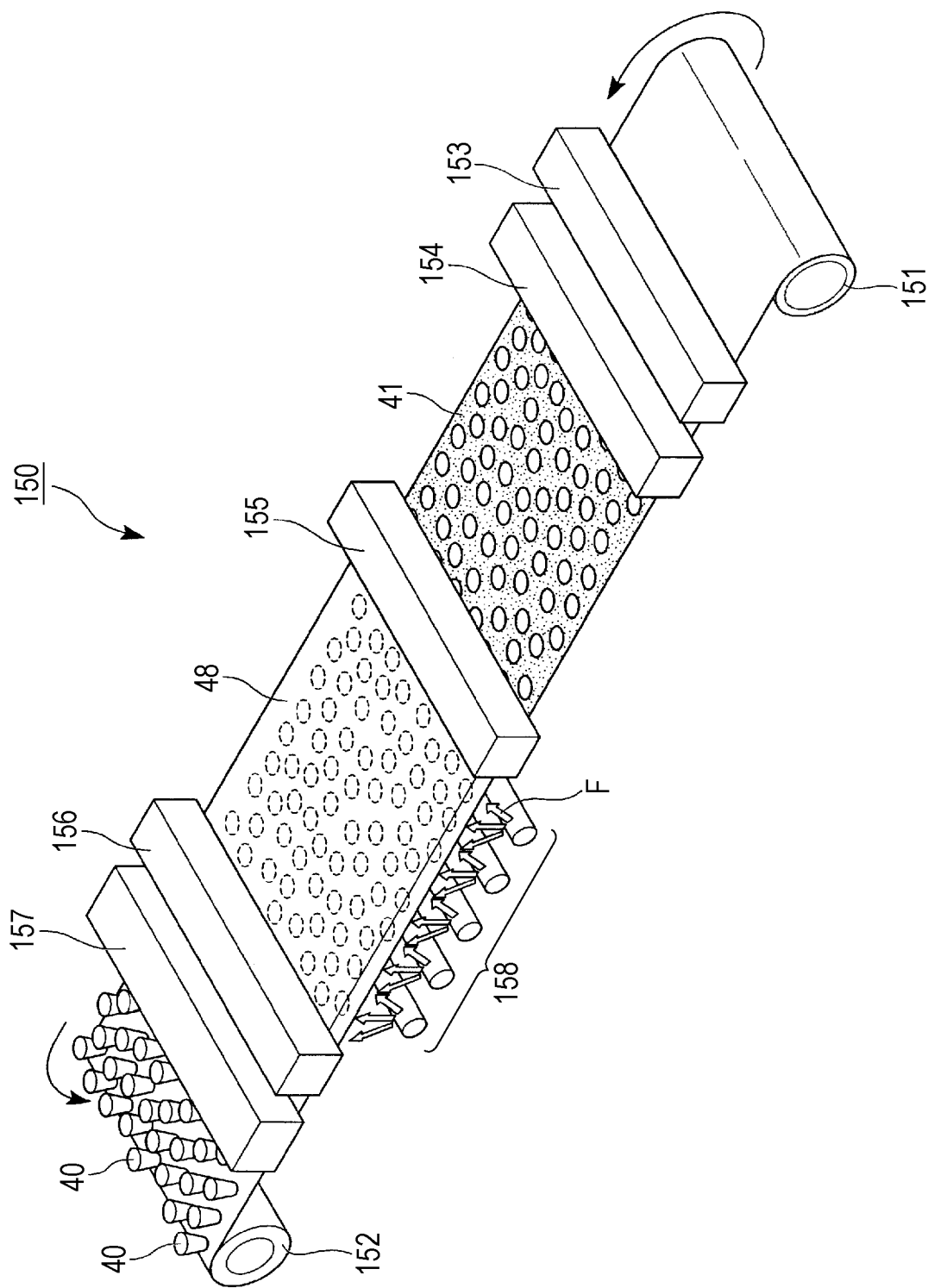
FIG. 28 is a perspective view showing an example of a manufacturing apparatus of a viewing angle widening film.

FIG. 28 is a schematic configuration diagram showing an example of a manufacturing apparatus of the viewing angle widening film.

The manufacturing apparatus 150 shown in FIG. 28 conveys a long substrate 39 by a roll-to-roll and performs various processes thereon. Further, the manufacturing apparatus 150 uses a printing method or an inkjet method instead of the photolithography method using the photo mask 45 described above, in forming the light shielding layer 41.

A delivery roller 151 which feeds the substrate 39 is provided at the one end of the manufacturing apparatus 150, and a winding roller 152 which winds the substrate 39 is provided at the other end. The manufacturing apparatus 150 is configured such that the substrate 39 moves toward the winding roller 152 side from the delivery roller 151 side. Above the substrate 39, a printing device 153, a first drying device 154, a coating device 155, a developing device 156, and a second drying device 157 are disposed sequentially toward the winding roller 152 side from the delivery roller 151 side. Below the substrate 39, the exposure apparatus 158 is disposed. The printing device 153 is intended for printing the light shielding layer 41 on the substrate 39. The first drying device 154 is intended for drying the light shielding layer 41 which is formed by printing. The coating device 155 is intended for applying a transparent negative resist on the light shielding layer 41. The developing device 156 is intended for developing with a developing solution, the transparent negative resist subjected to the exposure. The second drying device 157 is intended for drying the substrate 39 in which the light diffusion section 40 made of the transparent resist subjected to the development is formed. Furthermore, the viewing angle widening film may be integrated with the polarizing plate by bonding the second polarizing plate 5 with the substrate 39 in which the light diffusion section 40 is formed.

Figure 29A:
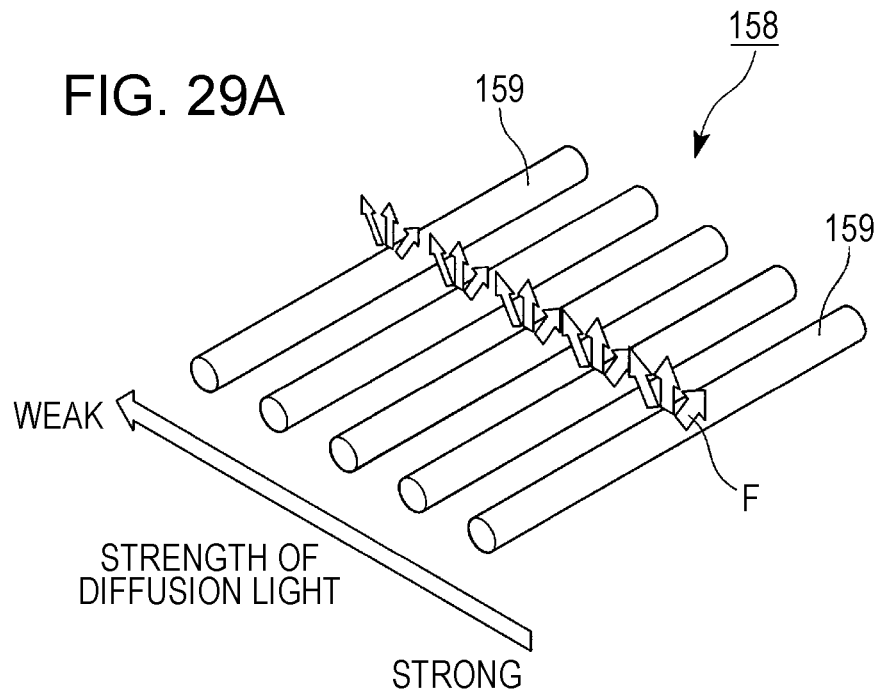
FIG. 29A is a perspective view showing a main part of the manufacturing apparatus of the viewing angle widening film.
Figure 29B:
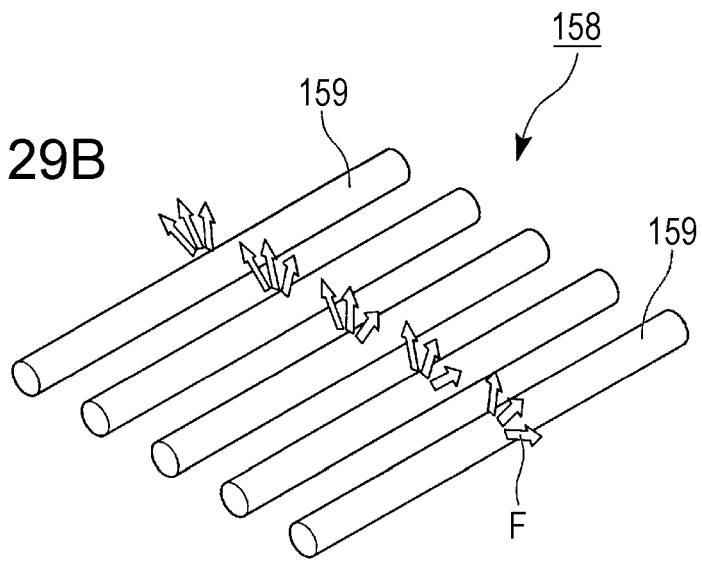
FIG. 29B is a perspective view showing the main part of the manufacturing apparatus of the viewing angle widening film.

The exposure apparatus 158 is intended for exposing the coating films 149 and 150 of the transparent negative resist from the substrate 39 side. FIGS. 29A and 29B are diagrams showing only a portion of the exposure apparatus 158 of the manufacturing apparatus 150. As shown in FIG. 29A, the exposure apparatus 158 includes a plurality of light sources 159, and may be configured such that the strength of the diffusion light F varies like a case where the strength of the diffusion light F from each light source 159 is gradually weakened, as the substrate 39 moves. Alternatively, as shown in FIG. 29B, the exposure apparatus 158 may be configured such that as the substrate 39 moves, the emission angle of the diffusion light F from each light source 159 varies. By using such an exposure apparatus 158, it is possible to control the inclination angle of the side surface of the light diffusion section 40 to a desired angle.

Further, although a liquid resist is applied in forming the light shielding layer 41 and the light diffusion section 40 in the above example, instead of this configuration, a film-like resist may be affixed to one surface of the substrate 39.

Finally, as shown in FIG. 2, in a state where the substrate 39 faces the viewing side and the light diffusion section 40 is opposed to the second polarizing plate 5, the viewing angle widening film that has been completed is affixed to the liquid crystal display body 6 using an optical adhesive, or the like.

Through the above process, the liquid crystal display device of the present embodiment is completed.

Further, the technical scope of the embodiments of the present invention is not limited to the above embodiments, and various modifications are possible without departing from the scope of the present invention. For example, in the above embodiments, an example of a liquid crystal display device is used as the display element, but not limited thereto, and the present invention may be applied to an organic electroluminescent display device, a plasma display, or the like.

Further, in the above embodiment, an example is shown in which the viewing angle widening film is adhered to the second polarizing plate of the liquid crystal display body, but the viewing angle widening film and the liquid crystal display body may not be in contact necessarily.

For example, other optical films, other optical components, or the like may be inserted between the viewing angle widening film and the liquid crystal display body. Alternatively, the viewing angle widening film and the liquid crystal display body may be in a position in which they are apart from each other. Further, in a case of an organic electroluminescent display device, a plasma display, or the like, a polarizing plate is not needed, so the viewing angle widening film and the polarizing plate are not in contact with each other.

Further, it may be configured such that at least one of an anti-reflection layer, a polarizing filter layer, an antistatic layer, an anti-glare processing layer, and an antifouling processing layer is provided in the viewing side of the substrate of the viewing angle widening film in the above embodiments. According to the configuration, a function of reducing the reflection of external light, a function of preventing the adhesion of dirt and dust, a function of preventing scratches, or the like can be added depending on the type of the layer provided on the viewing side of the substrate. It is possible to prevent the aging of the viewing angle characteristics.

Further, although the light diffusion sections have a shape of being symmetrical with respect to the central axis in the above embodiments, the shape may not be necessarily symmetrical. For example, when an asymmetry angular distribution is required intentionally according to the usage and application of the display device, and for example, when there is a request such as the expansion of the viewing angle of only the upper side or only the right side of the screen, the inclination angle of the side surface of the light diffusion section may be asymmetrical.

Further, there may be a plurality of layers including the light scattering bodies.

Others, specific configurations regarding the arrangements and the shapes of the light diffusion section and the light shielding layer, the dimension and material of each portion of the viewing angle widening film, manufacturing conditions in the manufacturing process, or the like are not limited to the above embodiments, and can be appropriately changed.

INDUSTRIAL APPLICABILITY

The aspect of the present invention may be used in various display devices such as liquid crystal display devices, organic electroluminescent display devices, and plasma displays.

REFERENCE SIGNS LIST

1, 1B, 1C, 1D, 1E, 1F, 101, 101A, 101B, 101C, 84 . . . liquid crystal display device (display device),

2 . . . backlight (light source),

4 . . . liquid crystal panel (light modulation element),

5 . . . second polarizing plate,

6 . . . liquid crystal display body (display body),

7, 7A, 7B, 7C, 7D, 7E, 7F, 7X, 107, 107A, 107B, 107C . . . viewing angle widening film (light diffusion member, viewing angle widening member),

39, 39X, 50B, 88, 150B . . . substrate,

40, 40C, 40D, 40E, 40F, 40G, 40H, 40I, 40J, 40K, 40L, 40M, 40N, 40P, 40X, 140, 140A, 140C . . . light diffusion section,

40*a*, 40C*a*, 40D*a*, 40E*a*, 40F*a*, 40X*a*, 140*a*, 140C*a* . . . light emitting end surface, 40b, 40Cb, 40Db, 40Eb, 40Fb, 40Xb, 140b, 140Cb . . . light incident end surface,
40c, 40Cc, 40Ec, 40Dc, 140c, 140Cc . . . side surface,
41, 41C, 41D, 41E, 41F, 41X, 141, 141A, 141C, 141G, 141H, 141I, 141J, 141K, 141L, 141M, 141N, 141P . . . light shielding layer,
41Da . . . opening portion,
44 . . . coating film,
48 . . . coating film (negative type photosensitive resin layer),
52, 52B, 152B . . . the light scattering bodies,
69, 145 . . . photo mask,
70 . . . shielding pattern,
85 . . . touch panel (information input device),
86 . . . adhesive material,
87 . . . air layer,
89 . . . position detection electrode,
143, 143A, 143C . . . hollow portion,
146 . . . opening pattern
150 . . . manufacturing apparatus
151 . . . delivery roller
152 . . . winding roller
153 . . . printing device,
154 . . . first drying device,
155 . . . coating device,
156 . . . developing device,
157 . . . second drying device,
158 . . . exposure apparatus,
159 . . . plurality of light sources

The invention claimed is:

1. A light diffusion member comprising:
a light transmissive substrate;
a plurality of light shielding layers which are scatteringly provided on one surface of the light transmissive substrate;
a light diffusion section which is provided in a region other than formation regions of the plurality of light shielding layers, the light diffusion section being provided on the one surface of the light transmissive substrate; and
light scattering bodies disposed on a light emitting side of the light diffusion section; wherein
the light diffusion section includes a light emitting end surface on a substrate side of the light diffusion section and a light incident end surface including a first area greater than a second area of the light emitting end surface on a side opposite to the substrate side,
a height from the light incident end surface to the light emitting end surface of the light diffusion section is greater than a thickness of the plurality of light shielding layers,
the plurality of light shielding layers are disposed non-periodically as viewed from a normal direction of the one surface of the light transmissive substrate,
a plurality of opening portions are provided at the light incident end surface and opposite to the plurality of light shielding layers, each of the plurality of opening portions having a same shape to each of the plurality of light shielding layers, and
the light scattering bodies are provided in a separate layer provided on a second surface of the light transmissive substrate.

2. The light diffusion member according to claim 1, wherein the plurality of light shielding layers are scatteringly disposed as viewed from the normal direction of the one surface of the substrate, and
wherein the light diffusion section is continuously provided in a region other than the formation regions of the light shielding layers.

3. The light diffusion member according to claim 2, wherein the plurality of light shielding layers have the same shape to each other, as viewed from the normal direction of the one surface of the substrate.

4. The light diffusion member according to claim 2, wherein the plurality of light shielding layers have at least one of sizes and shapes of a plurality of different types, as viewed from the normal direction of the one surface of the substrate.

5. The light diffusion member according to claim 1, wherein hollow portions partitioned by a formation region of the light diffusion section are provided in the formation regions of the light shielding layers, and
wherein air is present in the hollow portions.

6. The light diffusion member according to claim 1, wherein planar shapes of the light shielding layers as viewed from the normal direction of the one surface of the substrate are circular, elliptical, or polygonal.

7. A display device comprising:
a display body; and
a viewing angle widening member which is provided on a viewing side of the display body, makes an angular distribution of light incident from the display body wider than before being incident, and emits the light,
wherein the viewing angle widening member is composed of the light diffusion member according to claim 1.

8. The display device according to claim 7,
wherein the display body has a plurality of pixels forming a display image, and
wherein among the plurality of light shielding layers, a maximum pitch between adjacent light shielding layers is smaller than a pitch between the pixels of the display body.

9. The display device according to claim 7,
further comprising an information input device provided on the viewing side of the viewing angle widening member.

10. The display device according to claim 7,
wherein the display body has a light source and a light modulation element which modulates light from the light source, and
wherein the light source emits light having directivity.

11. The display device according to claim 7,
wherein the display body is a liquid crystal display element.

12. The display device according to claim 7, further comprising:
a polarizing plate; and
a liquid crystal panel; wherein
the viewing angle widening member is mounted on the polarizing plate and the polarizing plate is sandwiched between the viewing angle widening member and the liquid crystal panel.

13. The display device according to claim 12, further comprising:
a backlight which is positioned on an opposite side of the liquid crystal panel from a side of the liquid crystal panel which contacts the polarizing plate.

14. The light diffusion member according to claim 1, wherein
a third area of the plurality of opening portions is smaller than a fourth area of the plurality of light shielding layers, and the plurality of opening portions are provided discontinuously from each other.

15. The light diffusion member according to claim 1, wherein each of the plurality of opening portions is respectively opposite to a part of each of the plurality of light shielding layers.

\* \* \* \* \*